United States Patent
Fujii et al.

(10) Patent No.: US 7,655,499 B2
(45) Date of Patent: Feb. 2, 2010

(54) FORMING METHOD OF CONTACT HOLE AND MANUFACTURING METHOD OF SEMICONDUCTOR DEVICE, LIQUID CRYSTAL DISPLAY DEVICE AND EL DISPLAY DEVICE

(75) Inventors: Gen Fujii, Atsugi (JP); Hiroko Shiroguchi, Atsugi (JP)

(73) Assignee: Semiconductor Energy Laboratory Co., Ltd., Atsugi-shi, Kanagawa-Ken (JP)

(*) Notice: Subject to any disclaimer, the term of this patent is extended or adjusted under 35 U.S.C. 154(b) by 0 days.

(21) Appl. No.: 12/368,318

(22) Filed: Feb. 10, 2009

(65) Prior Publication Data

US 2009/0148971 A1 Jun. 11, 2009

Related U.S. Application Data

(62) Division of application No. 11/043,451, filed on Jan. 27, 2005, now Pat. No. 7,510,905.

(30) Foreign Application Priority Data

Jan. 29, 2004 (JP) ............................. 2004-022039

(51) Int. Cl.
*H01L 21/44* (2006.01)
(52) U.S. Cl. ..................... 438/99; 438/637; 438/672
(58) Field of Classification Search ................. 438/99, 438/149, 621–623, 637, 640, 672, 674, 675
See application file for complete search history.

(56) References Cited

U.S. PATENT DOCUMENTS

| 5,247,375 A | 9/1993 | Mochizuki et al. |
| 5,483,082 A | 1/1996 | Takizawa et al. |
| 5,580,796 A | 12/1996 | Takizawa et al. |

(Continued)

FOREIGN PATENT DOCUMENTS

EP 1340838 9/2003

(Continued)

OTHER PUBLICATIONS

Tsutsui.T et al., "Electroluminescence in Organic Thin Films,", Photochemical Processes in Organized Molecular Systems, 1991, pp. 437-450.

(Continued)

*Primary Examiner*—Kevin M Picardat
(74) *Attorney, Agent, or Firm*—Nixon Peabody, LLP; Jeffrey L. Costellia

(57) ABSTRACT

When forming a contact hole by a conventional manufacturing step of a semiconductor device, a resist is required to be formed on almost entire surface of a substrate so as to be applied on a film other than an area in which a contact hole is to be formed, leading to drastically reduced throughput. According to a forming method of a contact hole and a manufacturing method of a semiconductor device, an EL display device and a liquid crystal display device of the invention, an island shape organic film is selectively formed over a semiconductor layer, a conductive layer or an insulating layer, and an insulating film is formed around the island shape organic film to form a contact hole. Therefore, a conventional patterning using a resist is not required, and high throughput and low cost can be achieved.

18 Claims, 26 Drawing Sheets

U.S. PATENT DOCUMENTS

| | | |
|---|---|---|
| 5,610,414 A | 3/1997 | Yoneda et al. |
| 5,908,721 A | 6/1999 | Emoto et al. |
| 6,429,400 B1 | 8/2002 | Sawada et al. |
| 6,660,545 B2 | 12/2003 | Furusawa |
| 6,715,871 B2 | 4/2004 | Hashimoto et al. |
| 7,138,304 B2 | 11/2006 | Hirai |
| 7,399,704 B2 * | 7/2008 | Fujii et al. ............ 438/674 |
| 7,510,905 B2 * | 3/2009 | Fujii et al. ............ 438/99 |
| 2002/0014470 A1 | 2/2002 | Okada et al. |
| 2002/0046681 A1 | 4/2002 | Hirose |
| 2002/0046682 A1 | 4/2002 | Fan et al. |
| 2002/0128515 A1 | 9/2002 | Ishida et al. |
| 2002/0151171 A1 | 10/2002 | Furusawa |
| 2002/0182890 A1 | 12/2002 | Ishida et al. |
| 2003/0030689 A1 | 2/2003 | Hashimoto et al. |
| 2003/0054653 A1 | 3/2003 | Yamazaki et al. |
| 2003/0059975 A1 | 3/2003 | Sirringhaus et al. |
| 2003/0059984 A1 | 3/2003 | Sirringhaus et al. |
| 2003/0059987 A1 | 3/2003 | Sirringhaus et al. |
| 2003/0060038 A1 | 3/2003 | Sirringhaus et al. |
| 2003/0148401 A1 | 8/2003 | Agrawal et al. |
| 2004/0050685 A1 | 3/2004 | Yara et al. |
| 2004/0075396 A1 | 4/2004 | Okumura et al. |
| 2005/0001967 A1 | 1/2005 | Chae et al. |
| 2005/0005799 A1 | 1/2005 | Hirai |
| 2005/0007398 A1 | 1/2005 | Hirai |
| 2005/0025880 A1 | 2/2005 | Masuda |
| 2005/0043186 A1 | 2/2005 | Maekawa et al. |
| 2005/0051770 A1 | 3/2005 | Ando et al. |
| 2005/0074963 A1 | 4/2005 | Fujii et al. |
| 2005/0158665 A1 | 7/2005 | Maekawa et al. |
| 2005/0170565 A1 | 8/2005 | Fujii et al. |
| 2007/0026580 A1 | 2/2007 | Fujii |
| 2007/0126955 A1 | 6/2007 | Hosoya |

FOREIGN PATENT DOCUMENTS

| | | |
|---|---|---|
| JP | 06-202153 | 7/1994 |
| JP | 07-024579 | 1/1995 |
| JP | 09-320363 | 12/1997 |
| JP | 11-326951 | 11/1999 |
| JP | 11-340129 | 12/1999 |
| JP | 2000-035511 | 2/2000 |
| JP | 2000-039213 | 2/2000 |
| JP | 2000-068233 | 3/2000 |
| JP | 2000-089213 | 3/2000 |
| JP | 2001-068827 | 3/2001 |
| JP | 2001-093871 | 4/2001 |
| JP | 2001-179167 | 7/2001 |
| JP | 2002-066391 | 3/2002 |
| JP | 2002-151478 | 5/2002 |
| JP | 2002-151524 | 5/2002 |
| JP | 2002-237463 | 8/2002 |
| JP | 2002-237480 | 8/2002 |
| JP | 2002-289864 | 10/2002 |
| JP | 2002-324966 | 11/2002 |
| JP | 2002-359246 | 12/2002 |
| JP | 2002-359347 | 12/2002 |
| JP | 2003-017413 | 1/2003 |
| JP | 2003-080694 | 3/2003 |
| JP | 2003-197531 | 7/2003 |
| JP | 2003-311197 | 11/2003 |
| JP | 2003-347284 | 12/2003 |
| WO | WO 01/11426 | 2/2001 |
| WO | WO 01/47044 | 6/2001 |
| WO | WO 02/40742 | 5/2002 |
| WO | WO-2004/070809 | 8/2004 |
| WO | WO-2004/070810 | 8/2004 |
| WO | WO-2004/070811 | 8/2004 |
| WO | WO 2004/070819 | 8/2004 |
| WO | WO-2004/070820 | 8/2004 |
| WO | WO-2004/070821 | 8/2004 |
| WO | WO-2004/070822 | 8/2004 |
| WO | WO 2004/070823 | 8/2004 |
| WO | WO 2005/022262 | 3/2005 |

OTHER PUBLICATIONS

Baldo.M et al., "Highly Efficient Phosphorescent Emission From Organic Electroluminescent Devices,", Nature, Sep. 10, 1998, vol. 395, pp. 151-154.

Baldo.M et al., "Very High-Efficiency Green Organic Light-Emitting Devices Based on Electrophosphorescence,", Appl. Phys. Lett. (Applied Physics Letters), Jul. 5, 1999, vol. 75, No. 1, pp. 4-6.

Tsutsui.T et al., "High Quantum Efficiency in Organic Light-Emitting Devices With Iridium-Complex as a Triplet Emissive Center,", Jpn. J. Appl. Phys.(Japanese Journal of Applied Physics), Dec. 15, 1999, vol. 38/Part.2, No. 12B, pp. L1502-L1504.

* cited by examiner

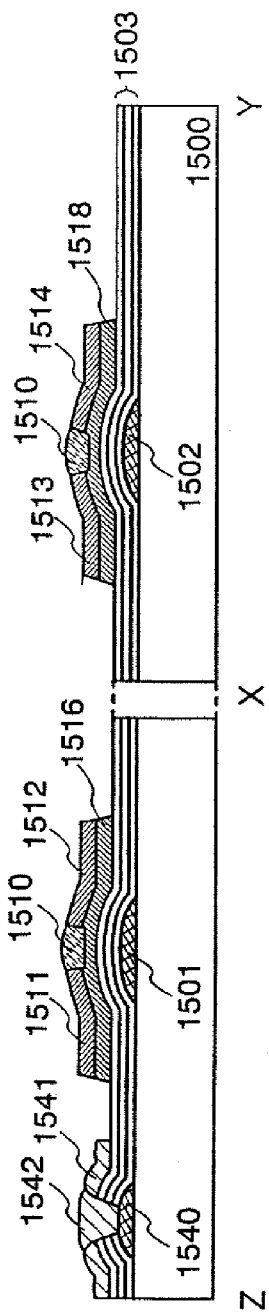
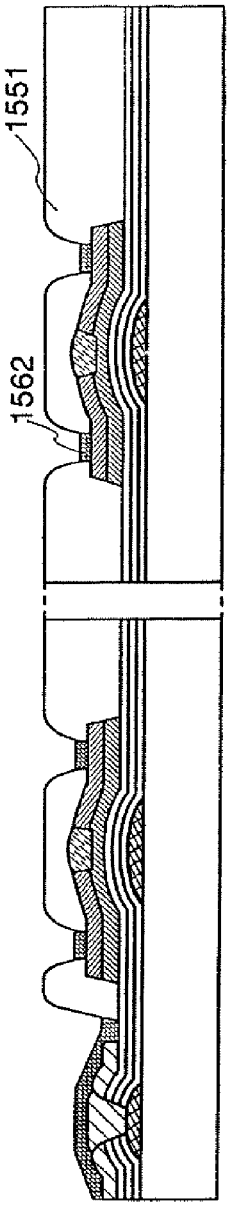
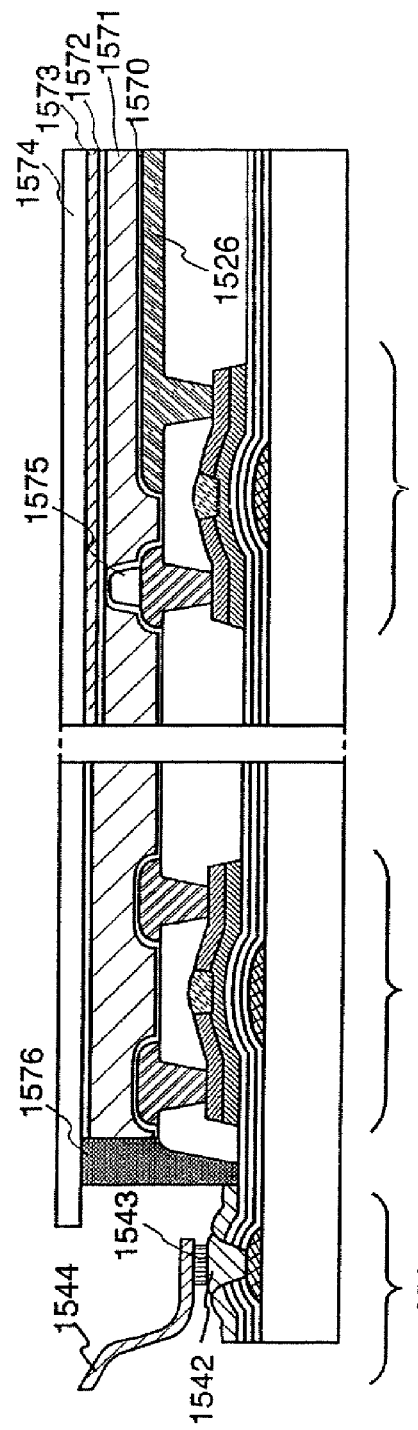
FIG. 15A
FIG. 15B
FIG. 15C

FORMING METHOD OF CONTACT HOLE AND MANUFACTURING METHOD OF SEMICONDUCTOR DEVICE, LIQUID CRYSTAL DISPLAY DEVICE AND EL DISPLAY DEVICE

BACKGROUND OF THE INVENTION

1. Field of the Invention

The present invention relates to a manufacturing method of a semiconductor device, a liquid crystal display device and an EL display device using a droplet discharge method typified by ink jet printing. In particular, the invention relates to a forming method of a contact hole provided in the semiconductor device.

2. Description of the Related Art

In the manufacture of semiconductor devices, liquid crystal display devices or EL display devices, it has been suggested that a droplet discharge apparatus is used to form thin films and wiring patterns in order to reduce the equipment cost and simplify the steps.

In such a case, a contact hole of a semiconductor device is formed by the steps of prebaking a resist applied on an entire surface of a substrate, forming a resist pattern by photolithography in which UV rays and the like are irradiated through a mask and developed, and etching and removing an insulating film, a semiconductor film, a metal film and the like that are to be a contact hole using the resist pattern as a mask.

Patterning can be performed relatively easily by an exposure apparatus in the case of a glass substrate or a display panel being small. When the size of a substrate increases, however, an entire surface of a display panel cannot be processed at a time by one exposure step. Accordingly, an area on which a photo resist is applied is divided into a plurality of blocks and an exposure step is sequentially performed for each predetermined block, thereby an entire surface of a substrate is exposed (for example, see Patent Document 1).

[Patent Document 1] Japanese Patent Laid-Open No. 11-326951

However, in the case of forming a contact hole by a conventional manufacturing stop of a semiconductor device, a resist is required to be formed on almost entire surface of a substrate so as to be applied on a film other than an area in which a contact hole is formed, leading to drastically reduced throughput. Even when throughput is improved, in the case where the amount of the resist being applied and the surface quality of a base film are not sufficiently controlled, the contact hole is also covered with the resist and contact defects may occur.

SUMMARY OF THE INVENTION

In view of the foregoing problems, the invention provides a forming method of an excellent contact hole as well as an interlayer film, a planarizing film and an insulating film such as a gate insulating film that are provided in the periphery thereof by a simplified step. Further, the invention provides a manufacturing method of a semiconductor device, which is low in cost and high in throughput and yield.

(1) According to the invention, a forming method of a contact hole comprises the steps of forming an organic film over a semiconductor layer, a conductive layer or an insulating layer, forming a mask pattern in an area over the organic film, in which a contact hole is to be formed, removing the mask pattern after patterning the organic film to island shape using the mask pattern as a mask, and then removing the island shape organic film after forming an insulating film around the island shape organic film.

The organic film is a film that contains an organic material as a main component and has liquid repellency (water repellency) to an insulating film formed later. Therefore, when the organic film is formed selectively, for example to island shape, on an area in which a contact hole is to be formed, an insulating film is formed only in the periphery of the island shape organic film by applying the insulating film since the island shape organic film repels an insulating material of the insulating film. As a result, a contact hole is formed in a self aligned manner in an area in which the insulating film is not formed (over an area in which the island shape organic film is formed) (see FIGS. 1A to 1F).

The insulating film, for example, an interlayer insulating film or a planarizing film of a TFT (thin film transistor), is formed of an organic material such as a polyimide-based resin, an acryl-based resin, a polyamide-based resin, and a siloxane-based resin (a material having a backbone structure obtained by binding silicon to oxygen and having at least one hydrogen substituent, or further having at least one substituent selected from fluorine, an alkyl group, or aromatic hydrocarbon in addition to hydrogen). A material having liquid repellency to such an organic material is used for an organic film, which is typified by a silane coupling agent. The silane coupling agent is a silicon compound represented by $R_n$—Si—$X_{4-n}$ (n=1, 2, 3). Here, R is a substance that contains a relatively inert group such as an alkyl group or a reactive group such as a vinyl group, an amino group and an epoxy group. Further, X is formed with halogen, a methoxy group, an ethoxy group, a hydroxyl group of the substrate surface such as an acetoxy group, or a hydrolysate group that is bondable with absorbed water by condensation. A fluorinated silane coupling agent is typified by fluoroalkyl silane LAS).

The organic film may be formed by plasma treatment under an atmosphere containing fluorine such as $CF_4$ and $CHF_3$. According to this, an organic film containing fluorine can be obtained. The thickness of the organic film can be controlled by treatment conditions and time. The organic film formed by plasma treatment can be removed by plasma treatment (ashing) under $O_2$ atmosphere.

Note that the combination of the organic film and the insulating film is not limited to the foregoing, and it can be arbitrarily determined as long as the organic film has liquid repellency to the insulating film. In addition, the insulating film is not limited to an interlayer insulating film and a planarizing film, and it includes any other insulating films such as a gate insulating film of a semiconductor device such as a TFT, and an insulating film (also called a bank) of an EL display device formed around a light emitting layer, an electron injection layer, an electron transporting layer, a hole injection layer, and a hole transporting layer each containing an organic or inorganic compound (hereinafter, collectively called a light emitting layer and the like).

In order to pattern an organic film, the organic film is applied on an entire surface by spin coating, slit coating, dip coating, spray coating, a droplet discharge method (ink jet printing, screen printing, offset printing or the like), doctor knife, toll coater, curtain coater, knife coater, or the like. Then, a mask pattern is formed in an area in which a contact hole is to be formed, and the organic film is removed using the mask pattern as a mask. Accordingly, an organic film can be formed selectively, for example to island shape. The organic film may be removed by various methods such as $O_2$ ashing and atmospheric pressure plasma depending on a material of the organic film. It is needless to say that the organic film may be removed by plasma etching, wet etching, ashing or the like.

Note that in this specification, the organic film includes both of an organic film formed by the aforementioned coating methods and an organic film formed by the plasma treatment.

The aforementioned etching includes wet etching using chemicals and dry etching or plasma etching using an active radical or reactive gas plasma. In this specification, the etching means any etching method including them. The chemicals used in wet etching are typified by hydrofluoric acid (HF), nitric acid, acetic acid, thermal phosphoric acid, a mixture of them, or a mixture obtained by diluting them with water or ammonium fluoride, though the invention is not limited to these. The gas used in dry etching is typified by chlorine-based gas such as $Cl_2$, $BCl_3$, $SiCl_4$, and $CCl_4$, fluorine-based gas such as $CF_4$, $SF_6$, $NF_3$, and $CHF_3$, $O_2$, a mixed gas of them, or a gas obtained by mixing them with a noble gas such as He and Ar, though the invention is not limited to these.

The mask pattern may be formed of a water soluble resin such as PVA (polyvinyl alcohol), a photosensitive or non-photosensitive organic material such as polyimide, acryl, polyamide, resist, and benzocyclobutene, or an organic resin such as siloxane. It is preferable to selectively form these materials by a droplet discharge method in an area in which a contact hole is to be formed, though they may be patterned through conventional exposure and development steps. After the organic film is patterned using the mask pattern, these materials art removed.

In particular when EVA is used, the mask pattern can be easily removed by $H_2O$. When polyimide or acryl is used, the mask pattern can be easily removed by a stripper such as "Nagase resist strip N-300" product of Nagase ChemteX Co., Ltd., hereinafter referred to as an N300 stripper) that contains as main components 2-amino ethanol and glycol ether, and "Stripper 710" (product of Tokyo Ohka Kogyo Co., Ltd., hereinafter referred to as a 710 stripper) that contains as main components o-dichlorobenzene, phenol, and alkyl benzene sulfonate. Needless to say, the mask pattern may be removed by ashing or etching. These removing methods can also be adopted in the case where the mask pattern is patterned as is in conventional technologies.

Note that the mask pattern is not necessarily removed, and it may remain when a material of the mask pattern has liquid repellency to an insulating film formed later. In such a case, the mask pattern and the organic film may be removed simultaneously or sequentially after the formation of a contact hole.

Note also that the organic film pattern may be formed directly and selectively by a droplet discharge method or the like.

The contact hole is typified by, for example in a semiconductor device such as a TFT, a contact hole for connecting impurity regions such as a source region and a drain region to a source wiring and a drain wiring (also called a 2nd wiring) respectively. However, it is needless to say that the contact hole is not limited to this, and the invention can be applied to the formation of any other contact holes required in a semiconductor device such as a TFT (including a transistor used for an integrated circuit (IC) such as an LSI, a memory and a logic circuit as well as a semiconductor device such as a TFT used for an inn and an EL display device), and a liquid crystal display device, an EL display device and the like that are driven by TFT's. For example, since a light emitting layer or the like formed of an organic or inorganic compound is formed between the aforementioned banks in an EL display device (see FIG. 11E), an organic film is selectively formed in an area in which the light emitting layer or the like is to be formed, and then an insulating material used for the banks is applied on an entire surface, thereby the banks can be formed in predetermined areas.

(2) According to the invention, a manufacturing method of a semiconductor device comprises the steps of forming a gate electrode over a substrate, forming a semiconductor layer over the gate electrode with a gate insulating film interposed therebetween, forming an organic film over the semiconductor layer, forming a mask pattern in an area over the organic film, in which a contact hole is to be formed, removing the mask pattern after patterning the organic film to island shape using the mask pattern as a mask, forming a contact hole by removing the island shape organic film after forming an insulating film around the island shape organic film, and forming a conductor in the contact hole.

The semiconductor device here mainly means a field effect transistor (FET) (also called a unipolar transistor). The FET is classified by the structure of a gate electrode portion into an insulated gate FET (IGFET); a metal insulator semiconductor FET (MISFET) using a metal gate electrode; a metal oxide semiconductor FET (MOSFET) using a silicon oxide film as an insulating film; a thin film transistor a in which a semiconductor thin film such as amorphous silicon (a-Si) and polycrystalline silicon (p-Si) is formed over an insulator such as glass and ceramic and a MOSFET is formed within the semiconductor thin film, and the like. These transistors are each classified into an N channel transistor and a P-channel transistor. A circuit configured by the N-channel transistor and the P-channel transistor (e.g., an inverter circuit) is called a CMOS (Complementary MOS) circuit.

The semiconductor device includes a liquid crystal panel, an EL panel and the like each having the aforementioned transistors using a semiconductor material.

The structure of a transistor is classified into a coplanar structure in which source, drain and channel regions are formed of a single semiconductor layer; and a staggered structure in which source, drain and channel regions are formed of different semiconductor layers. The coplanar structure and the staggered structure are each classified into a top gate structure and a bottom gate structure. Therefore, when a semiconductor layer is formed over a gate electrode with a gate insulating film interposed therebetween in a top gate transistor, the semiconductor layer, the gate insulating film and the gate electrode are stacked in this order. Meanwhile, in a bottom gate transistor, the gate electrode, the gate insulating film and the semiconductor layer are stacked in this order.

The conductor is formed in the contact hole in order to be connected to the semiconductor layer. The semiconductor layer and the conductor may be connected directly or indirectly with another conductive film or semiconductor film interposed therebetween.

Other structures and interpretation of words and phrases are similar to those in the aforementioned description (1).

(3) According to the invention, a manufacturing method of an EL display device comprises the steps of forming a gate electrode over a substrate, forming a semiconductor layer over the gate electrode with a gate insulating film interposed therebetween, forming an organic film over the semiconductor layer, forming a mask pattern in an area over the organic film, in which a contact hole is to be formed, removing the mask pattern after patterning the organic film to island shape using the mask pattern as a mask, forming a contact hole by removing the island shape organic film after forming an insulating film around the island shape organic film, forming a conductor in the contact hole, and forming a layer containing organic or inorganic compounds over the conductor.

The EL display device is a display device having a light emitting element utilizing electro luminescence (EL), and is broadly classified into a passive matrix type and an active matrix type. In particular, an EL display device controlled by a semiconductor device such as a TFT is called an active matrix EL display device (EL display).

In the light emitting element, a light emitting layer which is a stack of layers of a film containing an organic or inorganic compound having different carrier transporting characteristics is sandwiched between a pair of electrodes, and the light emitting layer is formed so that holes can be injected from an electrode and electrons can be injected from the other electrode. The light emitting element uses a phenomenon in which holes injected from an electrode and electrons injected from the other electrode are recombined to excite luminescent centers and light is produced when the excited state returns to a ground state. The injection characteristics of the holes and the electrons into the light emitting layer depend on the work function or the like (minimum energy required to extract an electron from the surface of metal or semiconductor to a surface immediately outside thereof) of a material forming an electrode. It is preferable that the electrode to which holes are injected has high work function, and the electrode to which electrons are injected has low work function.

When an organic compound material is used at least for a light emitting layer, the EL display device is called an organic EL display. When an inorganic compound material is used at least for a light emitting layer, the EL display device is called an inorganic EL display. In the case of an organic compound material and an inorganic compound material both being used, the EL display device is called a hybrid EL display or the like.

The conductor is formed in the contact hole in order to electrically connect the semiconductor layer to the light emitting layer and the like. In an active matrix EL display device, a semiconductor device such as a TFT functions as a switch for determining whether a current is supplied to an EL element or not, and a path of current flowing to the EL element. Thus, a current in the semiconductor layer flows to the EL element through the conductor. Note that the conductor may also function as a pixel electrode that is directly connected to the EL element. Alternatively, a pixel electrode may be provided separately. Further, the semiconductor layer and the conductor may be connected directly or indirectly with another conductive film or semiconductor film interposed therebetween.

Other structures and interpretation of words and phrases are similar to those in the aforementioned descriptions (1) and (2).

(4) According to the invention, a manufacturing method of a liquid crystal display device comprises the steps of forming a gate electrode over a substrate, forming a semiconductor layer over the gate electrode with a gate insulating film interposed therebetween, forming an organic film over the semiconductor layer, forming a mask pattern in an area over the organic film, in which a contact hole is to be formed, removing the mask pattern after patterning the organic film to island shape using the mask pattern as a mask, forming a contact hole by removing the island shape organic film after forming an insulating film around the island shape organic film, forming a conductor in the contact hole, and forming a liquid crystal layer over the conductor.

The liquid crystal display device is a display device having liquid crystal molecules that have an intermediate state between liquid and solid and are arranged in a loosely ordered fashion in their natural states. The display device utilizes the properties of liquid crystal molecules of which the arrangement changes when a voltage is applied, and the display device is broadly classified into a passive matrix type and an active matrix type. In particular, a liquid crystal display device controlled by a semiconductor device such as a TFT is called an active matrix liquid crystal display device (AM-LCD). An LCD is also classified into two types: a transmissive type using a back light as a light source; and a reflective type using as a light source outside light such as sunlight and interior light.

A liquid crystal layer including liquid crystal molecules can be formed by dip coating, a droplet discharge method or the like. As a liquid crystal material, any type of liquid crystal molecule can be employed such as a positive nematic liquid crystal, a negative nematic liquid crystal, a twisted nematic (TN) liquid crystal, a super twisted nematic (STN) crystal, a ferroelectric liquid crystal, and an antiferroelectric liquid crystal.

The conductor is formed in the contact hole in order to electrically connect the semiconductor layer to a pixel electrode that applies a voltage to the liquid crystal layer. In an active matrix liquid crystal display device, a semiconductor device such as a TFT functions as a switch for selecting whether to apply a voltage to a liquid crystal layer or not. Note that the conductor may also function as a pixel electrode, or a pixel electrode may be provided separately. Further, the semiconductor layer and the conductor may be connected directly or indirectly with another conductive film or semiconductor film interposed therebetween.

Other structures and interpretation of words and phrases are similar to those in the aforementioned descriptions (1) and (2).

According to the invention, an organic film having liquid repellency to an insulating material used for an interlayer insulating film, a planarizing film, a gate insulating film and the like is selectively formed in an area over a semiconductor layer, a conductive layer or an insulating layer, in which a contact hole is to be formed. Then, insulating films are formed around the organic film, thereby these insulating films can be formed in a desired area and a contact hole can be formed between the insulating films in a self-aligned manner. In addition, the contact hole and the insulating films can be formed without exposure and development steps that require a resist masks. Thus, forming steps can be considerably simplified as compared with conventional steps.

Further, when a gate electrode, a mask pattern, a conductor and the like are formed by a droplet discharge method, a droplet containing a material of these films can be discharged in an arbitrary area by changing the relative position between a substrate and a nozzle for discharging a droplet. The thickness and the width of a pattern to be formed can be adjusted by the nozzle diameter, the discharge amount of droplet, and relative relationship between the movement speeds of the nozzle and the substrate to be applied with the droplet. Thus, the material of the films can be accurately discharged to form the films in a predetermined area. In addition, since a patterning step, that is exposure and development steps using a resist mask can be omitted, significant simplification of the forming steps and the cost reduction can be attempted. Further, by using the droplet discharge method, patterns can be formed in an arbitrary area and the thickness and the width of the patterns to be formed can be adjusted. Therefore, even a large semiconductor element substrate with a side of 1 to 2 m can be manufactured with high yield and at low cost.

As set forth above, a contact hole and an insulating film around the contact hole in a semiconductor device can be accurately formed by simple steps. Further, it is possible to provide a manufacturing method of a semiconductor device, which is low in cost and high in throughput and yield.

BRIEF DESCRIPTION OF THE DRAWINGS

FIGS. 15A to 15C are views showing manufacturing steps of a liquid crystal display device according to the invention.

FIGS. 18A and 181B are views showing a modularized EL display panel or LCD panel.

DETAILED DESCRIPTION OF THE INVENTION

Although the invention will be described by way of embodiment modes and embodiments with reference to the accompanying drawings, it is to be understood that various changes and modifications will be apparent to those skilled in the art. Therefore, unless such changes and modifications depart from the scope of the invention, they should be constructed as being included therein. For example, the invention can be implemented by arbitrarily combining each of the embodiment modes and the embodiments. Therefore, the invention is not limited to the descriptions in the embodiment modes and the embodiments.

Although the invention provides a manufacturing method of all kinds of semiconductor devices, liquid crystal display devices and EL display devices using a maskless process such as a droplet discharge method, not all the steps are required to be performed by a maskless process, but it is only required that at least a pail of the steps includes a maskless process. Accordingly, even when droplet discharge steps art only used in the manufacturing method described below, other conventional manufacturing steps such as a patterning step may be adopted instead.

EMBODIMENT MODE 1

In this embodiment mode, a forming method of a contact hole according to the invention is described with reference to FIGS. 1A to 1F.

Figure 1A:
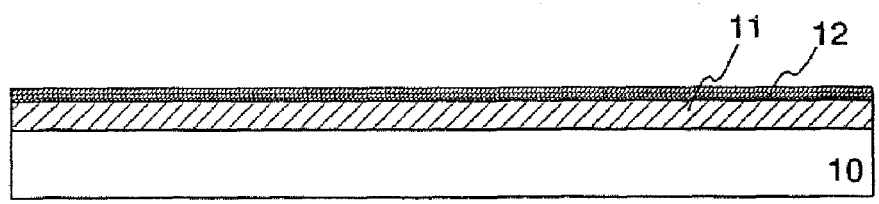
FIGS. 1A to 1F are views showing forming steps of a contact hole according to the invention.

First, a conductive or semiconductor film 11 is formed over a substrate 10, and then an organic film 12 is applied on an entire surface of the substrate 10 by spin coating, slit coating or the like (FIG. 1A). The organic film 12 is typically formed of a fluorine-based silane coupling agent such as fluoroalkyl silane, though the invention is not limited to this.

Figure 1B:
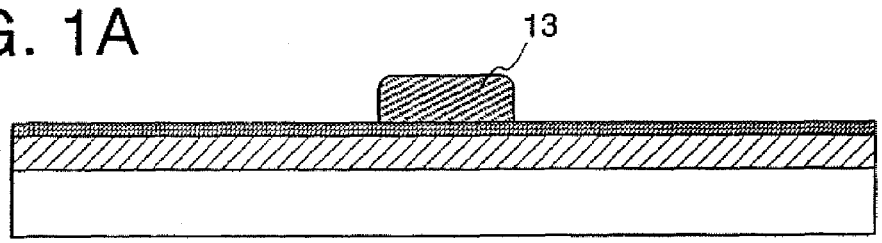

Next, a mask pattern 13 is selectively formed in an area in which a contact hole is to be formed (FIG. 1B). It is desirable to form the mask pattern 13 selectively by a droplet discharge method. The mask pattern 13 is formed of a water soluble resin such as PVA (polyvinyl alcohol) or an organic resin such as polyimide, acryl and siloxane, though the invention is not limited to this.

Figure 1C:
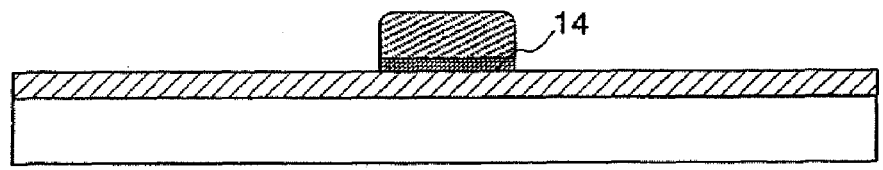

Then, the organic film 12 is removed using the mask pattern 13 as a mask, thereby an island shape organic film 14 is obtained (FIG. 1C). The organic film 12 is desirably removed by $O_2$ ashing or atmospheric pressure discharge plasma, though the invention is not limited to this. Instead, UV ozone treatment, laser treatment or the like can be adopted.

Figure 1D:
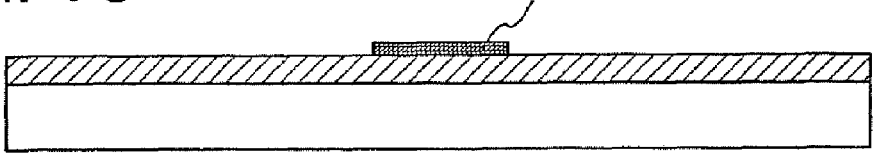
Figure 1E:
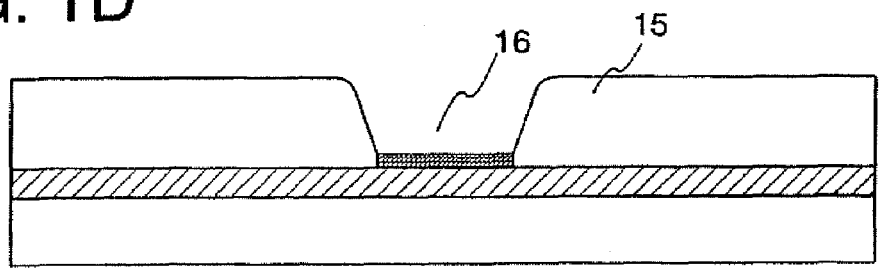
Figure 1F:
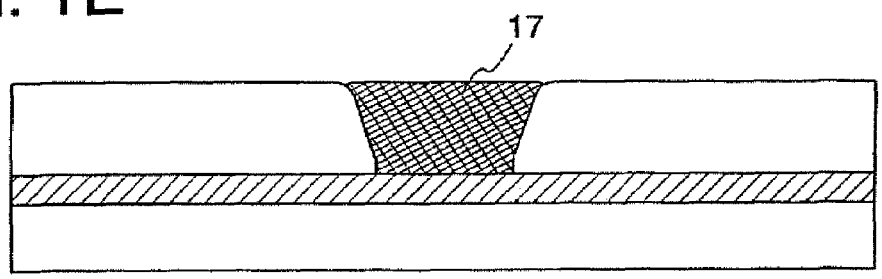

Subsequently, the mask pattern 13 is removed (FIG. 1D). In the case of PVA being used for the mask pattern 13, for example, the mask pattern 13 can be easily removed by $H_2O$ (water washing). When polyimide or acryl is used for the mask pattern 13, it can be easily removed by the N300 stripper or the 710 stripper. It is needless to say that the mask pattern 13 may be removed by ashing or etching.

Although the mask pattern 13 is removed in this embodiment mode, it may remain in the case of having liquid repellency to an insulating film formed later. Even when the mask pattern 13 does not have liquid repellency, it can be treated with $CF_4$ plasma to obtain liquid repellency after forming the mask pattern 13.

Then, an insulating film 15 is applied over an entire surface of the substrate 10. In this embodiment mode, the insulating film 15 is formed of siloxane that is a heat resistant resin, though the invention is not limited to this. The insulating film 15 is not formed over the island shape organic film 14 since the island shape organic film 14 repels the insulating film 15.

Thus, a contact hole 16 is formed in a self-aligned manner. At this time, the insulating film 15 is tapered, thereby the step coverage with a conductive film formed later can be improved. (FIG. 1E) The island shape organic film 14 is removed thereafter by $O_2$ ashing, atmospheric plasma or the like. Instead, UV ozone treatment, laser treatment or the like may be adopted.

Next, a composition containing a conductive material is discharged in the contact hole 16 by a droplet discharge method, thereby a conductor 17 is formed to be connected to the conductive or semiconductor film 11 on the bottom layer. (FIG. 1F) In the case where an insulating film is formed over the conductive or semiconductor film 11, it is removed by etching or the like to form the contact hole 16. This etching is desirably performed by using an etchant having high etch selectivity (ratio between the etching rate a of a material to be etched and the etching rate b of an etching mask material and a base film material: a/b) relative to the conductive or semiconductor film 11 on the bottom layer.

The aforementioned forming method of a contact hole can be applied to the formation of any other contact holes required in a semiconductor device such as a TFT (including a transistor used for an integrated circuit (IC) such as an LSI, a memory and a logic circuit as well as a semiconductor device such as a TFT used for an LCD and an EL display device), and a liquid crystal display device, an EL display device and the like that are driven by TFTs.

EMBODIMENT MODE 2

In this embodiment mode, a manufacturing method of a bottom gate TFT according to the invention, in particular a manufacturing method of a channel protected TFT is described with reference to FIGS. 2A to 2E and FIGS. 3F to 3I.

Figure 2A:
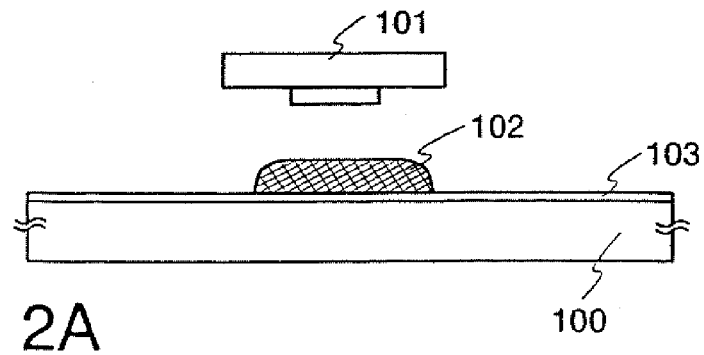
FIGS. 2A to 2E are views showing manufacturing steps of a semiconductor device according to the invention (a channel protected TFT).

First, base film pretreatment is applied to an area over a substrate, in which at least a gate electrode is to be formed. In this embodiment mode, a titanium oxide ($TiO_x$) film 103 is formed over an entire surface of a substrate 100 (FIG. 2A). This pretreatment allows to increase the adhesiveness between the substrate 100 and a conductive film (a gate electrode 102 herein) that is to be formed later by discharging a composition containing a conductive material. When a titanium oxide film is formed, light transmissivity can be increased. Instead of titanium oxide, polyimide, acryl or a heat resistant resin such as siloxane may be used as well. Alternatively, plasma treatment may be performed.

It is also possible to use a photocatalytic substance such as strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), and tungsten oxide ($WO_3$) as well as titanium oxide. Instead, a layer containing 3d transition elements or an oxide, nitride, or oxynitride thereof may be formed. The 3d transition elements include Ti (titanium), Sc (scandium), V (vanadium), Cr (chromium), Mn (manganese), Fe (iron), Co (cobalt), Ni (nickel), Cu (copper), and Zn (zinc). The aforementioned base film pretreatment is desirably performed in order to increase the adhesiveness between the substrate and the conductive film.

Figure 8A:
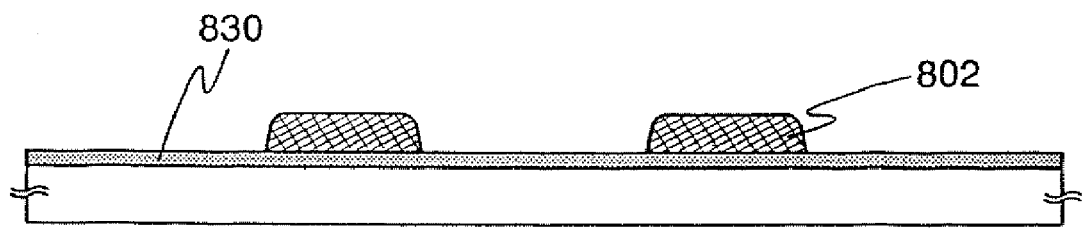
FIGS. 8A to 8C are views showing base film pretreatment steps.
Figure 8B:
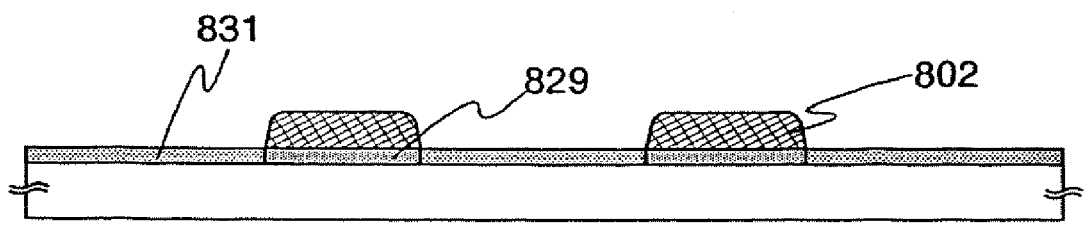
Figure 8C:
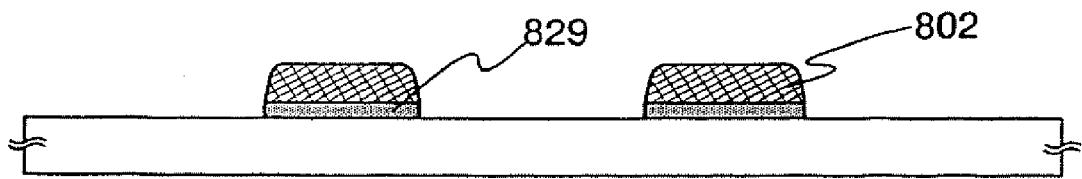

Base film pretreatment using a conductive film such as a titanium film can be performed by some methods as shown in FIGS. 8A to 8C. FIG. 8A shows a method similar to that shown in FIG. 2A, in which a conductive oxide film (a $TiO_x$ film 830 herein) is formed over an entire surface of the substrate or at least under a gate electrode 802. FIG. 8B shows a method in which the gate electrode 802 is formed after a conductive film such as a titanium film (a X film 829 herein) is formed over an entire surface of the substrate, and the Ti film 829 is oxidized (baking, or $O_2$ ion injection and then baking) using the gate electrode 802 as a mask, thereby a $TiO_x$ film 831 is formed around the gate electrode 802. According to such a method, gate electrodes can be prevented from being short-circuited. FIG. 8C shows a method in which the gate electrode 802 is formed after the Ti film 829 is formed over an entire surface of the substrate, and the exposed Ti film 829 is etched using the gate electrode 802 as a mask. In that case, gate electrodes can be prevented from being short-circuited.

Next, a composition containing a conductive material (hereinafter referred to as conductive paste) is discharged from a nozzle 101 over the titanium oxide film 103, thereby the gate electrode 102 is formed (FIG. 2A). The gate electrode 102 is formed by drying the discharged composition at a temperature of 100° C. for three minutes, then baking it at a temperature of 200 to 350° C. for 15 to 30 minutes under a nitrogen or oxygen atmosphere, though the conditions arm not limited to these. Note that the form of the nozzle 101 is not limited to the one shown in FIG. 2A.

If the baking is performed in a mixed atmosphere of $O_2$ and $N_2$, an organic material such as a binder (a thermosetting resin) contained in the conductive paste (e.g., Ag paste) is decomposed, and a conductive film containing hardly any organic material can be obtained. In addition, a surface of the film can be planarized. The mixing ratio of $O_2$ relative to $N_2$ is preferably 10 to 30% (more preferably, about 25%). A solvent in the conductive paste is volatilized by discharging the conductive paste under low pressure. Consequently, heat treatment thereafter can be omitted, or the time for the heat treatment can be reduced.

Various materials can be selected as the conductive material depending on the function of the conductive film. Typically used for the conductive material is silver (Ag), copper (Cu), gold (Au), nickel (Ni), platinum (Pt), chromium (Cr), tin (Sn), palladium (Pd), iridium (Ir), rhodium (Rh), ruthenium (Ru), rhenium (Re), tungsten (W), aluminum (Al), tantalum (Ta), indium (In), tellurium (Te), molybdenum (Mo), cadmium (Cd), zinc (Zn), iron (Fe), titanium (Ti), silicon (Si), germanium (Ge), zirconium (Zr), barium (Ba), antimony lead, tin oxide antimony, fluoride doped zinc oxide, carbon, graphite, glassy carbon, lithium, beryllium, sodium, magnesium, potassium, calcium, scandium, manganese, gallium, niobium, sodium-potassium alloys, magnesium-copper mixtures, magnesium-silver mixtures, magnesium-aluminum mixtures, magnesium-indium mixtures, aluminum-aluminum oxide mixtures, lithium-aluminum mixtures, or the like, or silver halide particles, dispersed nanoparticles, indium tin oxide (ITO) used as a transparent conductive film, zinc oxide (ZnO), zinc oxide added with gallium (GZO), indium zinc oxide (IZO) in which 2 to 20% of zinc oxide is mixed into indium oxide, organic indium, organotin, titanium nitride, or the like. In addition, silicon (Si) or silicon oxide ($SiO_x$) may be contained in the paste or the target for sputtering especially as a material used for a transparent conductive film. For example, a conductive material in which silicon oxide is contained in ITO (generally referred to as ITO—$SiO_x$; however, hereinafter referred to as ITSO or NITO for convenience) may be used. Further, layers of these materials may be stacked to form a desired conductive film.

The diameter of a nozzle used as a droplet discharge means is set at 0.1 to 50 μm preferably, 0.6 to 26 μm), and the amount of the composition discharged from the nozzle is set at 0.00001 to 50 pl (preferably, 0.0001 to 10 pl). The discharge amount increases in proportion to the diameter of the nozzle. Further, the distance between an object and an orifice of the nozzle is preferably as short as possible, and reduced to about 0.1 to 2 mm in order to discharge the composition on a desired area.

The composition discharged from an orifice is preferably a solution in which gold, silver or copper is dissolved or dispersed in a solvent in view of the resistivity. More preferably, silver or copper that has low resistance may be used. Note that, in the case of copper being used, it is preferable to provide a barrier film for preventing impurities from entering. Used as the solvent may be esters such as butyl acetate and ethyl acetate, alcohols such as isopropyl alcohol and ethyl alcohol, or an organic solvent such as methyl ethyl ketone and acetone. In the case of copper being used for a wiring, a barrier film may be formed of an insulating or conductive material containing nitrogen such as silicon nitride, silicon oxynitride, aluminum nitride, titanium nitride, and tantalum nitride TaN), and such a material may be applied by a droplet discharge method.

The viscosity of a composition used in the droplet discharge method is preferably 300 mPa·s or less for preventing drying and allowing the composition to be discharged smoothly from the orifice. The viscosity of the composition, the surface tension, or the like may be set appropriately in accordance with the solvent or the application. For example, the viscosity of a composition in which ITO, ITSO, organic indium, or organotin is dissolved or dispersed in a solvent is 5 to 50 mPa·s; the viscosity of a composition in which silver is dissolved or dispersed in a solvent is 5 to 20 mPa·s; and the viscosity of a composition in which gold is dissolved or dispersed in a solvent is 10 to 20 mPa·s.

It is preferable that the diameter of the conductor particles is as small as possible in order to prevent each nozzle from clogging or to make fine patterns, and more preferably, each particle has a diameter of 0.1 μm or less, though it depends on the diameter of each nozzle or the desired pattern shape. Each composition may be formed by a known method such as an electrolytic method, an atomization method and wet reduction, and the particle size is generally about 0.5 to 10 μm. Note that, in the case of the composition being formed by gas evaporation, nanoparticles protected with a dispersant are as fine as about 7 nm, and the nanoparticles are dispersed stably at a room temperature and behave similarly to liquid without aggregation in a solvent when they are each protected with a coating. Therefore, it is preferable to use a coating.

Conductive paste using conductive nanoparticles is called nanopaste. For example, conductive particles of Ag or Au preferably have a diameter of 3 to 7 nm.

The metal content of the nanopaste is preferably in the range of 10 to 75 wt %. For example, silver nanopaste has a metal content of 40 to 60 wt %, and gold nanopaste has a metal content of 30 to 50 wt %. The solvent content is preferably in the range of 20 to 80%; and the additive content in the range of 10 to 20%. As the solvent, tetradecane is typically used for the silver nanopaste and AF solvent (low aromatic solvent containing naphthene/paraffin=about 8/2) is typically used for the gold nanopaste. The viscosity of the silver nanopaste and the gold nanopaste may preferably be 5 to 20 mPa·s and 10 to 20 mPa·s, respectively.

When impurities such as Cl, Fe, K, Na, and $SO_4$ mixed into the conductive paste are mixed into a semiconductor layer (particularly, a channel region) of a TFT, defects occur to decrease TFT characteristics. Therefore, such impurities are desirably reduced to 10 ppm or less.

The nanopaste can be cured when being heated at a temperature of 220 to 250° C. It is desirable that the cured silver nanopaste have a resistance of 1 to 5 μΩ·cm and a film thickness of 5 μm or less; and the cured gold nanopaste have a resistance of 1 to 10 μΩ·cm and a film thickness of 1 μm or less. Further, both of the cured silver nanopaste and the cured gold nanopaste desirably have a metal content of 95 to 98 wt %.

Used also as conductive particles is hybrid paste combining the nanopaste and general conductive paste that is produced by an electrolytic method, an atomization method, wet reduction or the like.

Figures 23A, 23B:
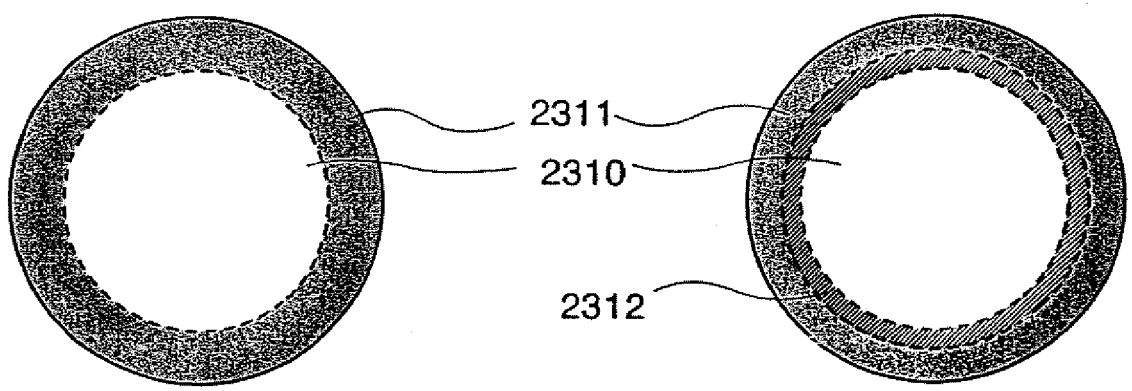
FIGS. 23A and 23B are views showing a structure of conductive particles.

A gate electrode layer may be formed by discharging a composition containing particles in which one conductive material is covered with another conductive material. In that case, a buffer layer is desirably provided between each conductive material. For example, in the particle structure shown in FIG. 23A in which Cu 2310 is covered with Ag 2311, a buffer layer 2312 formed of Ni or NiB (nickel boron) may be provided between the Cu 2310 and the Ag 2311 (FIG. 23B).

When a gas mixed with oxygen having a partial pressure of 10 to 30% is used in the baking step of the composition containing a conductive material, the resistivity of a conductive film of the gate electrode layer can be reduced and the conductive film can be reduced in thickness and planarized. Note that a solvent in the composition is volatilized by discharging the composition containing a conductive material under low pressure, thereby the time for the heat treatment thereafter (drying or baking) can be reduced.

In addition to the aforementioned drying and baking, treatment such as press treatment for applying pressure while heating by a heater, roller treatment, and CMP (Chemical Mechanical Polish) may be performed for further smoothing and planarizing the surface.

Note that the gate electrode 102 may be formed by applying a conductive film over an entire surface of the substrate in advance, and then etching the conductive film using a mask pattern. At this time, the mask pattern is desirably formed by a droplet discharge method, though conventional exposure and development may also be adopted. The mask pattern is formed by selectively discharging on the conductive film an organic composition containing acryl, benzocyclobutene, polyamide, polyimide, benzimidazole, or polyvinyl alcohol by a droplet discharge method. By using the droplet discharge method, the composition can be discharged selectively to form a pattern only in a desired area.

Further, a composition containing a photosensitive agent may be used as a material of the mask pattern. For example, a composition in which a novolac resin that is a positive resist and a naphthoquinonediazide compound that is a photosensitive agent, a base resin that is a negative resist, diphenylsilanediol, and an acid generator; or the like are dissolved or dispersed in a known solvent may be used. Instead, a material having a backbone structure obtained by binding silicon (Si) to oxygen (O) and having at least a hydrogen substituent, or further having one or more substituents selected from fluorine, an alkyl group, and aromatic hydrocarbon in addition to hydrogen (typically, siloxane-based polymer) may be used. It is desirable that the mask pattern is baked and cured before etching the conductive film.

In the case where the gate electrode 102 is formed by etching, the step coverage is preferably improved by tapering the gate electrode 102 in order to avoid electrical connection with a semiconductor film 111 formed later. The mask pattern is removed after the etching.

Used as the substrate 100 is a glass substrate, a quartz substrate, a substrate made of an insulating substance such as alumina, a heat resistant plastic substrate which can endure the processing temperature of the subsequent steps, or the like. In that case, it is desirable to form an insulating base film of silicon oxide ($SiO_x$), silicon nitride ($SiN_x$), silicon oxynitride ($SiO_xN_y$) (x>y), silicon nitride oxide ($SiN_xO_y$) (x>y) (x, y=1, 2 . . . ), or the like in order to prevent diffusion of impurities or the like from the substrate. Further, as the substrate 100, a substrate made of metal such as stainless or a semiconductor substrate may be used by applying the surface thereof with an insulating film of silicon oxide or silicon nitride.

Figure 2B:
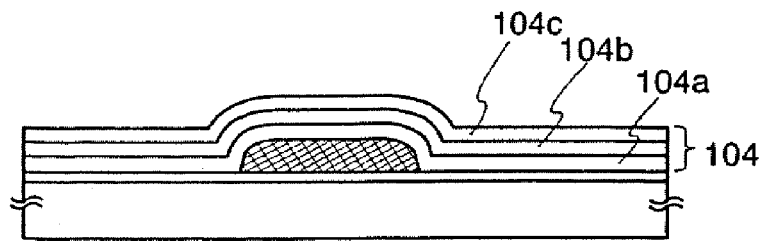

Subsequently, a gate insulating film 104 is formed over the gate electrode 102. The gate insulating film 104 is preferably formed of a single layer or multi layers of a film containing silicon nitride, silicon oxide, silicon nitride oxide, or silicon oxynitride by a thin film forming method such as plasma CVD and sputtering. In this embodiment mode, a silicon nitride film (SiN film) 104a, a silicon oxide film ($SiO_x$ film) 104b and a silicon nitride film ($SiN_x$ film) 104c are stacked over the substrate 100 in this order, though the invention is not limited to these structure, material and method (FIG. 2B).

Figure 2C:
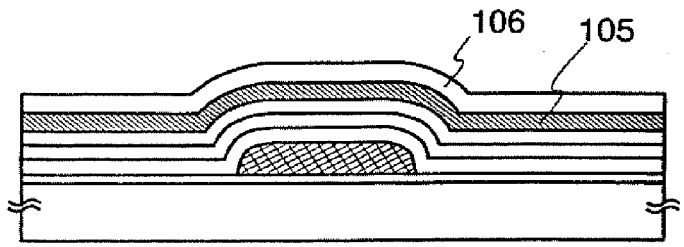

Then, a semiconductor film 105 is formed over the gate insulating film 104 (FIG. 2C). The semiconductor film 105 is formed of an amorphous semiconductor, a crystalline semiconductor or a semi-amorphous semiconductor, each of which mainly contains silicon, silicon germanium ($Si_xGe_{1-x}$), or the like. The semiconductor film 105 may be formed by plasma CVD or the like. It is desirable that the semiconductor film 105 have a thickness of 10 to 100 nm.

An SAS (semi-amorphous silicon, also called microcrystalline silicon) that is a kind 6 of the aforementioned semi-amorphous semiconductor is briefly described. The SAS can be obtained by glow discharge decomposition of silicon gas. Typically, $SiH_4$ is used as a silicon gas, though $Si_2H_6$, $SiH_2Cl_2$, $SiHCl_3$, $SiCl_4$, $SiF_4$ or the like may be used as well. The formation of the SAS can be facilitated by diluting the silicon gas with a single or a plurality of noble gas elements selected from hydrogen, hydrogen and helium, argon, krypton, and neon. The silicon gas is preferably diluted at a dilution rate of 10 to 1000. It is needless to say that the formation of the SAS by glow discharge decomposition is desirably performed under low pressure, but discharge may be performed under a pressure of about 0.1 to 133 Pa. The power frequency for generating the glow discharge is in the range of 1 to 120 MHz, and more preferably, an RF power of 13 to 60 MHz is supplied. The substrate is preferably heated at a temperature of 300° C. or less, and more preferably 100 to 200° C.

The silicon gas may also be mixed with a carbon gas such as $CH_4$ and $C_2H_6$, or a germanium gas such as $GeH_4$ and $GeF_4$ to set the energy bandwidth at 1.5 to 2.4 eV, or 0.9 to 1.1 eV.

When an impurity element for controlling valence electrons is not added to an SAS intentionally, the SAS exhibits a small N-type conductivity. This is because oxygen is easily mixed into a semiconductor film since the glow discharge is performed at a higher power than in the case of forming an amorphous semiconductor. When an impurity element that imparts P-type conductivity is added to the semiconductor film including a channel forming region of a TFT simultaneously with or after the deposition, a threshold voltage can be controlled. Typically, boron is used for an impurity element that imparts P-type conductivity. An impurity gas such as $B_2H_6$ and $BF_3$ may be mixed into the silicon gas at a rate of 1 to 1000 ppm. For example, in the case of boron being used as an impurity element that imparts P-type conductivity, the concentration of boron is preferably set at $1\times10^{14}$ to $6\times10^{16}$ atoms/$cm^3$. Note that when a channel forming region is formed of such an SAS, a field effect mobility of 1 to 10 $cm^2$/V·sec can be obtained.

A crystalline semiconductor film can be obtained by the following steps: an amorphous semiconductor film is treated with a solution containing a catalyst such as nickel; a crystalline silicon semiconductor film is obtained by thermal crystallization at a temperature of 500 to 750° C.; and the crystallinity of the crystalline semiconductor film is improved by laser crystallization.

The crystalline semiconductor film can also be obtained by directly forming a polycrystalline semiconductor film by LPCVD (Low Pressure CVD) using disilane ($Si_2H_6$) and germanium fluoride ($GeF_4$) as material gas. In this embodiment mode, the flow rate of the gas is set so that $Si_2H_6$/$GeF_4$=20/0.9 is satisfied, the deposition temperature is set at 400 to 500° C., and He or Ar is used as a carrier gas, though the invention is not limited to these conditions.

Next, an insulating film 106 is formed over the semiconductor film 105 (FIG. 2C). The insulating film 106 may be formed of a single layer or multi layers of a film containing silicon nitride, silicon oxide, silicon nitride oxide, or silicon oxynitride. Alternatively, a resin such as polyimide, acryl and siloxane may be applied over an entire surface.

Figure 2D:
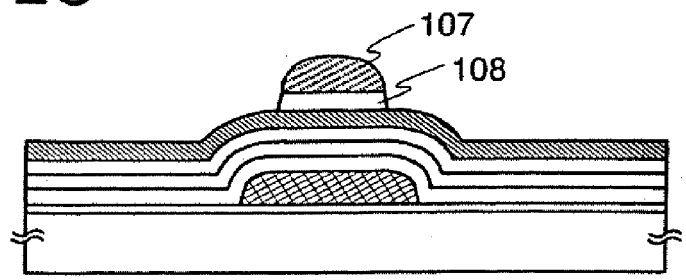

A first mask pattern 107 is selectively formed using a resist or the like. Then, the insulating film 106 is etched by wet etching or dry etching using the first mask pattern 107 as a mask, thereby a channel protective film 108 is formed (FIG. 2D). It is desirable that the first mask pattern 107 is selectively formed by a droplet discharge method, though it may be formed through conventional exposure and development steps. Note that the first mask pattern 107 may be formed of an insulating film such as acryl, benzocyclobutene, polyamide, polyimide, benzimidazole, and polyvinyl alcohol as well as a resist. The same applies to various mask patterns described below.

Figure 2E:
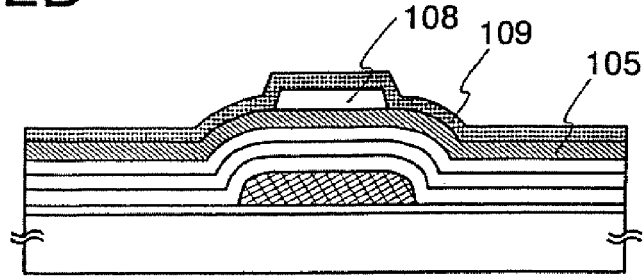

After removing the first mask pattern 107, an N-type semiconductor film 109 is formed (FIG. 2E). The N-type semiconductor film 109 may be formed of an amorphous semiconductor, a crystalline semiconductor or a semi-amorphous semiconductor, each of which mainly contains silicon, silicon germanium (SiGe) or the like. As an N-type impurity element, arsenic (As) or phosphorous (P) can be used. The N-type semiconductor film 109 may be formed by plasma CVD or the like. For example, in the case where the N-type semiconductor film 109 is formed of an SAS (semi-amorphous silicon), glow discharge decomposition of a mixed gas of $SiH_4$, $H_2$ and $PH_3$ phosphine) is performed by plasma CVD to obtain an N-type (n+) silicon film. Note that although the N-type semiconductor film is used herein, a P-type semiconductor film containing a P-type impurity element such as boron (B) may be used as well.

Although not shown, the N-type semiconductor film or the P-type semiconductor film may be formed by doping an impurity element using another mask pattern as a mask. As the impurity element, boron (B) that imparts P-type conductivity and arsenic (As) or phosphorous (P) that imparts N-type conductivity may be employed. The impurity element may be added by ion doping or ion injection. Note that the semiconductor film may be activated by heat treatment after the doping.

Figure 3A:
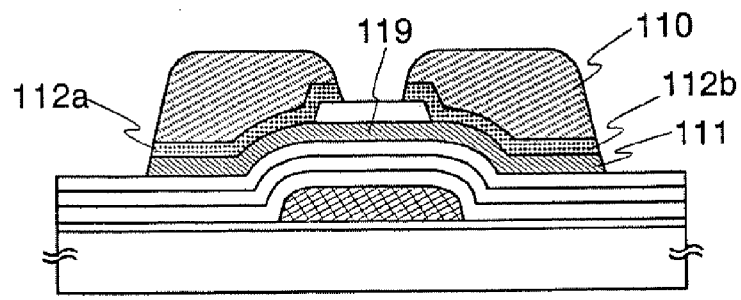
FIGS. 3A to 3D are views showing manufacturing steps of a semiconductor device according to the invention (a channel protected TFT).

Subsequently, a second mask pattern 110 is selectively formed using a resist or the like. Then, the semiconductor film 105 and the N-type semiconductor film 109 an etched by wet etching or dry etching using the second mask pattern 110 as a mask, thereby an island shape semiconductor film 111, a source region 112a and a drain region 112b are formed (FIG. 3A). It is preferable that the second mask pattern 110 is selectively formed by a droplet discharge method, though it may be formed through conventional exposure and development steps.

The island shape semiconductor film 111 and the source and drain regions 112a and 112b are simultaneously formed in this embodiment mode. However, after an island shape semiconductor film and an island shape N-type semiconductor film are formed using the second mask pattern 110, the island shape N-type semiconductor film may be removed by etching using another mask pattern to form the source and drain regions 112a and 112b.

When the N-type semiconductor film is removed by etching to form the source and drain regions 112a and 112b, the channel protective film 108 prevents a channel region 119 from being damaged due to over etching and the like.

Although not shown, a passivation film may further be provided over the source and drain regions 112a and 112b in order to prevent impurities from being mixed or diffused into the semiconductor film. The passivation film may be formed of silicon nitride, silicon oxide, silicon nitride oxide, silicon oxynitride, aluminum oxynitride, aluminum oxide, diamond like carbon (DLC), carbon nitride (CN), or other insulating materials. The material of the aforementioned mask pattern may be employed as well. Further, the passivation film may be formed of a stack of these materials.

Figure 3B:
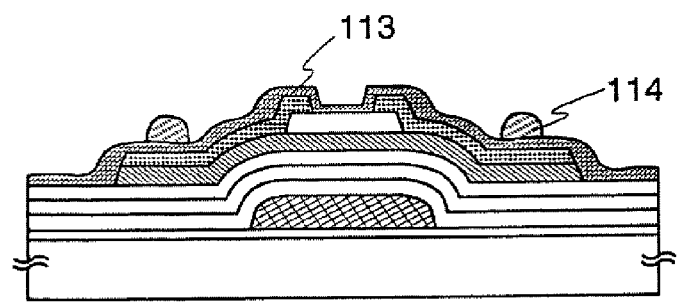

Next, an organic film 113 having liquid repellency to an interlayer insulating film formed later is applied over an entire surface (FIG. 3B). In this embodiment mode, fluoroalkyl silane (FAS) that is a kind of a silane coupling agent is formed by slit coating, though the invention is not limited to these material and forming method. Note that since the FAS is a monomolecular film, the thickness thereof is about a few nm.

Surface treatment using a silane coupling agent is now described. First, a silane coupling agent is selectively applied over an entire surface of the substrate or in an area in which at least the organic film is to be formed, by spin coating, slit coating or the like. Next, the silane coupling agent is left under room temperature to be dried, and water washing is performed to remove an unnecessary agent. Finally, the silane coupling agent is baked, so that siloxane network (a structure in which a material has a backbone structure obtained by binding silicon (Si) to oxygen (O), which contains at least a hydrogen substituent, or further has one or more substituents selected from fluorine, an alkyl group, and aromatic hydrocarbon in addition to hydrogen) including a $CF_2$ chain and a $CF_3$ chain is created. The drying and the water washing may be omitted. $CF_2$ and $CF_3$ allows the film whose surface is treated with the silane coupling agent to have liquid repellency.

The silane coupling agent is a silicon compound represented by $R_n$—Si—$X_{4-n}$ (n=1, 2, 3). Here, R denotes a substance that contains a relatively inert group such as an alkyl group or a reactive group such as a vinyl group, an amino group and an epoxy group. Further, X is formed with halogen, a methoxy group, an ethoxy group, or a hydroxyl group of the substrate surface such as an acetoxy group, or a hydrolysate group that is bondable with absorbed water by condensation. In particular, when R is an inert group such as an alkyl group, the film surface is provided with characteristics such as water repellency, resistance against adhesion and friction, lubricity, and luster. If n=1, the silicon compound is used as a coupling agent; if n=2, the silicon compound is used as a material of a siloxane polymer; and if n=3, the silicon compound is used as a silylating agent or a blocking agent of a polymer (an end cap agent for terminating each end of a polymer.) The FAS used in this embodiment mode has a structure denoted by $(Cr_3)(CF_2)_x(CH_2)_y$ (x is an integer of 0 to 10 and y is an integer of 0 to 4). In the case where a plurality of R or X are bonded to Si, R and X may be either the same or different.

The silane coupling agent is typified by a fluoroalkoxy silane coupling agent. For example, $CF_3(CF_2)_kCH_2CH_2Si(OCH_3)_3$, $CF_3(CF_2)_kCH_2CH_2SiCH_3(OCH_3)_2$, $CF_3(Cr_2)_kCH_2CH_2Si(OCH_2CH_3)_3$ (k=3, 5, 7, 9); $(CF_3)_2CF(CF_2)_mCH_2CH_2Si(OCH_3)_3$, $(CF_3)_2CF(CF_2)_mCH_2CH_2SiCH_3(OCH_3)_2$ (m=4, 6, 8); and $CF_3(CF_2)_j(C_6H_4)C_2H_4Si(OCH_3)_3$, $CF_3(CF_2)_j(C_6H_4)C_2H_4SiCH_3(OCH_3)_2$ (j=0, 3, 5, 7) are given as an example of the silane coupling agent. The silane coupling agent is also typified by alkoxysilane having an alkyl group for R. It is preferable to use alkoxysilane with a carbon number of 2 to 30. There are typically ethyltriethoxysilane, propyltriethoxysilane, octyltriethoxysilane, decyltriethoxysilane, octadecyltriethoxysilane (ODS), eicosyltriethoxysilane, and triacontyltriethoxysilane.

Figure 22:
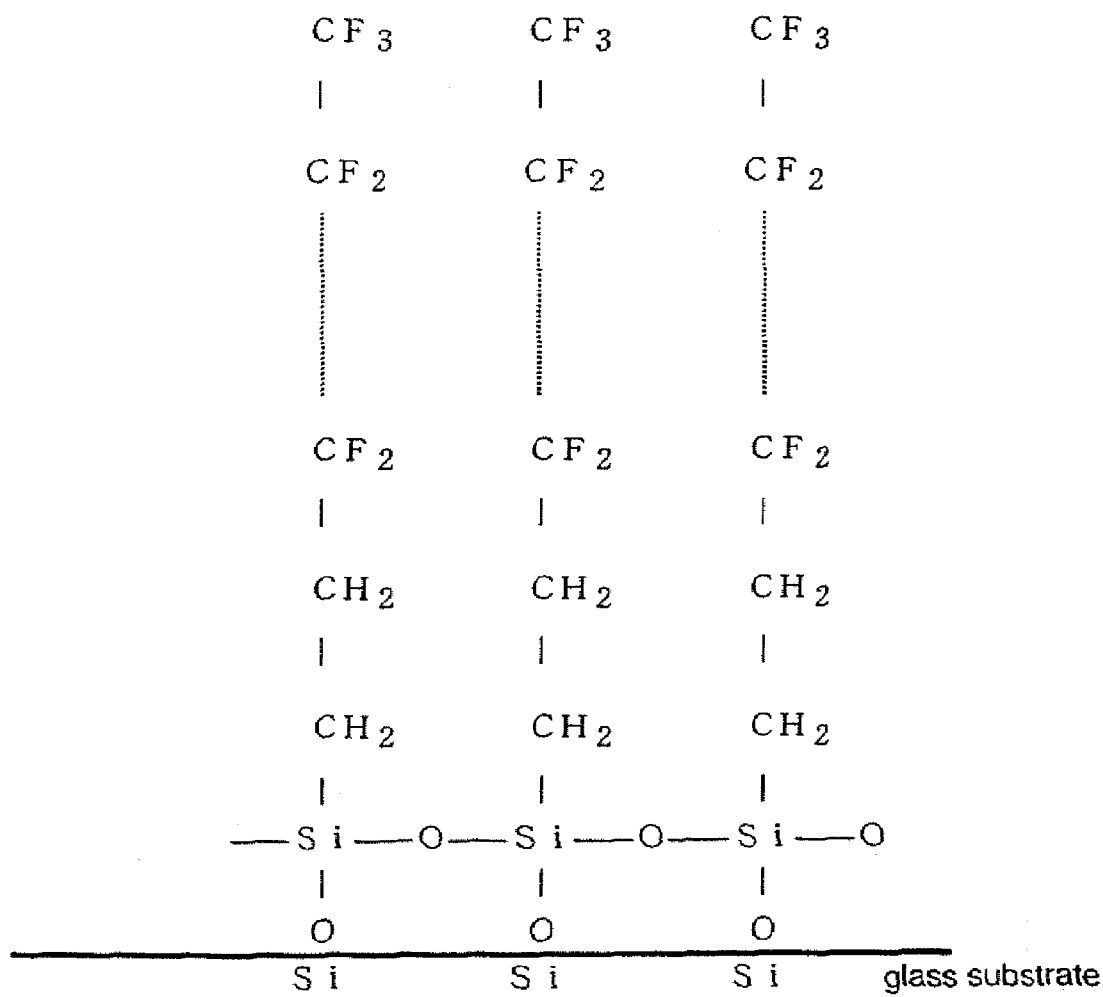
FIG. 22 is a view showing a surface structure of glass modified by a silane coupling agent.

A structure of a glass surface in the case of case modification of glass that is an insulator being performed using $CF_3(CF_2)_kCH_2CH_2Si(OCH_3)_3$ is shown in FIG. 22. The contact angle with liquid (for example, water) adhered onto the glass increases in the order of $CF<CF_2<CF_3$. Further, the contact angle tends to be larger as the chain of fluorocarbon is longer. Note that the contact angle θ is defined as an angle formed by a liquid surface and a solid surface in the area where the free surface of stationary liquid touches a solid surface. The contact angle depends on the magnitude relationship between cohesion of liquid molecules and adherence between the liquid and the solid surface. The contact angle is acute when the liquid wets the solid (when the adherence is strong), and the contact angle is obtuse when the liquid does not wet the solid. In other words, as the contact angle is larger, the adherence is weaker; namely, the liquid repellency is increased.

Instead of FAS, as a fluorine-based resin having liquid repellency, polytetra-fluoroethylene (PTFE), perfluoroalkoxy alkane (PFA), perfluoroethylene-propylene copolymer (PFEP), ethylene-tetrafluoroethylene copolymer (ETFE), polyvinylidene fluoride (PVDF), polychloro-trifluoroethylene (PCTFE), ethylene-chlorotrifluoroethylene copolymer (ECTFE), polytetrafluoroethylene-perfluoro dioxole copolymer (TFE/PDD), polyvinyl fluoride (PVF), or the like can be used. Note that the organic film is regarded as having liquid repellency in a case the contact angle being more than 35° (more preferable 45°).

Note that the organic film 113 may be formed by plasma treatment using a $CF_4$ gas or a $CHF_3$ gas. In that case, a mixed gas diluted with a noble gas may be used as well. Further, other gases may also be employed as long as they contain fluorine.

Subsequently, a third mask pattern 114 is selectively formed in an area in which a contact hole is to be formed between interlayer insulating films (FIG. 3B). It is desirable that the third mask pattern 114 is selectively formed by a droplet discharge method. In this embodiment mode, the third mask pattern 114 is formed of PVA (polyvinyl alcohol), though the invention is not limited to this and other water soluble resins or organic resins such as polyimide, acryl and siloxane may be used for example.

Figure 3C:
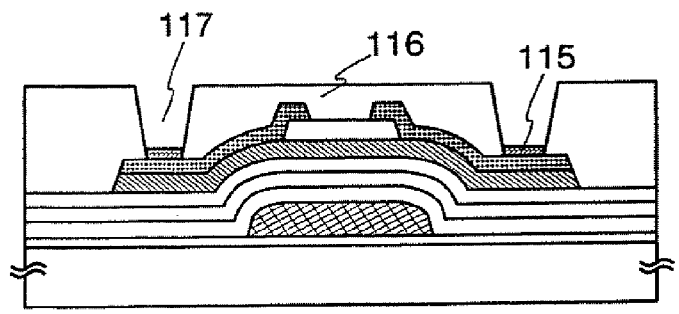

Then, the organic film 113 is removed using the third mask pattern 114 as a mask, thereby an island shape organic film 115 is formed (FIG. 3C). The organic film 113 is desirably removed by $O_2$ ashing or atmospheric pressure discharge plasma, though the invention is not limited to this. For example, UV ozone treatment, laser treatment or the like can be adopted.

The third mask pattern 114 formed of PVA is removed by $H_2O$ (water washing) (FIG. 3C). Note that in the case of polyimide or acryl being used, the third mask pattern 114 can be easily removed by the N300 stripper or the 710 stripper. Needless to say, ashing or etching may be used as well for removing.

Although the third mask pattern 114 is removed in this embodiment mode, it may remain in the case of having liquid repellency to an interlayer insulating film formed later. Even when the third mask pattern 114 does not have liquid repellency, it can be treated with $CF_4$ plasma or the like to obtain liquid repellency. For example, when a water soluble resin such as PVA is treated with $CF_4$ plasma, it can obtain liquid repellency to an organic resin such as polyimide, acryl and siloxane used as an interlayer insulating film.

Next, an interlayer insulating film 116 formed of an organic resin is applied over an entire surface of the substrate. Although a heat resistant siloxane resin is used here, the invention is not limited to this and an organic resin such as polyimide and acryl may be used as well. At this time, the interlayer insulating film 116 is not formed over die island shape organic film 115 since the island shape organic film 115 repels the organic resin. As a result, a contact hole 117 is formed in a self aligned manner (FIG. 310. Further, the interlayer insulating film 116 is tapered at this time, thus step coverage with a conductive film formed later can be improved. Note that the island shape organic film 115 is removed thereafter by $O_2$ ashing, atmospheric pressure plasma or the like. Instead, UV ozone treatment, laser treatment or the like may also be performed.

Figure 3D:
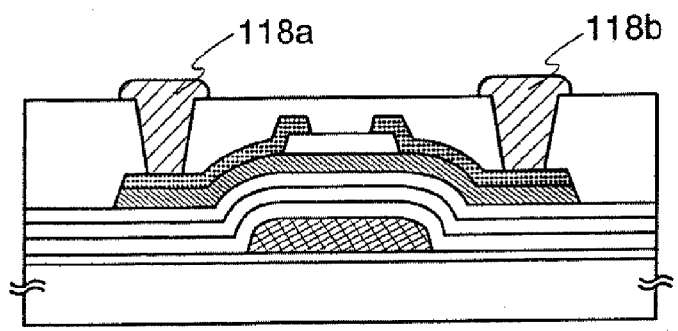

Subsequently, a composition containing a conductive material is discharged into the contact hole 117 by a droplet discharge method, then dried or baked to form a source wiring 118a and a drain wiring 118b (collectively referred to as a 2nd wiring) (FIG. 3D). The source wiring 118a and the drain wiring 118b (the 2nd wiring) are connected to the source and drain regions 112a and 112b of a TFT respectively. In the case where a passivation film is formed over the source and drain regions 112a and 112b, it is removed by etching or the like using the interlayer insulating film 116 as a mask to form the contact hole 117. The etching is desirably performed using an etchant having high etch selectivity relative to the semiconductor film constituting the source and drain regions on the bottom layer. The source and drain wirings 118a and 118b may be formed of a similar conductive material to that used for the gate electrode.

Although the source and drain regions are directly connected to the source and drain wirings in this embodiment mode, another conductive layer (single layer or multi-layers) may be disposed therebetween.

In such a manner, a channel protected TFT can be obtained. Since the channel protected TFT includes a channel protective film 108, it is possible to prevent the channel region 119 from being damaged due to over etching when the N-type semiconductor film is etched to form the source and drain regions. Thus, the channel protected TFT can have stable characteristics and high mobility.

EMBODIMENT MODE 3

In this embodiment mode, a manufacturing method of a bottom gate TFT according to the invention, in particular a manufacturing method of a channel etched TFT is described with reference to FIGS. 4A to 4D and FIGS. 5E to 5G.

A gate electrode 402, a gate insulating film 404 and a semiconductor film 405 can be formed over a substrate 400 in the same manner as that described in Embodiment Mode 2 (see FIG. 4A and FIGS. 2A to 2C). In this embodiment mode, the base film pretreatment such as the formation of a titanium oxide film is omitted. However, it is needless to say that the pretreatment may be performed similarly to Embodiment Mode 2. Further, although the gate insulating film 404 has a single layer structure, it may have a multi-layer structure. Note that since a channel protective film is not provided in this embodiment mode, a mask pattern corresponding to the first mask pattern in Embodiment Mode 2 is not required.

Figure 4A:
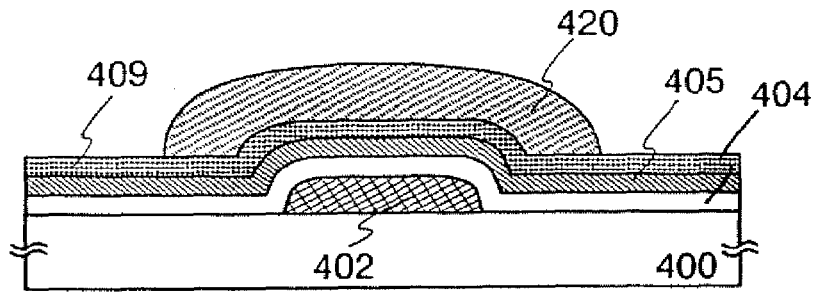
FIGS. 4A to 4D are views showing manufacturing steps of a semiconductor device according to the invention (a channel etched TFT).

An N-type semiconductor film 409 is formed over the semiconductor film 405, and then a mask pattern 420 (that corresponds to the second mask pattern in Embodiment Mode 2, and is referred to as a second mask pattern in this embodiment mode) is formed (FIG. 4A). The material and manufacturing method of the N-type semiconductor film 409 and the second mask pattern 420 may be the same as those shown in Embodiment Mode 2. Note that although the N-type semiconductor film is used herein, a P-type semiconductor film containing a P-type impurity element such as boron (B) may be used as well.

Figure 4B:
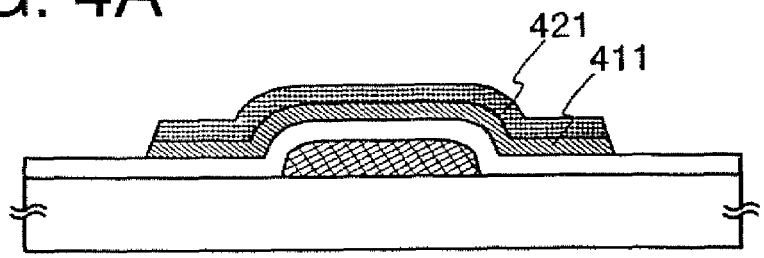

Next, etching is performed using the second mask pattern 420 as a mask, thereby an island shape semiconductor film 411 and an island shape N-type semiconductor film 421 arm formed (FIG. 4B).

Figure 4C:
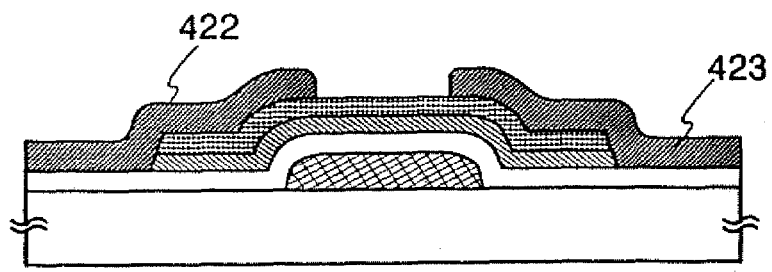

Subsequently, a source electrode 422 and a drain electrode 423 are formed (FIG. 4C). The source and drain electrodes 422 and 423 are desirably formed by discharging a composition containing a conductive material by a droplet discharge method and then drying or baking. The conductive material can be arbitrarily selected from the materials that are shown in Embodiment Mode 2 as conductive materials of the gate electrode.

Figure 4D:
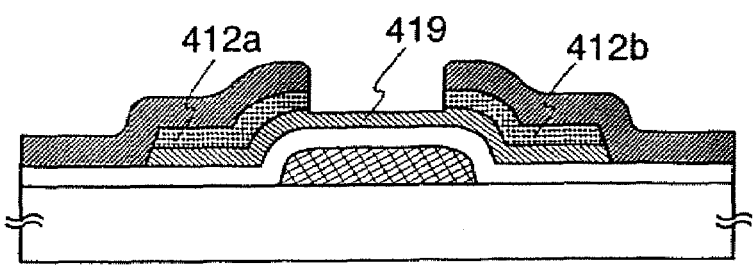

The island shape N-type semiconductor film 421 is etched using the source and drain electrodes 422 and 423 as masks, thereby a source region 412a and a drain region 412b art formed (FIG. 4D). At this time, the etching rate, the time for treatment, and the litre are required to be controlled in order to prevent the island shape semiconductor film 411 including a channel region 419 of a TFT from being damaged.

Although not shown, a passivation film may further be provided over the source and drain regions 412a and 412b in order to prevent impurities from being mixed into the semiconductor film. The passivation film may be formed of a single layer or multi-layers of a film containing silicon nitride, silicon oxide, silicon nitride oxide, or silicon oxynitride.

Figure 5A:
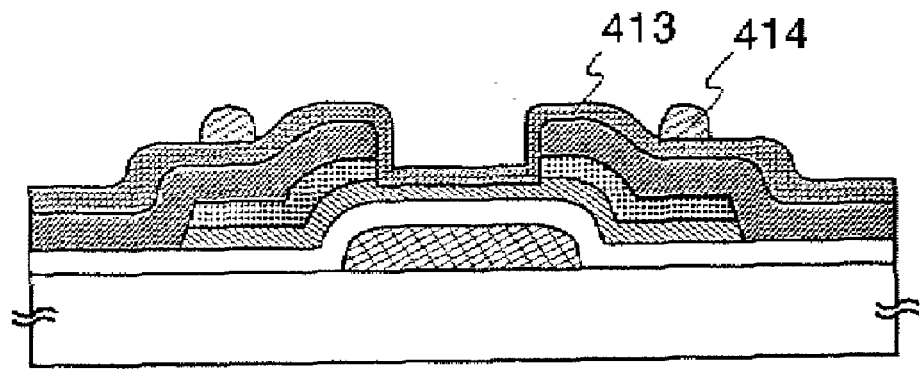
FIGS. 5A to 5C are views showing manufacturing steps of a semiconductor device according to the invention (a channel etched TFT).

Then, an organic film 413 having liquid repellency to an interlayer insulating film formed later is applied over an entire surface of the substrate (FIG. 5A). In this embodiment mode, fluoroalkyl silane (FAS) is formed by spin coating or slit coating, though the invention is not limited to these material and forming method, Note that since the FAS is a monomolecular film, the thickness thereof is about a few nm.

Note that the organic film 413 may be formed by plasma treatment using a $CF_4$ gas or a $CHF_3$ gas. In that case, a mixed gas diluted with a noble gas may be used as well. Further, other gases may also be employed as long as they contain fluorine.

Then, a mask pattern 414 (that corresponds to the third mask pattern in Embodiment Mode 2, and is referred to as a third mask pattern in this embodiment mode) is selectively formed in an area in which a contact hole is to be formed between interlayer insulating films (FIG. 5A). It is desirable that the third mask pattern 414 be selectively formed by a droplet discharge method. In this embodiment mode, the third mask pattern 414 is formed of PVA (polyvinyl alcohol), though the invention is not limited to this and other water soluble resins or organic resins such as polyimide, acryl and siloxane may be used for example.

Figure 5B:
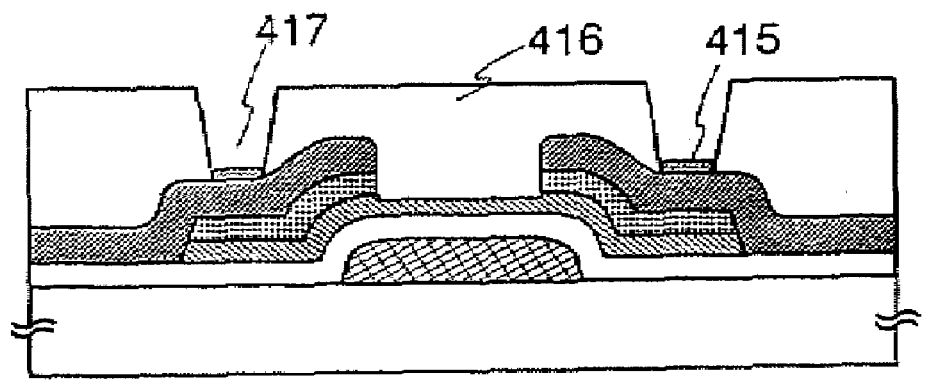

The organic film 413 is removed using the third mask pattern 414 as a mask to form an island shape organic film 415 (FIG. 5B). The organic film 413 is desirably removed by $O_2$ ashing or atmospheric pressure discharge plasma, though the invention is not limited to his. For example, UV ozone treatment, laser treatment or the like may be adopted as well.

The third mask pattern 414 formed of PVA is removed by $H_2O$ (water washing) (FIG. 5B). Note that in the case of polyimide or acryl being used, the third mask pattern 414 can be easily removed by the N300 stripper or the 710 stripper. Needless to say, ashing or etching may be used as well for removing.

Although the third mask pattern 414 is removed in this embodiment mode, it may remain in the case of having liquid repellency to an interlayer insulating film formed later. Even when the third mask pattern 414 does not have liquid repellency, it can be treated with $CF_4$ plasma or the like to obtain liquid repellency. For example, when a water soluble resin such as PVA is treated with $CF_4$ plasma, it can obtain liquid repellency to an organic resin such as polyimide, acryl and siloxane used as an interlayer insulating film.

Next, an interlayer insulating film 416 formed of an organic resin is applied over an entire surface of the substrate. Although a heat resistant siloxane resin is used here, the invention is not limited to this and an organic resin such as polyimide and acryl may be used as well. At this time, the interlayer insulating film 416 is not formed over the island shape organic film 415 since the island shape organic film 415 repels the organic resin. As a result, a contact hole 417 is formed in a self-aligned manner (HG 513). Further, the interlayer insulating film 416 is tapered at this time, thus step coverage with a conductive film formed later can be improved. Note that the island shape organic film 415 is removed thereafter by $O_2$ ashing, atmospheric pressure plasma or the like.

Figure 5C:
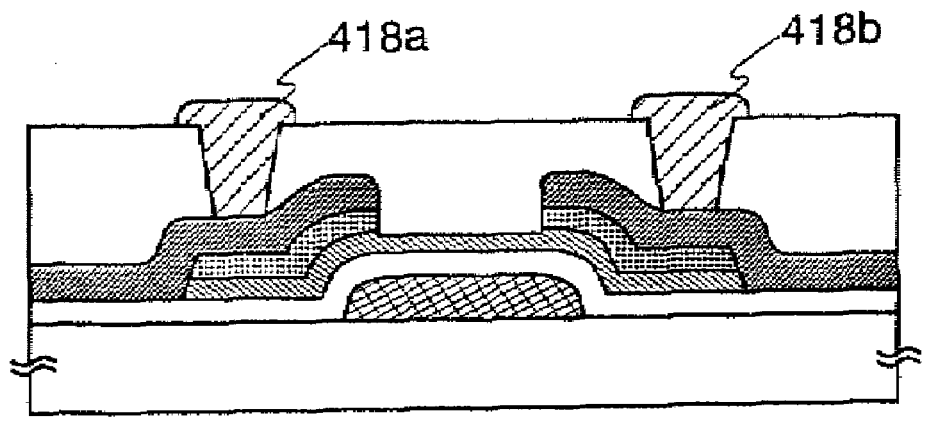

A composition containing a conductive material is discharged into the contact hole 417 by a droplet discharge method, then dried or baked to form a source wiring 418a and a drain 16 wiring 418b (FIG. 5C). The source wiring 418a and the drain wiring 418b are connected to the source and drain electrodes 422 and 423 of a TFT respectively. In the case where a passivation film is formed over the source and drain electrodes 422 and 423, it is removed by etching or the like using the interlayer insulating film 416 as a mask to form the contact hole 417. The etching is desirably performed using an etchant having high etch selectivity relative to the source and drain electrodes on the bottom layer. The source and drain wirings 418a and 418b may be formed of a conductive material arbitrarily selected from the materials that are shown in Embodiment Mode 2 as conductive materials of the gate electrode.

In such a manner, a channel etched TFT can be obtained. The channel etched TFT has the advantages that a channel protective film is not required and forming steps of a mask pattern can be simplified.

EMBODIMENT MODE 4

In this embodiment mode, a manufacturing method of a top gate TFT according to the invention is described with reference to FIGS. 6A to 6D and FIGS. 7E to 7H.

Figure 6A:
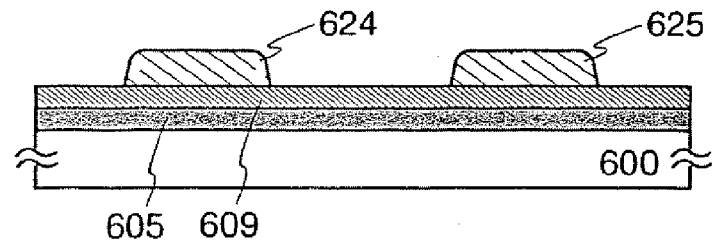
FIGS. 6A to 6D are views showing manufacturing steps of a semiconductor device according to the invention (a top gate TFT).

First, a semiconductor film 605 is formed over a substrate 600 (FIG. 6A). The semiconductor film 605 is formed of an amorphous semiconductor, a crystalline semiconductor or a semi-amorphous semiconductor, each of which mainly contains silicon, silicon germanium ($Si_xGe_{1-x}$) or the like. The semiconductor film 605 may be formed by plasma CVD or the like, and the thickness thereof is desirably in the range of 10 to 100 nm.

An N-type semiconductor film 609 is formed over the semiconductor film 605 (FIG. 6A). The N-type semiconductor film 609 is formed of an amorphous semiconductor, a crystalline semiconductor or a semi-amorphous semiconductor, each of which mainly contains silicon, silicon germanium ($Si_xGe_{1-x}$) or the like. As an N-type impurity element, arsenic (As) or phosphorous P) may be used. The N-type semiconductor film 609 may be formed by plasma CVD or the like. For example, in the case where the N-type semiconductor film 609 is formed of an SAS (semi-amorphous silicon), glow discharge decomposition of a mixed gas of $SiH_4$, $H_2$ and $PH_3$ (phosphine) is performed by plasma CVD to obtain an N-type (n+) silicon film. Note that although the N-type semiconductor film is used herein, a P-type semiconductor film containing a P-type impurity element such as boron (B) may be used as well.

Next, a composition containing a conductive material is discharged from a nozzle over the N-type semiconductor film 609, thereby a source electrode 624 and a drain electrode 625 are formed (FIG. 6A). The source and drain electrodes 624 and 625 are formed by drying the discharged composition at a temperature of 100° C. for three minutes, and then baking it at a temperature of 200 to 350° C. for 15 to 30 minutes, though the invention is not limited to these conditions. In addition, although the composition containing Ag (Hereinafter referred to as Ag nanopaste) as a conductive material is discharged in this embodiment mode, the conductive material may be arbitrarily selected from the materials that are shown in Embodiment Mode 2 as conductive materials of the gate electrode.

Note that the source and dr electrodes 624 and 625 may be formed by patterning a conductive film that is formed by sputtering.

Figure 6B:
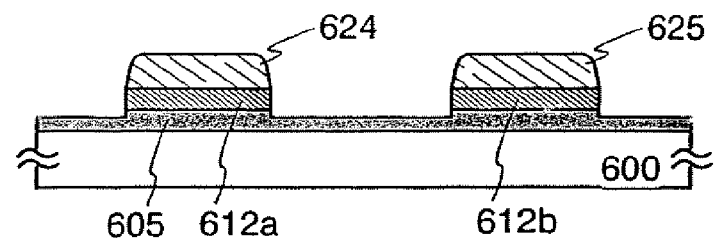

Subsequently, the N-type semiconductor film 609 is etched using the source and drain electrodes 624 and 625 as masks, thereby a source region 612a and a drain region 612b are formed (FIG. 6B). At this time, the etching conditions are required to be controlled so as to prevent the semiconductor film 605 from being etched and removed. However, if the etching rate of a surface of the semiconductor film 605 is small as shown in FIG. 6B, TFT characteristics are not seriously degraded.

Figure 6C:
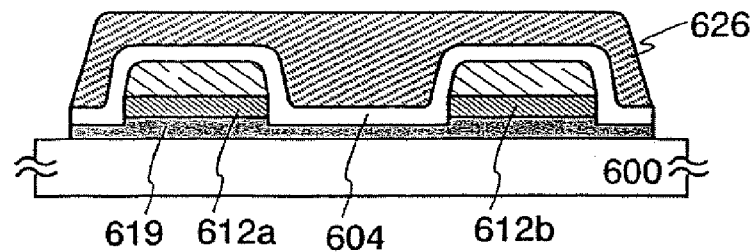

A gate insulating film 604 is formed over the source and drain electrodes 624 and 625 (FIG. 6C). It is preferable that the gate insulating film 604 is be formed of a single layer or multi-layers of a film containing silicon nitride, silicon oxide, silicon nitride oxide, or silicon oxynitride by a thin film forming method such as plasma CVD and sputtering. In this embodiment mode, a silicon nitride film is formed to have a thickness of 100 nm. In the case of a multi-layer structure, a $SiN_x$ film, a $SiO_x$ film and a $SiN_x$ film may be stacked in this order.

A mask pattern 626 is selectively formed using a resist or the like. Then, the gate insulating film 604 and the semiconductor film 605 are etched using the mask pattern 626 as a mask, thereby an island shape semiconductor film 619 is formed (FIG. 6C). It is desirable that the mask pattern 626 is selectively formed by a droplet discharge method, though it may be formed through conventional exposure and development steps. The mask pattern 626 is removed thereafter.

The island shape semiconductor film 619 is formed after the source and drain regions 612a and 612b are formed in this embodiment mode. Alternatively, an island shape semiconductor film and an island shape N-type semiconductor film may be formed after the semiconductor film 605 and the N-type semiconductor film 609 shown in FIG. 6A are formed, and then the source and drain regions 612a and 612b may be formed using the source and drain electrodes 624 and 625 as masks. In that case, the gate insulating film 604 is not required to be etched.

Figure 6D:
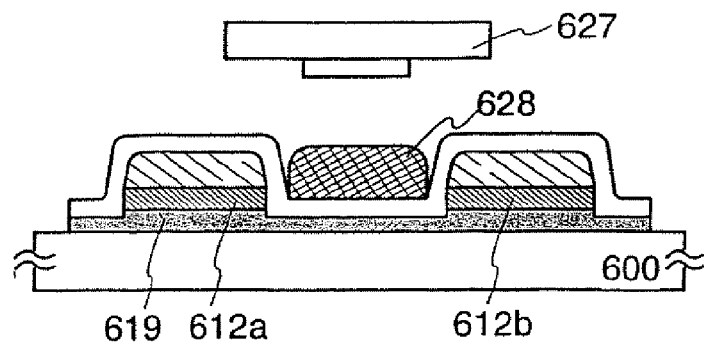

Next, a composition containing a conductive material is discharged from a nozzle 627 over the gate insulating film 604, thereby a gate electrode 628 is formed (FIG. 6D). The gate electrode 628 is formed by drying the discharged composition at a temperature of 100° C. for three minutes, and then baking it at a temperature of 200 to 350° C. for 15 to 30 minutes, though the invention is not limited to these conditions. In addition, although the Ag nanopaste is discharged as a conductive material in this embodiment mode, the conductive material may be arbitrarily selected from the materials that art shown in Embodiment Mode 2 as conductive materials of the gate electrode. Note that the form of the nozzle 627 is not limited to the one shown in FIG. 6D.

Although not shown, the aforementioned base film pretreatment may be applied to an area over the gate insulating film 604, in which at least the gate electrode 628 is to be formed. According to this, the adhesiveness between the gate electrode 628 and the gate insulating film 604 can be improved.

In addition, although not shown, a passivation film may further be provided over the gate electrode 628 in order to prevent impurities from being mixed into the semiconductor film. The passivation film may be formed of a single layer or multi-layers of a film containing silicon nitride, silicon oxide, silicon nitride oxide, or silicon oxynitride.

Figure 7A:
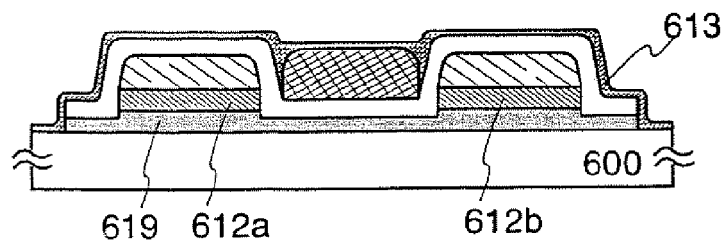
FIGS. 7A to 7D are views showing manufacturing steps of a semiconductor device according to the invention (a top gate TFT).

Then, an organic film 613 having liquid repellency to an interlayer insulating film formed later is applied over an entire surface of the substrate (FIG. 7A). In this embodiment mode, fluoroalkyl silane (FAS) is formed by slit coating, though the invention is not limited to these materials and forming method. Note that since the FAS is a monomolecular film, the thickness thereof is about a few nm.

Note that the organic film 613 may be formed by plasma treatment using a $CF_4$ gas or a $CHF_3$ gas. In that case, a mixed gas diluted with a noble gas may be used as well. Further, other gases may also be employed as long as they contain fluorine.

Figure 7B:
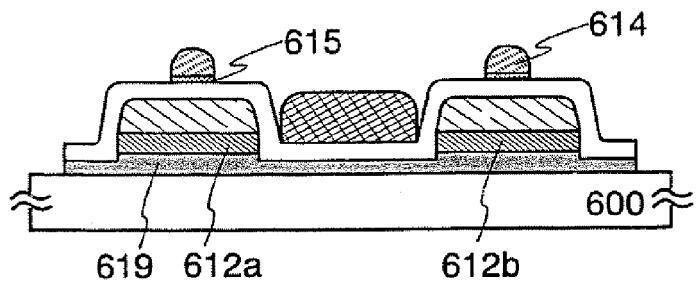

Then, a mask pattern 614 (that corresponds to the third mask pattern in Embodiment Modes 2 and 3) is selectively formed in an area in which a contact hole is to be formed between interlayer insulating films (FIG. 7B). It is desirable that the mask pattern 614 is selectively formed by a droplet discharge method. In this embodiment mode, the mask pattern 614 is formed of PVA (polyvinyl alcohol), though the invention is not limited to this and other water soluble resins or organic resins such as polyimide, acryl and siloxane may be used for example.

The organic film 613 is removed using the mask pattern 614 as a mask to form an island shape organic film 615 (FIG. 7B). The organic film 613 is desirably removed by $O_2$ ashing or atmospheric pressure discharge plasma, though the invention is not limited to this. For example, UV ozone treatment, laser treatment or the like may be adopted as well.

Figure 7C:
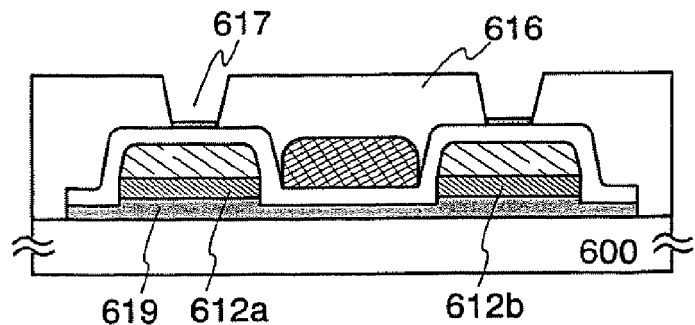

The mask pattern 614 formed of PVA is removed by $H_2O$ (water washing) (FIG. 7C). Note that in the case of polyimide or acryl being used, the mask pattern 614 can be easily 16 removed by the N300 stripper or the 710 stripper. Needless to say, ashing or etching may be used as well for removing.

Although the mask pattern 614 is removed in this embodiment mode, it may remain in the case of having liquid repellency to an interlayer insulating film formed later. Even when the mask pattern 614 does not have liquid repellency, it can be treated with $CF_4$ plasma or the like to obtain liquid repellency. For example, when a water soluble resin such as PVA is treated with $CF_4$ plasma, it can obtain liquid repellency to an organic resin such as polyimide, acryl and siloxane used as an interlayer insulating film.

Next, an interlayer insulating film 616 formed of an organic resin is applied over an entire surface of the substrate. Although a heat resistant siloxane resin is used here, the invention is not limited to this and an organic resin such as polyimide and acryl may be used as well. At this time, the interlayer insulating film 616 is not formed over the island shape organic film 615 since the island shape organic film 615 repels the organic resin. As a result, a contact hole 617 is formed in a self-aligned manner (FIG. 7C). Further, the interlayer insulating film 616 is tapered at this time, thus step coverage with a conductive film formed later can be improved. Note that the island shape organic film 615 is removed thereafter by $O_2$ ashing, atmospheric pressure plasma or the like.

The exposed gate insulating film 604 is etched to be removed using the interlayer insulating film 616 as a mask, thereby the contact hole 617 is completed. Note that the gate insulating film 604 and the island shape organic film 615 may be removed at a time.

Figure 7D:
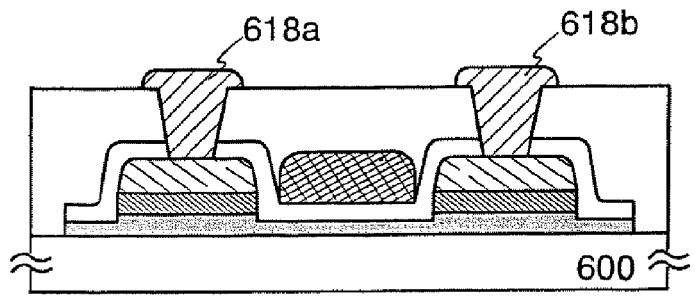

Subsequently, a composition containing a conductive material is discharged into the contact hole 617 by a droplet discharge method, then died or baked to form a source wiring 618a and a drain wiring 618b (collectively referred to as a 2nd wiring) (FIG. 7D). The source wiring 618a and the drain wiring 618b (the 2nd wiring) are connected to the source and drain electrodes 624 and 625 of a TFT respectively. In the case where a passivation film is formed over the source and drain electrodes 624 and 625, it is removed by etching or the like using the interlayer insulating film 616 as a mask to form the contact hole 617. The etching is desirably performed using an etchant having high etch selectivity relative to the source and drain electrodes on the bottom layer. The source and drain wirings 618a and 618b may be formed of a similar conductive material to that used for the gate electrode.

Although the source and drain regions are directly connected to the source and drain wirings in this embodiment mode, another conductive layer (single layer or multi-layers) may be disposed therebetween.

In such a manner, a top gate TFT (inverted staggered TFT herein) can be obtained. In this embodiment mode, the source and drain electrodes are formed by utilizing the forming method of a contact hole according to the invention, then a contact hole is formed according to the invention, and further source and drain wirings are formed. However, a forming method of a TFT is not limited to the foregoing, and the source and drain electrodes may also function as the wirings. In that case, the source and drain wirings 118a and 118b are not required (FIG. 6D corresponds to a cross sectional view of the completed TFT). Further, the source and drain electrodes function as a so-called metal mask for etching an N-type semiconductor film.

The aforementioned manufacturing method of a TFT shown in FIGS. 6A to 6D and FIGS. 7E and 7H has novel features such as the forming method of a contact hole and the formation of source and drain regions by separating an N-type semiconductor film using source and drain electrodes as a metal mask. Therefore, the manufacturing method of a TFT shown in FIGS. 6A to 6D and FIGS. 7E and 7H can provide a manufacturing method of a semiconductor device using a droplet discharge method, which is low in cost and high in throughput and yield.

EMBODIMENT 1

In this embodiment, a manufacturing method of an active matrix EL light emitting device according to the invention is described with reference to FIGS. 9A and 9B, FIGS. 10A and 10B, FIGS. 11A to 11E, and FIGS. 12A to 12C.

Figure 9A:
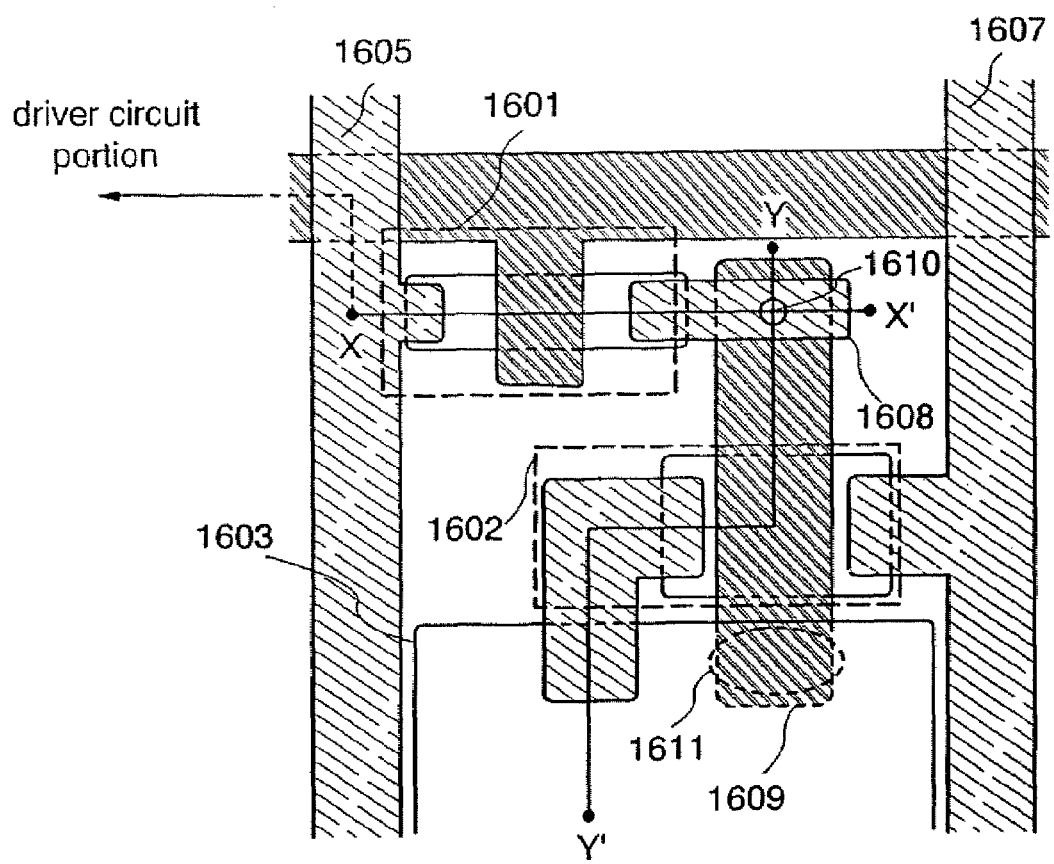
FIG. 9A is a top plan view of a pixel of an EL display device according to the invention and FIG. 9B is a circuit diagram thereof (forward staggered).
Figure 9B:
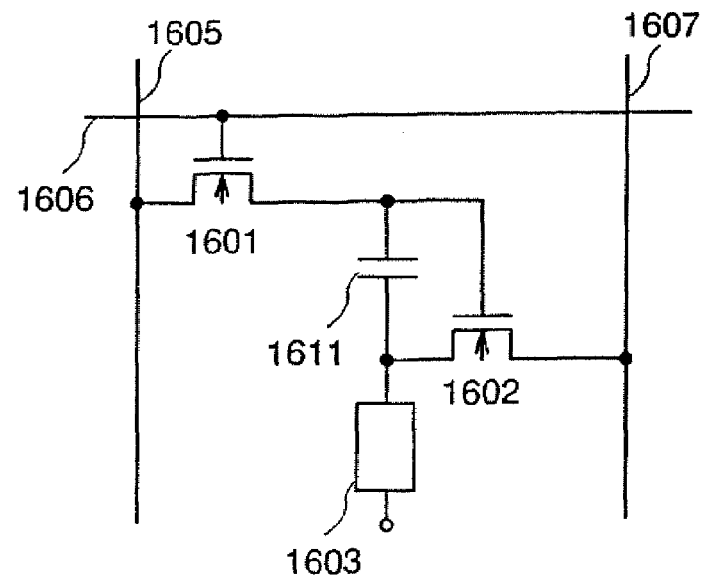

In the case where a light emitting element having a layer containing an organic or inorganic compound (typically, a light emitting element utilizing electro luminescence (EL)) is driven by a thin film transistor (TFT), at least two transistors are generally used in a pixel region as shown in FIGS. 9A and 9B, which are a switching TFT and a driving TFT provided for preventing variations in ON current of the switching TFT.

In the light emitting element, a light emitting layer which is a stack of layers containing organic or inorganic compounds having different carrier transporting characteristics is sandwiched between a pair of electrodes, and the light emitting layer is formed so that holes can be injected from an electrode and electrons can be injected from the other electrode. The light emitting element uses a phenomenon in which holes injected from an electrode and electrons injected from the other electrode are recombined to excite luminescent centers and light is produced when the excited state returns to a ground state.

Figure 10A:
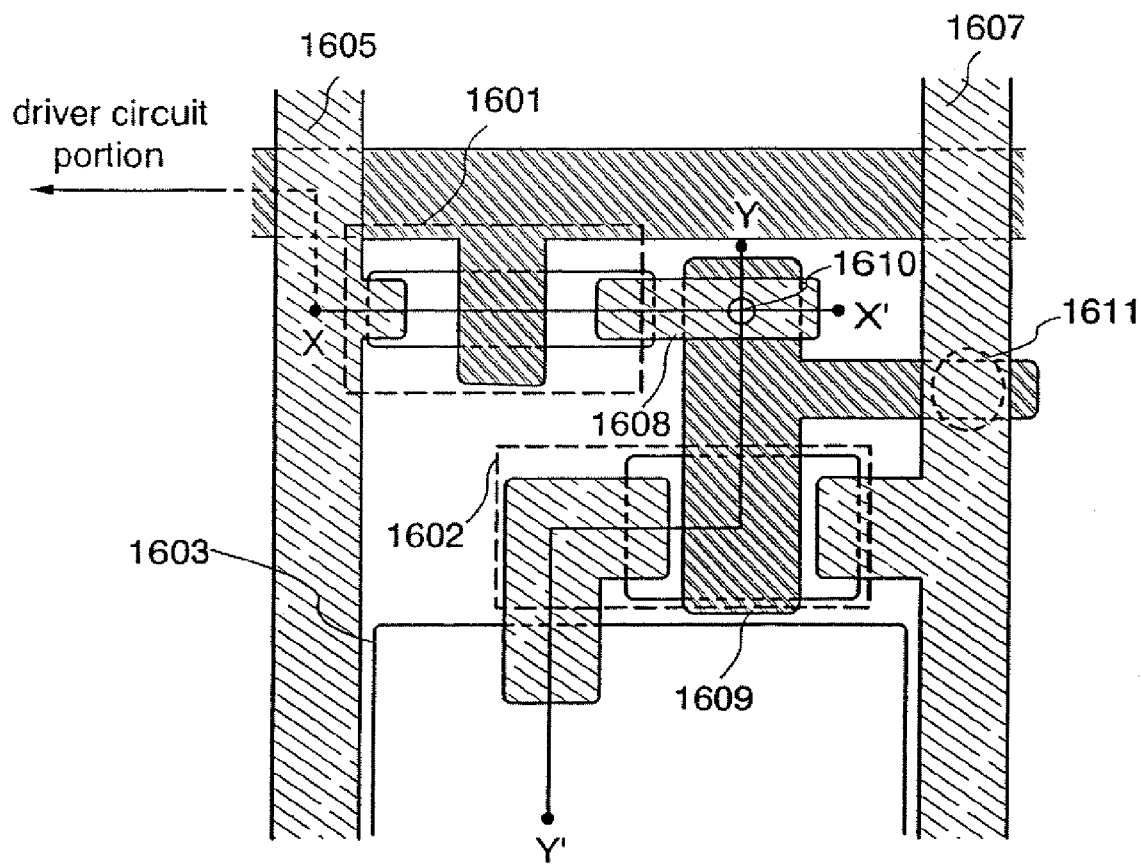
FIG. 10A is a top plan view of a pixel of an EL display device according to the invention and FIG. 10B is a circuit diagram thereof (inverted staggered).
Figure 10B:
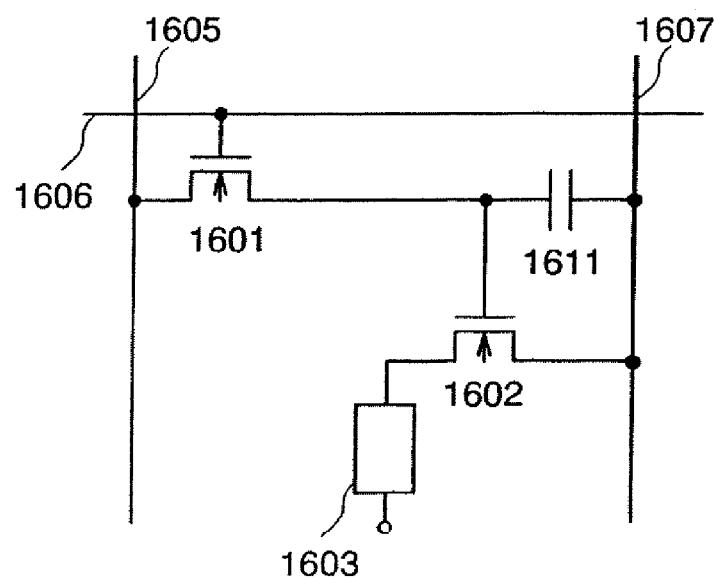

FIG. 9B is a circuit diagram in the case where a light emitting element has a forward staggered structure, namely a pixel electrode of a driving TFT 1602 corresponds to a hole injection electrode (anode). Meanwhile, FIG. 10B is a circuit diagram in the case where a light emitting element has an inverted staggered structure, namely the pixel electrode of the driving TFT 1602 corresponds to an electron injection electrode (cathode).

Reference numeral 1601 in FIG. 9B denotes a switching TFT for controlling ON/OFF of a current flowing to a pixel. A drain wiring (or a source wiring) of the switching TFT 1601 is connected to a gate electrode layer 1609 of the driving TFT 1602 as shown in FIG. 9B. Since a gate insulating film and a semiconductor layer are provided between the gate electrode layer 1609 and 2nd wirings 1605 and 1608 (source wiring or drain wiring), the gate electrode layer 1609 of the driving TFT 1602 is electrically connected to the drain wiring 1608 (or the source wiring) of the switching TFT 1601 through an opening 1610 such as a contact hole (see FIG. 9A). Note that these reference numerals are identical to those in FIGS. 10A and 10B. Reference numeral 1611 in FIGS. 9A and 9B and FIGS. 10A and 10B denotes a capacitor of which the position is not limited to the one shown in FIGS. 9A and 9B and FIGS. 10A and 10B. Note that reference numeral 1607 denotes a power source line, 1606 denotes a gate line, 1603 denotes a light emitting element.

A light emitting device and a manufacturing method thereof according to the invention are described with reference to FIGS. 11A to 11E. FIGS. 11A to 11E show cross sectional structures along a line X-X' (switching TFT side) and a line Y-Y' (driving TFT side) of FIGS. 9A and 9B or FIGS. 10A and 10B.

First, a so-called photocatalytic substance such as titanium (Ti) and titanium oxide ($TiO_x$) or a heat resistant resin such as polyimide, acryl and siloxane is formed in an area over a substrate 1100, in which at least a gate electrode layer is to be formed (not shown). Alternatively, plasma treatment may be performed. According to such pretreatment, it is possible to increase the adhesiveness between the substrate 1100 and conductive films (gate electrode layers 1101 and 1102 herein) formed later by discharging a composition containing a conductive material. When titanium oxide is formed, light transmissivity can be increased. Titanium oxide may be formed directly, or can be obtained by baking a titanium film simultaneously with the conductive films. It is also possible to use a photocatalytic substance such as strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), and tungsten oxide ($WO_3$) as well as titanium and titanium oxide. The aforementioned pretreatment is desirably performed in order to increase the adhesiveness between the substrate and the conductive films.

A composition containing a first conductive material is discharged over the substrate 1100, or in the case of the pretreatment being performed, over an area in which the pretreatment is applied. Accordingly, the gate electrode layer 1101 of the switching TFT and the gate electrode layer 1102 of the driving TFT are formed. The gate electrode layer here means a single layer or multi-layers of a conductor, which includes at least a gate electrode portion of a TFT. The gate electrode layer is formed by drying the discharged composition at a temperature of 100° C. for three minutes, then baking it at a temperature of 200 to 350° C. for 15 to 30 minutes under a nitrogen or oxygen atmosphere, though the conditions are not limited to these.

Various materials may be selected as the first conductive material depending on the function of the conductive film. Typically used for the first conductive material is silver (Ag), copper (Cu), gold (Au), nickel (Ni), platinum (Pt), chromium (Cr), tin (Sn), palladium (Pd), iridium (Ir), rhodium (Rh), ruthenium (Ru), rhenium (Re), tungsten (W), aluminum (Al), tantalum (Ta), indium (In), tellurium (Te), molybdenum (Mo), cadmium (Cd), zinc (Zn), iron (Fe), titanium (Ti), silicon (Si), germanium (Ge), zirconium (Zr), barium (Ba), antimony lead, tin oxide antimony, fluoride doped zinc oxide, carbon, graphite, glassy carbon, lithium, beryllium, sodium, magnesium, potassium, calcium, scandium, manganese, gallium, niobium, sodium-potassium alloys, magnesium-copper mixtures, magnesium-silver mixtures, magnesium-aluminum mixtures, magnesium-indium mixtures, aluminum-aluminum oxide mixtures, lithium-aluminum mixtures, or the like, or silver halide particles, dispersed nanoparticles, indium tin oxide (ITO) used as a transparent conductive film, zinc oxide (ZnO), zinc oxide added with gallium (GZO), indium zinc oxide (IZO) in which 2 to 20% of zinc oxide is mixed into indium oxide, organic indium, organotin, titanium nitride, or the like.

In addition, silicon (Si) or silicon oxide ($SiO_x$) may be mixed into the aforementioned conductive material especially when used for a transparent conductive film. For example, a conductive material in which silicon oxide is contained in TIM (generally referred to as ITO—$SiO_x$; however, hereinafter referred to as ITSO or NITO for convenience) may be used. Further, layers of these conductive materials may be stacked to form a desired conductive film.

The diameter of a nozzle used as a droplet discharge means is set at 0.1 to 50 μm preferably, 0.6 to 26 μm), and the amount of the composition discharged from the nozzle is set at 0.00001 to 50 pl preferably, 0.0001 to 10 pl). The discharge amount increases in proportion to the diameter of the nozzle. Further, the distance between an object and an orifice of the nozzle is preferably as short as possible, and reduced to about 0.1 to 2 mm in order to discharge the composition on a desired area.

The composition discharged from an orifice is preferably used a solution in which gold, silver or copper is dissolved or dispersed in a solvent in view of the resistivity. More preferably, silver or copper that has low resistance may be used. Note that, in the case of copper being used, it is preferable to provide a barrier film for preventing impurities from entering. Used as the solvent may be esters such as butyl acetate and ethyl acetate, alcohols such as isopropyl alcohol and ethyl alcohol, or an organic solvent such as methyl ethyl ketone and acetone. As the barrier film in the case of copper being used for a wiring, an insulating or conductive material containing nitrogen such as silicon nitride, silicon oxynitride, aluminum nitride, titanium nitride, and tantalum nitride (TaN) may be employed, and such a material may be applied by a droplet discharge method.

The viscosity of a composition used in the droplet discharge method is preferably 300 mPa·s or less for preventing drying and allowing the composition to be discharged smoothly from the orifice. The viscosity of the composition, the surface tension, or the like may be set appropriately in accordance with the solvent or the application. For example, the viscosity of a composition in which ITO, ITSO, organic indium, or organotin is dissolved or dispersed in a solvent is 5 to 50 mPa·s; the viscosity of a composition in which silver is dissolved or dispersed in a solvent is 5 to 20 mPa·s; and the viscosity of a composition in which gold is dissolved or dispersed in a solvent is 10 to 20 mPa·s.

It is preferable that the diameter of the conductor particles is as small as possible in order to prevent each nozzle from clogging or to make fine patterns, and more preferably, each particle has a diameter of 0.1 μm or less, though it depends on the diameter of each nozzle or the desirable pattern shape. Each composition may be formed by a known method such as an electrolytic method, an atomization method and wet reduction, and the particle size is generally about 0.5 to 10 μm. Note that, in the case of the composition being formed by gas evaporation, nanoparticles protected with a dispersant are as fine as about 7 nm, and the nanoparticles are dispersed stably at a room temperature and behave similarly to liquid without aggregation in a solvent when they are each protected with a coating. Therefore, it is preferable to use a coating.

The gate electrode layer may be formed by discharging a composition containing particles in which one conductive material is covered with another conductive material. In that case, a buffer layer is desirably provided between each conductive material. For example, in the particle structure in which Cu is covered with Ag, a buffer layer formed of Ni or NiB (nickel boron) may be provided between the Cu and the Ag.

When a gas mixed with oxygen having a partial pressure of 10 to 30% is used for the baking step of a composition containing a conductive material, the resistivity of a conductive film constituting the gate electrode layer can be reduced and the conductive film can be reduced in thickness and planarized. Nanopaste containing a conductive material such as Ag is an organic solvent dispersed or dissolved with a conductive material. However, the nanopaste also includes a dispersant or a thermosetting resin called a binder. In particular, the binder functions to prevent cracks or uneven baking from being produced during baking. Further, through drying or baking steps, evaporation of an organic solvent, elimination of the dispersant by dissolution, and curing and shrinking of the binder all proceed simultaneously, thereby nanoparticles are fused to cure the nanopaste. At this time, nanoparticles grow to be several tens to one hundred and several tens nm in diameter, thereby adjacent grown particles are fused to be linked together, forming a metallic bond. On the other hand, most of the remnant organic component (about 80 to 90%) is pushed out of the metallic bond, and consequently, a conductive film containing the metallic bond is formed as well as a film containing an organic component that covers the exterior of the conductive film. The film containing an organic component can be removed when oxygen contained in a gas reacts with carbon or hydrogen contained in the film containing an organic component in the baking of the nanopaste under a nitrogen or oxygen atmosphere. In the case where oxygen is not contained in the baking atmosphere, the film containing an organic component can be removed by oxygen plasma treatment or the like. In this manner, the film containing an organic component can be removed by baking the nanopaste under a nitrogen or oxygen atmosphere or by oxygen plasma treatment after the baking. Thus, the conductive film containing the remnant metallic bond can be planarized and reduced in thickness and resistivity.

A solvent in the composition containing a conductive material is volatilized by discharging the composition under low pressure. Consequently, the time for heat treatment thereafter (drying or baking) can be reduced.

In addition to the aforementioned drying and baking steps, CMP (Chemical Mechanical Polish), a method of planarizing a conductive film by etching an insulating film with planarity formed over the conductive film (called an etch back method), or the like may be performed for further smoothing and planarizing the surface.

Used as the substrate 1100 is a glass substrate, a quartz substrate, a substrate made of an insulating substance such as alumina, a heat resistant plastic substrate which can endure the processing temperature of the subsequent steps, or the like. In that case, it is desirable to form an insulating base film of silicon oxide ($SiO_x$), silicon nitride ($SiN_x$), silicon oxynitride ($SiO_xN_y$) (x>y), silicon nitride oxide ($SiN_xO_y$) (x>y) (x, y=1, 2 . . . ), or the like in order to prevent diffusion of impurities or the like from tee substrate. Further, as the substrate 1100, a substrate made of metal such as stainless or a semiconductor substrate may be used by applying the surface thereof with an insulating film of silicon oxide or silicon nitride.

Subsequently, a gate insulating film 1103 is formed over the gate electrode layers 1101 and 1102. The gate insulating film 1103 is preferably formed of a single layer or multi-layers of a film containing silicon nitride, silicon oxide, silicon nitride oxide, or silicon oxynitride by a thin film forming method such as plasma CVD and sputtering. In this embodiment, a silicon oxide film, a silicon nitride film and a silicon oxide film are stacked over the substrate 1100 in this order, though the invention is not limited to these structure, material and method.

Then, a semiconductor film is formed over the gate insulating film 1103. The semiconductor film is formed of an amorphous semiconductor, a crystalline semiconductor or a semi-amorphous semiconductor, each of which mainly contains silicon, silicon germanium (SiGe), or the like. The semiconductor film may be formed by plasma CVD or the like. It is desirable that the semiconductor film have a thickness of 10 to 100 nm.

An SAS (semi-amorphous silicon) that is a kind of the aforementioned semi-amorphous semiconductor is briefly described. The SAS can be obtained by glow discharge decomposition of silicon gas. Typically, $SiH_4$ is used as a silicon gas, and $Si_2H_6$, $SiH_2Cl_2$, $SiHCl_3$, $SiCl_4$, $SiF_4$ or the like may be used as well. The formation of the SAS can be facilitated by diluting the silicon gas with a single or a plurality of noble gas elements selected from hydrogen, hydrogen and helium, argon, krypton, and neon. The silicon gas is preferably diluted at a dilution rate of 10 to 1000. It is needless to say that the reactive formation of the SAS by glow discharge decomposition is desirably performed under low pressure, but the discharge may be performed under a pressure of about 0.1 to 133 Pa. The power frequency for generating the glow discharge is in the range of 1 to 120 MHz, and more preferably, an RF power of 13 to 60 MHz is supplied. The substrate is preferably heated at a temperature of 300° C. or less, and more preferably 100 to 200° C.

The silicon gas may also be mixed with a carbon gas such as $CH_4$ and $C_2H_6$, or a germanium gas such as $GeH_4$ and $GeF_4$ to set the energy bandwidth at 1.5 to 2.4 eV, or 0.9 to 1.1 eV.

When an impurity element for controlling valence electrons is not added to an SAS intentionally, the SAS exhibits a small N-type conductivity. This is because oxygen is easily mixed into a semiconductor film since the glow discharge is performed at a higher power than in the case of forming an amorphous semiconductor. When an impurity element which imparts P-type conductivity is added to the first semiconductor film including a channel forming region of a TFT simultaneously with or after the deposition, a threshold value can be controlled. Typically, boron is used for an impurity element that imparts P-type conductivity. An impurity gas such as $B_2H_6$ and $BF_3$ may be mixed into the silicon gas at a rate of 1 to 1000 ppm. For example, in the case of boron being used as an impurity element that imparts P-type conductivity, the concentration of boron is preferably in the range of $1\times10^{14}$ to $6\times10^{16}$ atoms/cm$^3$. Note that when a channel forming region is formed of such an SAS, a field effect mobility of 1 to 10 cm$^2$/V·sec can be obtained.

A crystalline semiconductor film can be obtained by the following steps: an amorphous semiconductor film is treated with a solution containing nickel or the like; a crystalline silicon semiconductor film is obtained by thermal crystallization at a temperature of 500 to 750° C.; and the crystallinity of the crystalline semiconductor film is improved by laser crystallization.

The crystalline semiconductor film can also be obtained by directly forming a polycrystalline semiconductor film by LPCVD (Low Pressure CVD) using disilane ($Si_2H_6$) and germanium fluoride ($GeF_4$) as material gas. In this embodiment, the flow rate of the gas is set so that $Si_2H_6/GeF_4=20/0.9$ is satisfied, the deposition temperature is set at 400 to 500° C., and He or Ar is used as a carrier gas, though the invention is not limited to these conditions.

Next, an N-type semiconductor film is formed over the semiconductor film. As an N-type impurity element, arsenic (As) or phosphorous (P) may be used. For example, in the case where an N-type semiconductor film is formed, glow discharge decomposition of a mixed gas of $SiH_4$, $H_2$ and $PH_3$ (phosphine) is performed by plasma CVD to obtain an N-type (n+) silicon film. Note that instead of the N-type semiconductor film, a P-type semiconductor film containing a P-type impurity element such as boron (B) may be used as well.

A composition containing a second conductive material is discharged over the N-type semiconductor film, thereby source electrodes 1106 and 1130 and drain electrodes 1107 and 1140 are formed. The second conductive material, the conductive particle structure, discharge conditions, drying and baling conditions, and the like thereof may be arbitrarily selected from those for the first conductive material shown above. Note that the first conductive material and the second conductive material may have the same particle structure or different particle structures.

Although not shown, pretreatment may be applied to the N-type semiconductor film before discharging the composition containing a second conductive material. According to this, the adhesiveness between the N-type semiconductor film and the source and drain electrodes can be increased. This pretreatment may be performed similarly to the pretreatment in the formation of the gate electrode layer, though a conductive material is required to be used.

Figure 11A:
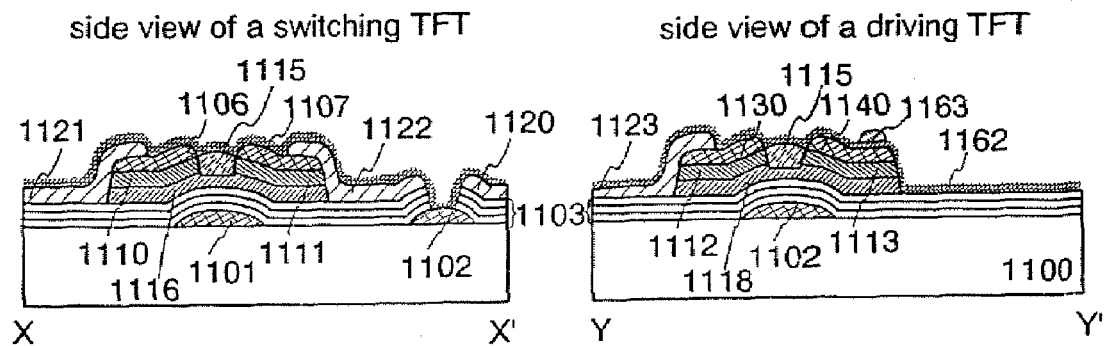
FIGS. 11A to 11E are views showing manufacturing steps of an EL display device according to the invention.

Subsequently, the N-type semiconductor film is etched using the source and drain electrodes 1106, 1130, 1107 and 1140 as masks, thereby source regions 1110 and 1112 and drain regions 1111 and 1113 are formed. In this embodiment, plasma etching is performed using as an etching gas chlorine-based gas such as $Cl_2$, $BCl_3$, $SiCl_4$, or $CCl_4$, fluorine-based gas such as $CF_4$, $SF_6$, $NF_3$, and $CHF_3$, or $O_2$, though the invention is not limited to this. The etching may be performed by utilizing an atmospheric plasma using as an etching gas a mixed gas of $CF_4$ and $O_2$. Note that the etching rate, the time for etching, and the like are required to be controlled so as not to remove the semiconductor film by etching the N-type semiconductor film. However, even when the semiconductor film is etched partially as shown in FIG. 11A, sufficient mobility of a TFT can be achieved when the thickness of the semiconductor film in a channel region is 5 nm (50 Å) or more, preferably 10 nm (100 Å) or more, and more preferably 50 nm (500 Å) or more.

An insulating film 1115 is formed by a droplet discharge method over an area that is to be a channel region of the semiconductor film. Since the insulating film 1115 functions as a channel protective film, a discharged composition is selected from a heat resistant resin such as siloxane or an insulating material that is resistant to etching such as acryl, benzocyclobutene, polyamide, polyimide, benzimidazole, and polyvinyl alcohol. Preferably, siloxane or polyimide is employed. It is also desirable that the insulating film 1115 have a thickness of 100 nm or more, and more preferably 200 nm or more in order to protect the channel region from over etching. Therefore, although not shown, the insulating film 1115 may be formed so as to be elevated over the source and drain electrodes.

The semiconductor film is etched using the source and drain electrodes 1106, 1130, 1107 and 1140 and the insulating film 1115 as masks, thereby island shape semiconductor films 1116 and 1118 are formed. In this embodiment, plasma etching is performed using as an etching gas chlorine-based gas such as $Cl_2$, $BCl_3$, $SiCl_4$, or $CCl_4$, fluorine-based gas such as $CF_4$, $SF_6$, $NF_3$, and $CHF_3$, or $O_2$, though the invention is not limited to this. The etching may be performed by utilizing an atmospheric plasma using as an etching gas a mixed gas of $CF_4$ and $O_2$. Since the insulating film 1115 of the channel protective film is formed over the channel region in the island shape semiconductor film, the channel region is not damaged due to over etching in the etching step. Accordingly, a channel protected (channel stopper) TFT having stable characteristics and high mobility can be obtained without using a resist mask.

Further, a composition containing a third conductive material is discharged on the source and drain electrodes 1106, 1130, 1107 and 1140, thereby source and drain wirings 1121 to 1123 are formed. At this time, a wiring 1120 is formed simultaneously with the source and drain wirings 1121 to 1123. The wiring 1120 functions as a mask for forming a contact hole between a gate and a drain as well as a wiring between the gate and the drain.

The third conductive material, the conductive particle structure, discharge conditions, drying and baking conditions, and the like thereof may be arbitrarily selected from those for the first conductive material shown above. Note that the second conductive material and the third conductive material may have the same particle structure or different particle structures. A pixel electrode is desirably formed by a droplet discharge method using a transparent conductive film such as ITO, ITSO, ZnO, GZO, IZO, organic indium, and organotin.

Although not shown, pretreatment for increasing the adhesiveness with the bottom layer may be performed also in the formation of the source and drain wirings 1121 to 1123. This pretreatment may be performed similarly to the pretreatment in the formation of the gate electrode layers 1101 and 1102.

Next, the gate insulating film 1103 is etched to be removed using the wirings 1120 and 1122 as masks, thereby a contact hole is formed. In this embodiment, plasma etching is performed using as an etching gas chlorine-based gas such as $Cl_2$, $BCl_3$, $SiCl_4$, or $CCl_4$, fluorine-based gas such as $CF_4$, $SF_6$, $NF_3$, and $CHF_3$, or $O_2$, though the invention is not limited to this. The etching may be performed by utilizing an atmospheric plasma. Then, a composition containing a fourth conductive material is discharged to fill the contact hole, and a conductor 1125 for connecting the gate and the drain is formed. The fourth conductive material, the conductive particle structure, discharge conditions, drying and baking conditions, and the like thereof may be arbitrarily selected from those for the first conductive material shown above. Note that the third conductive material and the fourth conductive material may have the same particle structure or different particle structures.

Although not shown, a passivation film is desirably formed over the source and drain wirings 1121 to 1123 in order to prevent diffusion of impurities from above the TFT. The passivation film may be formed of silicon nitride, silicon oxide, silicon nitride oxide, silicon oxynitride, aluminum oxynitride, aluminum oxide, diamond like carbon (DLC), carbon nitride (CN), or other insulating materials by a thin film forming method such as plasma CVD and sputtering. Instead, the same material as that of the channel protective film may be used, or a stack of these materials may also be used. Alternatively, the passivation film may be formed by discharging a composition containing insulating material particles by a droplet discharge method.

Subsequently, a liquid repellent material 1162 is formed over the source and drain electrodes of the TFT by a droplet discharge method, spin coating, slit coating, spray coating or the like. Then, a mask 1163 formed of PVA, polyimide or the like is formed in an area in which a contact hole is to be formed (see FIG. 11A). The liquid repellent material 1162 may be formed of a fluorine-based silane coupling agent such as FAS (fluoroalkyl silane). The mask 1163 may be formed by selectively discharging PVA, polyimide or the like by a droplet discharge method.

Figure 11B:
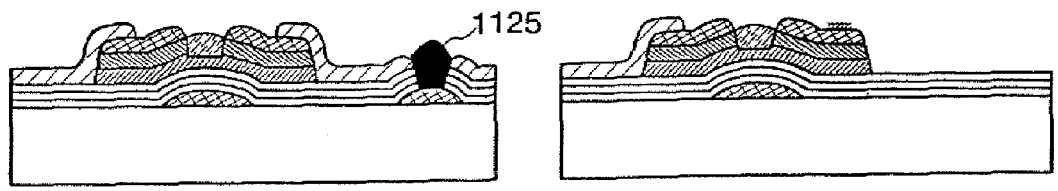
Figure 11C:
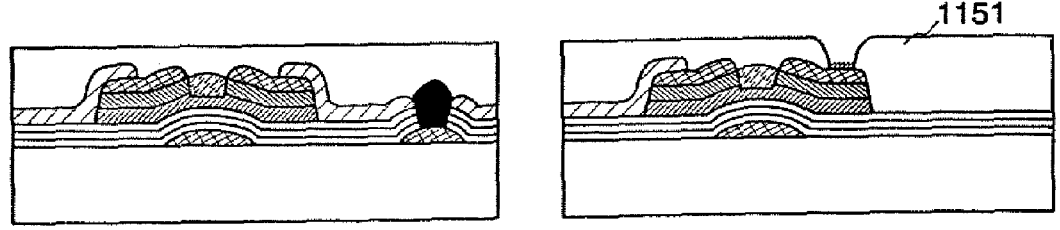

The liquid repellent material 1162 is removed using the mask 1163 of PVA or the like (FIG. 11B). The liquid repellent material 1162 may be removed by $O_2$ ashing or atmospheric pressure plasma. The mask 1163 is removed thereafter by water washing in the case of PVA, or by the N300 stripper or the like in the case of polyimide.

A planarizing film 1151 is formed by a droplet discharge method, spin coating or the like while leaving the liquid repellent material 1162 in an area in which the contact hole is to be formed (FIG. 1C). At this time, the planarizing film 1151 is not formed over the area in which a contact hole is to be formed since the liquid repellent material 1162 is applied thereon. In addition, the contact hole is not inverted tapered. It is preferable that the planarizing film 1151 is selectively formed by a droplet discharge method using an organic resin such as acryl, polyimide and polyamide, or an insulating film containing a siloxane-based material and including a Si—O bond and a Si—$CH_x$ bond. After forming the planarizing film 1151, the liquid repellent material 1162 is removed by $O_2$ ashing or atmospheric pressure plasma. In the case where a passivation film is provided, it is removed as well.

Figure 11D:
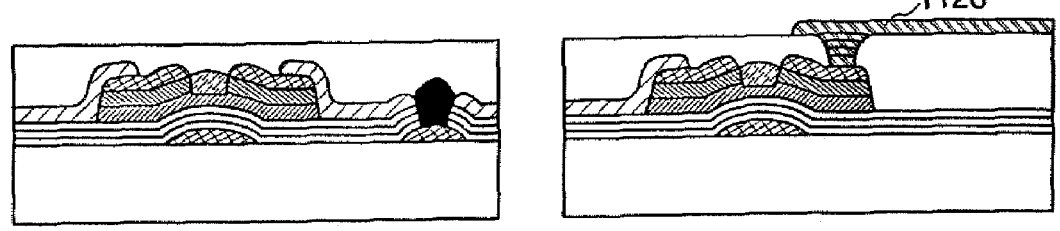

A pixel electrode 1126 connected to the source electrode or the drain electrode through the contact hole is formed over the planarizing film 1151 by a droplet discharge method (FIG. 11D). The material of the pixel electrode 1126 is selected from a transparent conductive material such as ITO and ITSO or a reflective conductive material such as MgAg depending on whether the pixel electrode 1126 transmits light or not. In the case of the pixel electrode 1126 being formed of ITO or ITSO, luminous efficiency can be improved by forming a barrier film 1150 formed of a silicon nitride film.

A bank 1127 formed of an organic resin film or an inorganic insulating film is selectively formed over the pixel electrode 1126 by a droplet discharge method. The bank 1127 is desirably formed of a heat resistant resin such as siloxane or a resin such as polyimide and acryl. Especially when siloxane is used, the subsequent vacuum baking can be performed at a high temperature, thereby moisture adversely affecting an EL element can be removed sufficiently. Note that the bank 1127 is selectively formed to have an opening in which the pixel electrode 1126 is exposed. This opening may be formed by using the forming method of a contact hole according to the invention.

An organic compound layer 1128 (electro luminescent layer) is formed so as to be in contact with the pixel electrode 1126 in the opening of the bank 1127. The organic compound layer 1128 may have a single layer structure or a multi-layer structure. In the case of a multi-layer structure, each layer is stacked over a semiconductor element (pixel electrode) in such an order: (1) an anode, a hole injection layer, a hole transporting layer, a light emitting layer, an electron transporting layer, and a cathode; (2) an anode, a hole injection layer, a light emitting layer, an electron transporting layer, and a cathode; (3) an anode, a hole injection layer, a hole transporting layer, a light emitting layer, an electron transporting layer, an electron injection layer, and a cathode; (4) an anode, a hole injection layer, a hole transporting layer, a light emitting layer, a hole blocking layer, an electron transporting layer, and a cathode; or (5) an anode, a hole injection layer, a hole transporting layer, a light emitting layer, a hole blocking layer, an electron transporting layer, an electron injection layer, and a cathode. Such a structure is a so-called forward staggered structure, and the pixel electrode 1126 functions as an anode. On the other hand, a structure in which a cathode is disposed closer to a semiconductor element (pixel electrode) than an anode is called an inverted staggered structure, and the pixel electrode 1126 functions as a cathode.

In the case of a forward staggered structure, an electron injection electrode 1129 (cathode) is formed so as to cover the organic compound layer 1128. Meanwhile, an anode is formed in the case of an inverted staggered structure. The electron injection electrode 1129 may be formed of a known material with low work function such as Ca, Al, CaF, MgAg, and AlLi. An overlapping area of the hole injection electrode (pixel electrode) 1126, the organic compound layer 1128 and the electron injection electrode 1129 in the opening of the bank 1127 corresponds to a light emitting element (FIG. 11E).

Figure 11E:
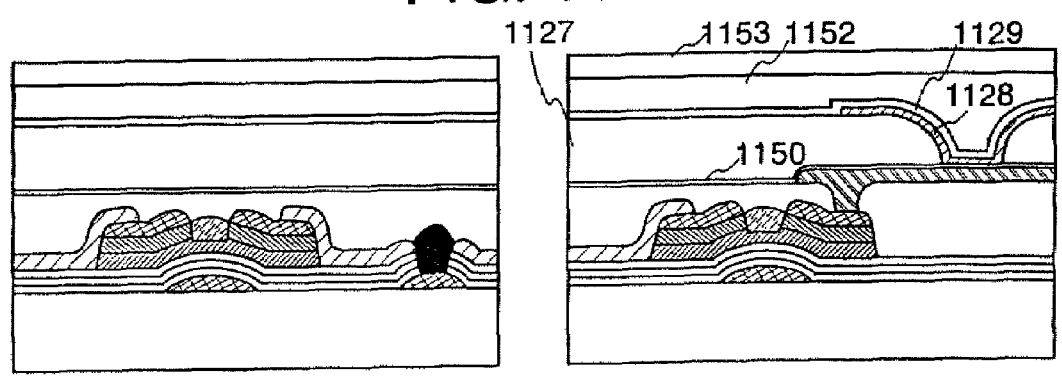

Practically, the element completed up to the state shown in FIG. 11E is preferably packaged (scaled) with an airtight protective film with little degasification (laminate film, UV curable resin film or the like) in order not to be exposed to the outside air. In this embodiment, the element is scaled with a sealing substrate 1153 with an insulator 1152 interposed therebetween.

Through the aforementioned steps, an EL light emitting device is completed. Note that the structure of a TFT used in the EL light emitting device is not limited to the one shown in this embodiment.

Figure 12A:
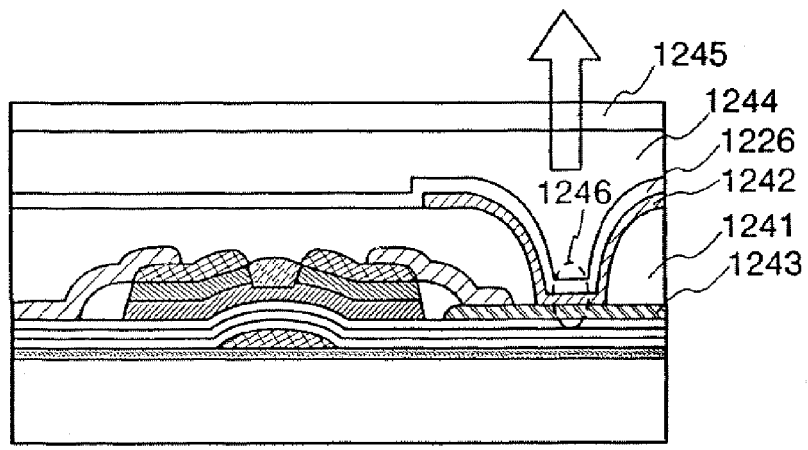
FIGS. 12A to 12C are views respectively showing top emission, bottom emission and dual emission light emitting devices.
Figure 12B:
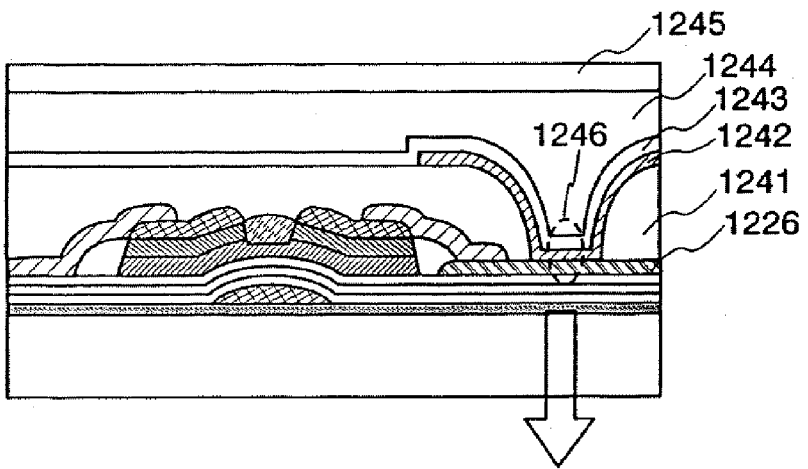
Figure 12C:
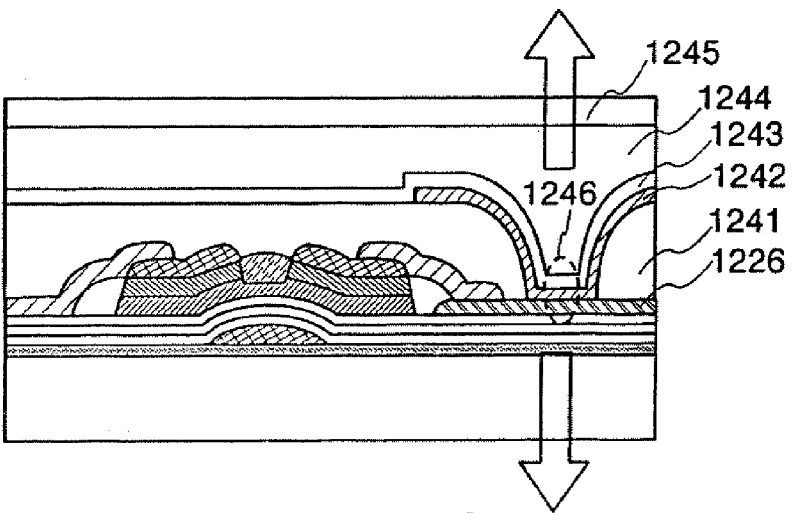

The EL light emitting device of this embodiment can be applied to each of a top emission light emitting device shown in FIG. 12A, a bottom emission light emitting device shown in FIG. 12B, and a dual emission light emitting device shown in FIG. 12C.

First, a dual emission light emitting device is described. In that case, a hole injection electrode 1226 may be formed of a transparent conductive film such as ITO, ITSO, ZnO, IZO, and GZO. When ITSO is used as the anode (hole injection electrode) 1226, an ITSO layer containing silicon oxide with different concentration may be stacked. More preferably, ITSO on the bottom layer (source or drain wiring side) contains silicon oxide with low concentration, whereas ITSO on the upper layer (light emitting layer side) contains silicon oxide with high concentration. According to this, the efficiency of hole injection into an EL layer can be improved while maintaining low resistance of the connection with a AFT. Needless to say, the anode 1226 may be multi-layers of ITSO and other materials (e.g., a multi-layer structure of ITO on the bottom layer and ITSO on the upper layer), or multi-layers of other materials.

Meanwhile, a thin aluminum film, an aluminum film containing a minute amount of Li, or the like with a thickness of 1 to 10 nm is used for a cathode 1243 in order to transmit light from a light emitting layer. Thus, a dual emission light emitting device in which light from a light emitting element 1246 can be emitted to the top and bottom sides can be obtained (FIG. 12C). Note that reference numeral 1245, 1241, 1242 and 1244 denote a scaling substrate, a bank, an organic compound layer and an insulator respectively.

Even when the cathode 1243 is formed of the same material as that of the anode 1226, namely a transparent conductive film such as no and ITSO, a dual emission light emitting device can be obtained. In that case, the transparent conductive film may be a film containing silicon or silicon oxide, or may be multi-layers thereof.

Next, a top emission light emitting device is described with reference to FIG. 12A. In general, a top emission light emitting device in which light from the light emitting element can be emitted to the opposite side of the substrate (a top side) can be obtained by replacing the anode (hole injection electrode) 1226 and the cathode (electron injection electrode) 1243 in a bottom emission type shown in FIG. 12B with each other, stacking the organic compound layer in reverse, and reversing the polarity of the current control TFT (an n-channel TFT herein). In the case where the electrodes and the organic compound layer are stacked in reverse as shown in FIG. 12A, a multi-layer structure of light transmitting conductive oxide layers each containing silicon oxide with different concentration is used as the hole injection electrode 1226. Accordingly, a light emitting device with high stability can be obtained due to the advantageous effects such as improvements in luminous efficiency and low power consumption. Here, a reflective metal electrode or the like may be used as the electron injection electrode (cathode) 1243.

Note that a top emission light emitting device can be obtained without exchanging the hole injection electrode 1226 and the electron injection electrode 1243 in the bottom emission type shown in FIG. 12B by applying a transparent conductive film such as ITO and ITSO to the electron injection electrode (cathode) 1243. The transparent conductive film used for the cathode may be a film containing silicon or silicon oxide, or may be multi-layers thereof.

This embodiment can be implemented in combination with other embodiment modes and embodiments.

EMBODIMENT 2

Figure 13:
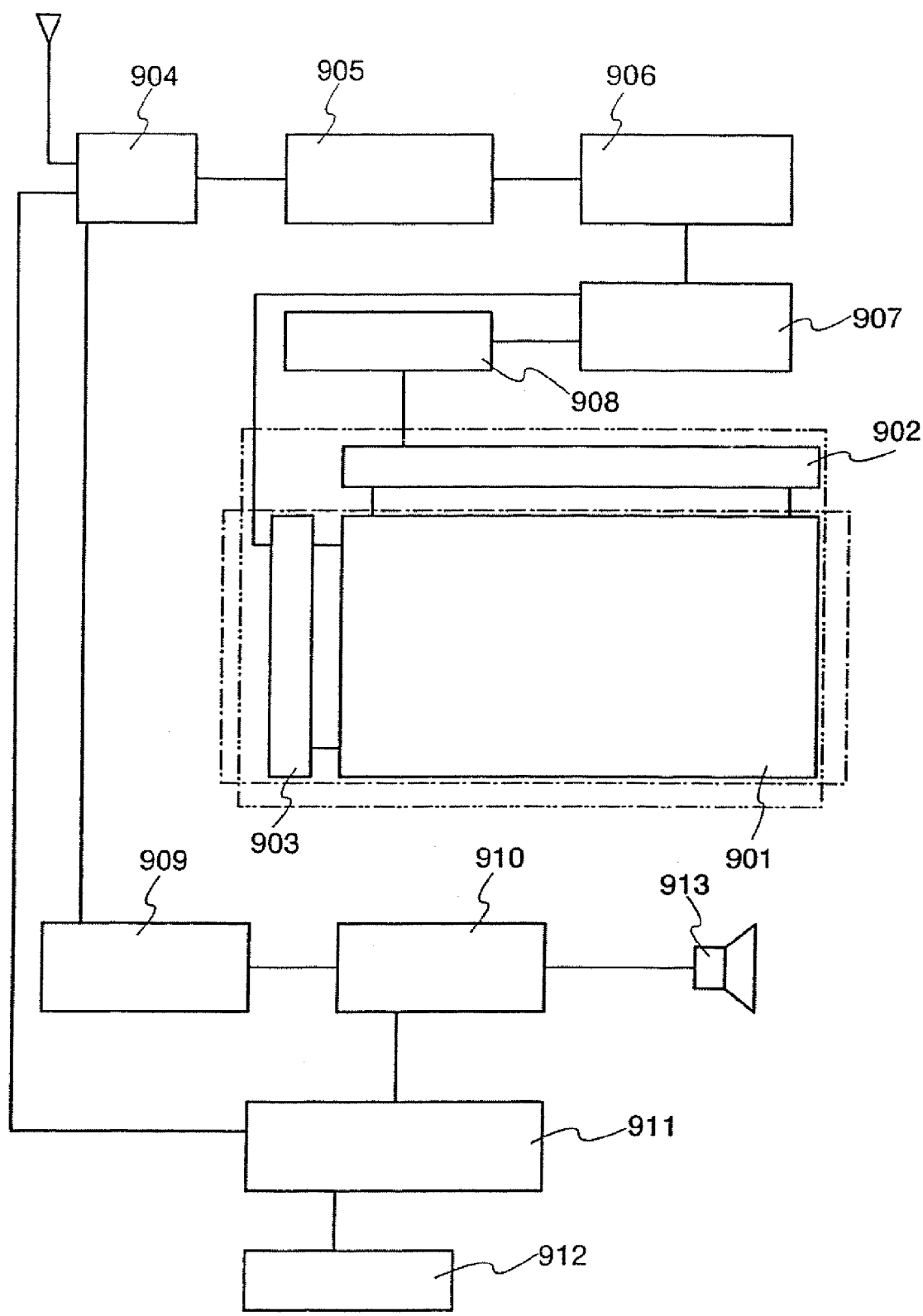
FIG. 13 is a block diagram showing the main configuration of an EL TV set using the invention.

An EL TV set can be completed using an EL display module manufactured according to Embodiment 1. FIG. 13 is a block diagram showing the main configuration of an EL TV set. The invention can be applied to any kind of EL display panel: a display panel in which only a pixel portion is formed over the display panel, and a scan line driver circuit 903 and a signal line driver circuit 902 are mounted thereto by TAB; a display panel in which a pixel portion as well as the scan line driver circuit 903 and the signal line driver circuit 902 at the periphery thereof are mounted over the display panel by COG; and a display panel in which a pixel portion and the scan line driver circuit 903 are integrally formed over a substrate by using mm formed of SAS, and the signal line driver circuit 902 is mounted thereto as a driver IC. Note that reference numeral 901 denotes an EL display panel.

Other external circuits include, at a video signal input side, a video signal amplifier circuit 905 for amplifying a video signal received by a tuner 904, a video signal processing circuit 906 for converting the amplified signal into a color signal corresponding to each color of red, green and blue, a control circuit 907 for converting the video signal so as to be inputted to a driver IC, and the like. The control circuit 907 outputs a signal to each of the scan line side and the signal line side. In the case where the EL display module is driven in a digital manner, a configuration in which an input digital signal is divided into m signals to be supplied may be adopted by providing a signal divider circuit 908 in the signal line side.

An audio signal received by the tuner 904 is transmitted to an audio signal amplifier circuit 909, an output of which is supplied to a speaker 913 through an audio signal processing circuit 910. A control circuit 911 receives receiving station (received frequency) data and volume control data from an input portion 912, and transmits the signals to the tuner 904 or the audio signal processing circuit 910.

Figure 25A:
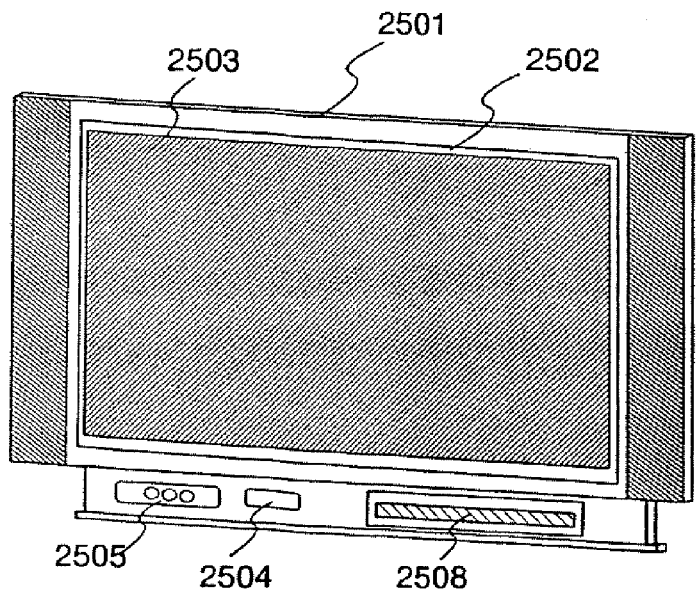
FIGS. 25A to 25C are views showing examples of an electronic apparatus using the invention.

By incorporating the EL module including such external circuits into a housing, a TV set as shown in FIG. 25A can be completed. The TV set includes a display screen structured by the EL display module, a speaker, an operating switch and the like. In this manner, a TV set can be completed according to the invention.

It is needless to say that the invention can be applied to various apparatuses other than the TV set, such as a monitor of a personal computer, and in particular a large display medium such as an information display panel in the station or the airport, and an advertisement board on the street.

EMBODIMENT 3

In this embodiment, a manufacturing method of an active matrix liquid crystal display device according to the invention is described with reference to FIG. 14 and FIGS. 15A to 15C.

Figure 14:
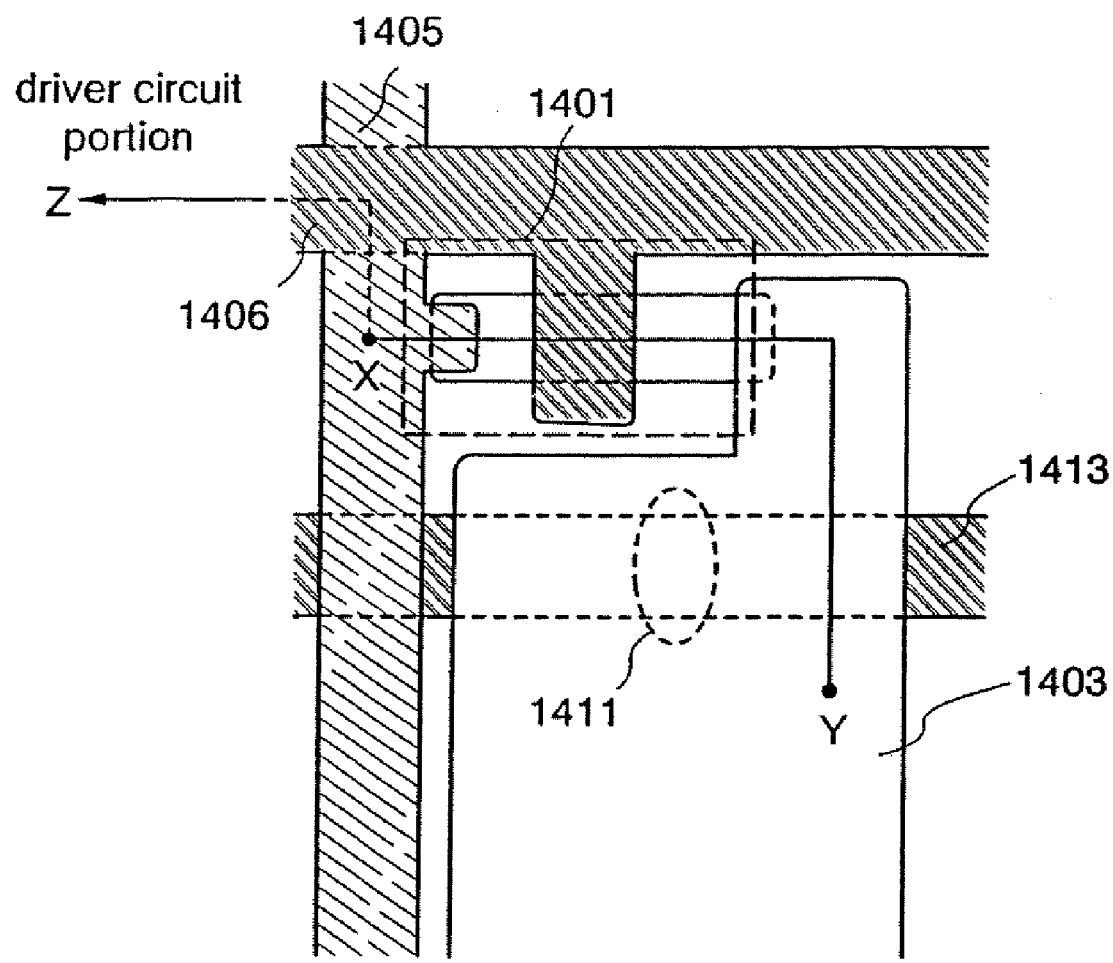
FIG. 14 is a top plan view of a pixel of a liquid crystal display device according to the invention.

FIG. 14 is a top plan view of one pixel of a liquid crystal display device. Reference numeral 1401 denotes a switching TFT that controls ON/OFF of a current flowing to the pixel. In this embodiment, a single gate TFT is adopted, however the invention is not limited to this. A multi-gate TFT may be adopted. Reference numeral 1405 denotes a source or drain wiring (also called a 2nd wiring, a 2nd metal or the like) whereas 1413 denotes a capacitor wiring, and a capacitor 1411 is formed between the capacitor wiring 1413 and a pixel electrode 1403. Note that the position of the capacitor 1411 is not limited to the area shown here. Reference numeral 1406 denotes a gate wiring.

A liquid crystal display device and a manufacturing method thereof according to the invention are described with reference to FIGS. 15A to 15C. FIGS. 15A to 15C show cross sectional structures along a line Z-X (driving TFT side) and a line X-Y (switching TFT side) of FIG. 14.

The structure and manufacturing method of a TFT shown in FIGS. 15A to 15C are similar to those shown in Embodiment 1 (see FIG. 11A). Note that in this embodiment, a terminal wiring 1540 is formed simultaneously with gate electrode layers 1501 and 1502. A gate insulating film 1503 at the terminal is removed using a metal mask 1541, thereby a contact hole is formed. The contact hole is filled with a conductor to form a terminal electrode 1542. Needless to say, the contact hole may be formed according to the invention.

Although not shown, a passivation film is desirably formed over the source and drain wirings in order to prevent diffusion of impurities from above the TFT. The passivation film may be formed of silicon nitride, silicon oxide, silicon nitride oxide, silicon oxynitride, aluminum oxynitride, aluminum oxide, diamond like carbon (DLC), carbon nitride (CN), or other insulating materials by a thin film forming method such as plasma CVD and sputtering. Instead, the same material as that of the channel protective film may be used, or a stack of these materials may also be used. Alternatively, the passivation film may be formed by discharging a composition containing insulating material particles by a droplet discharge method.

Subsequently, a liquid repellent material is formed over the source and drain electrodes of the TFT by a droplet discharge method, spin coating, slit coating, spray coating or the like. Then, a mask formed of PVA, polyimide or the like is formed in an area in which a contact hole is to be formed. The liquid repellent material may be formed of a fluorine-based silane coupling agent such as FAS (fluoroalkyl silane). The mask may be formed by selectively discharging PVA, polyimide or the like by a droplet discharge method.

The liquid repellent material is removed using the mask of PVA or the like (FIG. 11B). The liquid repellent material may be removed by $O_2$ ashing or atmospheric pressure plasma. The mask is removed thereafter by water washing in the case of PVA, or by the N300 stripper or the like in the case of polyimide.

A planarizing film 1551 is formed by a droplet discharge method, spin coating, slit coating or the like while leaving the liquid repellent material in an area in which a contact hole is to be formed (FIG. 158). At this time, the planarizing film 1551 is not formed over the area in which a contact hole is to be formed since a liquid repellent material 1562 is applied thereon. In addition, the contact hole is not inverted tapered. It is preferable that the planarizing film 1551 is selectively formed by a droplet discharge method using an organic resin such as acryl, polyimide and polyamide, or an insulating film containing a siloxane-based material and including a Si—O bond and a Si—$CH_x$ bond. After forming the planarizing film 1551, the liquid repellent material 1562 is removed by $O_2$ ashing or atmospheric pressure plasma. In the case where a passivation film is provided, it is removed as well.

A pixel electrode 1526 connected to the source electrode or the drain electrode through the contact hole is formed over the planarizing film 1551 by a droplet discharge method. The material of the pixel electrode 1526 is selected from a transparent conductive material such as ITO and IMO or a reflective conductive material such as MgAg depending on whether the pixel electrode 1526 transmits light or not.

Then, a liquid crystal layer 1571 is disposed between a TFT substrate and a counter substrate 1574, and sealed with a sealing member 1576. A columnar spacer 1575 is formed over the TFT substrate in accordance with a depression of the contact portion on the pixel electrode 1526. The height of the columnar spacer 1575 is 3 to 10 µm, though it depends on a liquid crystal material to be used. The depression is formed in the contact portion depending on the contact hole. Thus, by forming the columnar spacer 1575 in the depression, misalignment of liquid crystal molecules can be prevented.

An alignment film 1570 is formed over the TFT substrate, and then rubbing treatment is performed. A transparent conductive film 1573 and an alignment film 1572 are formed over the counter substrate 1574. Subsequently, the TFT substrate and the counter substrate 1574 art attached to each other with the sealing member 1576, and a liquid crystal is injected therein to form the liquid crystal layer 1571. In such a manner, an active matrix liquid crystal display device can be completed.

Figure 16:
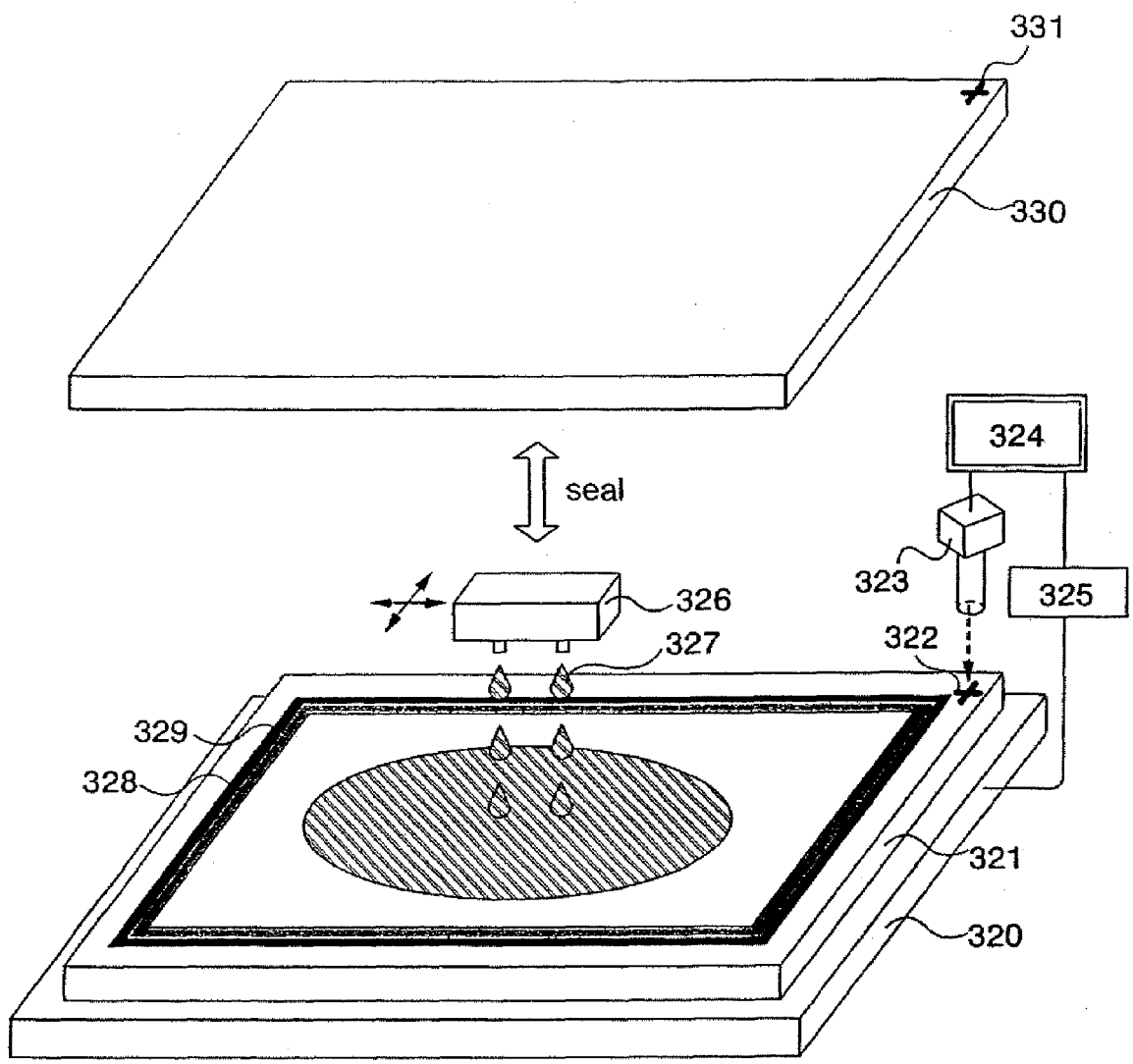
FIG. 16 is a view showing a droplet discharge system.

The liquid crystal layer 1571 can be formed by dip coating (pumping up method) in which after both of the substrates are attached to each other with the sealing member, one side provided with a liquid crystal injection opening of the attached substrate (cell) is soaked in liquid crystals to inject the liquid crystal into the inside of the cell by capillary phenomenon. Alternatively, the liquid crystal layer 1571 can be formed by so-called liquid crystal discharging as shown in FIG. 16, in which liquid crystals are discharged from a nozzle (dispenser) 326 over a substrate 321 provided with a sealing member 328 and a barrier layer 329, and then a counter substrate 330 is attached to the substrate 321. In particular, the liquid crystal discharging is effective in the case of a large substrate being use. The barrier layer 329 shown in FIG. 16 is provided for preventing chemical reaction between a liquid crystal molecule 327 and the sealing member 328. In the case where both of the substrates are attached to each other, an alignment marker 322 or 331 is detected by an imaging means 323, and a stage 320 provided with both of the substrates is controlled through a CPU 324 and a controller 325.

Subsequently, a FPC (Flexible Printed Circuit) 1544 is attached to the terminal electrode 1542 with an anisotropic conductive film 1543 by a known method. The terminal electrode 1542 is desirably formed of a transparent conductive film and connected to the wiring 1540 that is formed simultaneously with the gate electrode.

Through the aforementioned steps, an active matrix LCD substrate including a pixel portion 654, a driver circuit portion 653 and a terminal portion 652 is completed (FIG. 15C). Note that reference numeral 1500, 1510, 1511 to 1514 denote a substrate, an insulating film, source and drain electrodes respectively. Further, reference numeral 1516 and 1518 denote island shape semiconductor films. The structure of a TFT used in the LCD substrate is not limited to the one shown in this embodiment. Note that this embodiment can be implemented in combination with other embodiment modes and embodiments.

EMBODIMENT 4

Figure 17:
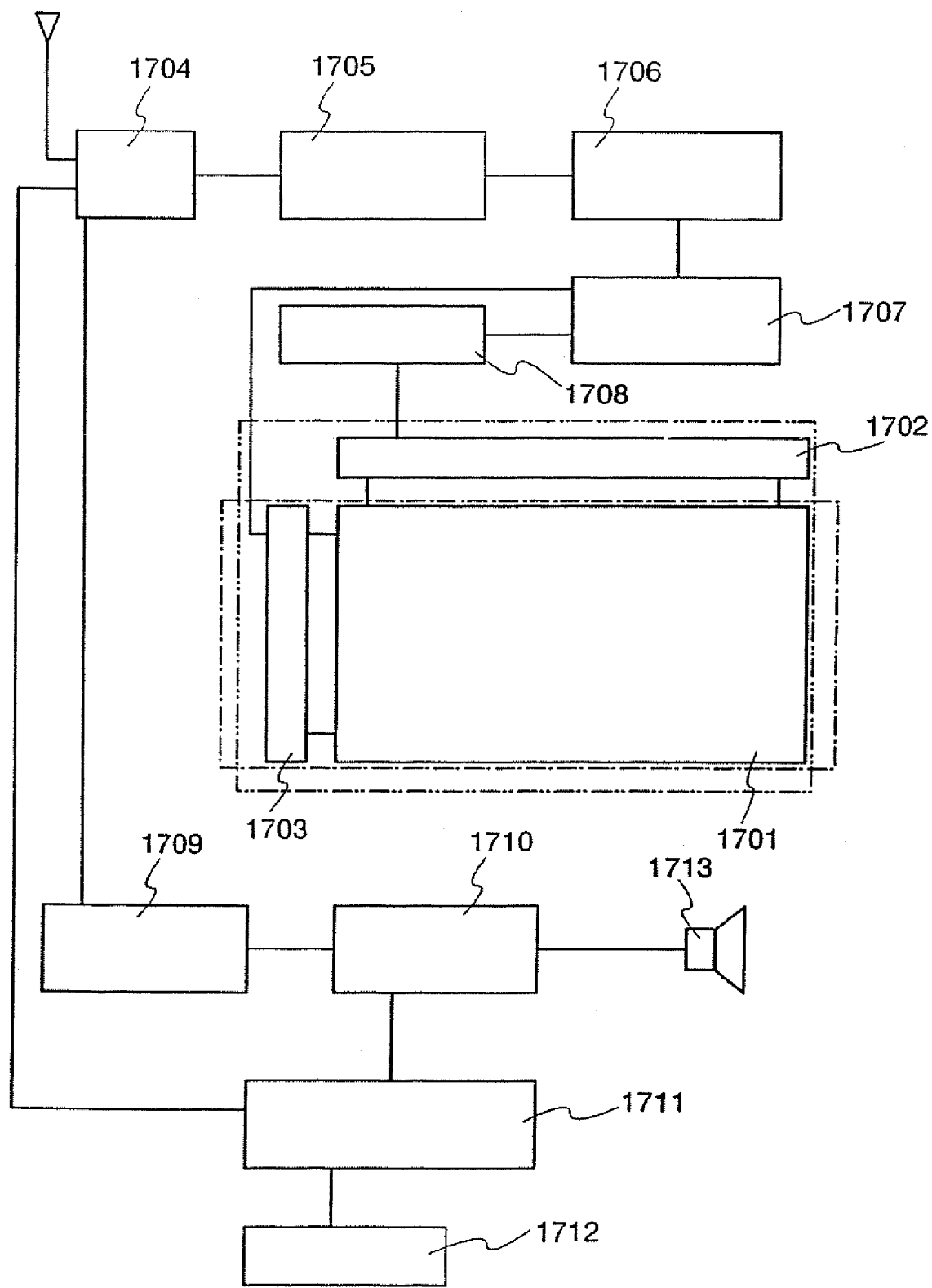
FIG. 17 is a block diagram showing a main configuration of a liquid crystal TV set using the invention.

A liquid crystal TV set can be completed using a liquid crystal display panel manufactured according to Embodiment 3. FIG. 17 is a block diagram showing the main configuration of a liquid crystal TV set. The invention can be applied to any kind of a liquid crystal display panel 1701: a display panel in which only a pixel portion is formed over the display panel, and a scan line driver circuit 1703 and a signal line driver circuit 1702 are mounted thereto by TAB; a display panel in which a pixel portion as well as the scan line driver circuit 1703 and the signal line driver circuit 1702 at the periphery thereof are mounted over the display panel by COG; and a display panel in which a pixel portion and the scan line driver circuit 1703 are integrally formed over a substrate by using TFTs formed of SAS, and the signal line driver circuit 1702 is mounted thereto as a driver IC.

Other external circuits include, at a video signal input side, a video signal amplifier circuit 1705 for amplifying a video signal received by a tuner 1704, a video signal processing circuit 1706 for converting the amplified signal into a color signal corresponding to each color of red, green and blue, a control circuit 1707 for converting the video signal so as to be inputted to a driver IC, and the like. The control circuit 1707 outputs a signal to each of the scan line side and the signal line side. In the case where the liquid crystal display panel is driven in a digital manner, a configuration in which an input digital signal is divided into m signals to be supplied may be adopted by providing a signal divider circuit 1708 in the signal line side.

An audio signal received by the tuner 1704 is transmitted to an audio signal amplifier circuit 1709, an output of which is supplied to a speaker 1713 through an audio signal processing circuit 1710. A control circuit 1711 receives receiving station (received frequency) data and volume control data from an input portion 1712, and transmits the signals to the tuner 1704 or the audio signal processing circuit 1710.

By incorporating such a liquid crystal module into a housing, a TV set as shown in FIG. 25A can be completed. It is needless to say that the invention can be applied to various apparatuses other than the TV set, such as a monitor of a personal computer, and in particular a large display medium such as an information display panel in the station or the airport, and an advertisement board on the street.

EMBODIMENT 5

In this embodiment, modularization of the EL display panel or LCD panel of the aforementioned embodiment is described with reference to FIGS. 18A and 18B.

Figure 18A:
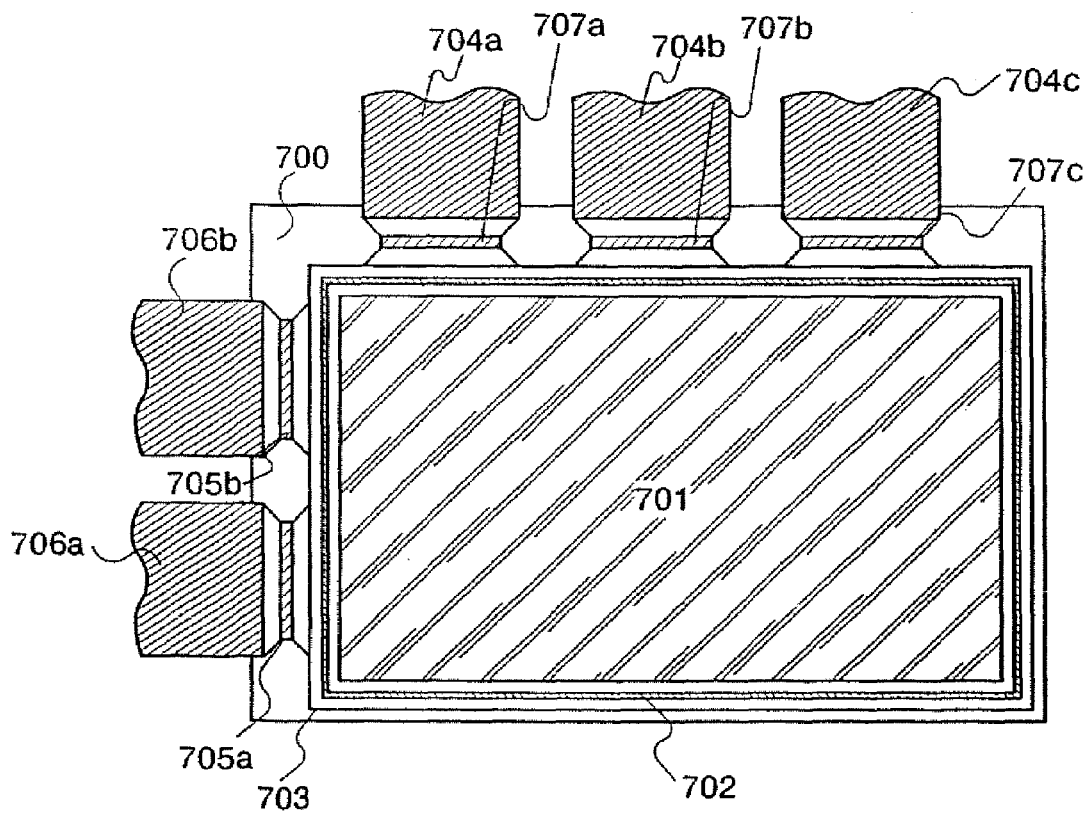

In a module shown in FIG. 18A, driver ICs including driver circuits are formed at the periphery of a pixel portion 701 by COG (Chip On Glass). It is needless to say that the driver ICs may be mounted by TAB (Tape Automated Boding).

A substrate 700 is attached to a counter substrate 703 with a sealing member 702. The pixel portion 701 may utilize a liquid crystal as a display medium as shown in Embodiments 3 and 4, or may utilize an EL element as a display medium as shown in Embodiments 1 and 2. An integrated circuit formed of a single crystalline semiconductor or a polycrystalline semiconductor may be used as driver ICs 705a and 705b and driver ICs 707a, 707b and 707c. The driver ICs 705a and 705b and driver ICs 707a, 707b and 707c are supplied with a signal or a power source through FPCs 706a and 706b and FPCs 704a, 704b and 704c, respectively.

Figure 18B:
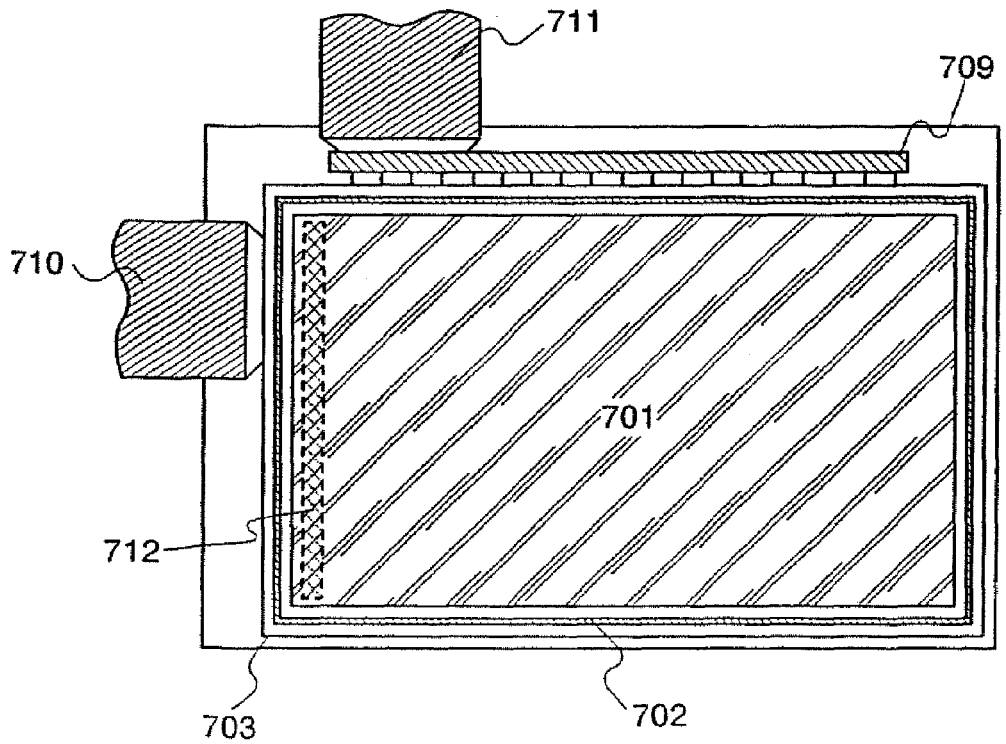

In a module shown in FIG. 18B, a gate driver 712 is integrally formed over the substrate 700 and connected to an FPC 710. The gate driver 712 is desirably formed of a semi-amorphous silicon (SAS) with high mobility. A source driver 709 is formed separately using polycrystalline silicon, attached to the substrate 700 after being cut into a stick shape, and connected to an FPC 711. The gate driver 712 may also be formed separately using polycrystalline silicon and attached after being cut into a stick shape. When the driver portion (driver circuit portion) is formed over the substrate integrally or attached after being cut into a stick shape, manufacturing steps can be simplified as compared with in the case of attaching a number of IC chips, and the substrate area can be used efficiently.

This embodiment can be implemented in combination with other embodiment modes and embodiments.

EMBODIMENT 6

Described in this embodiment is the case in which a scan line driver circuit is formed over a substrate 100 by using a semiconductor layer formed of SAS.

Figure 19:
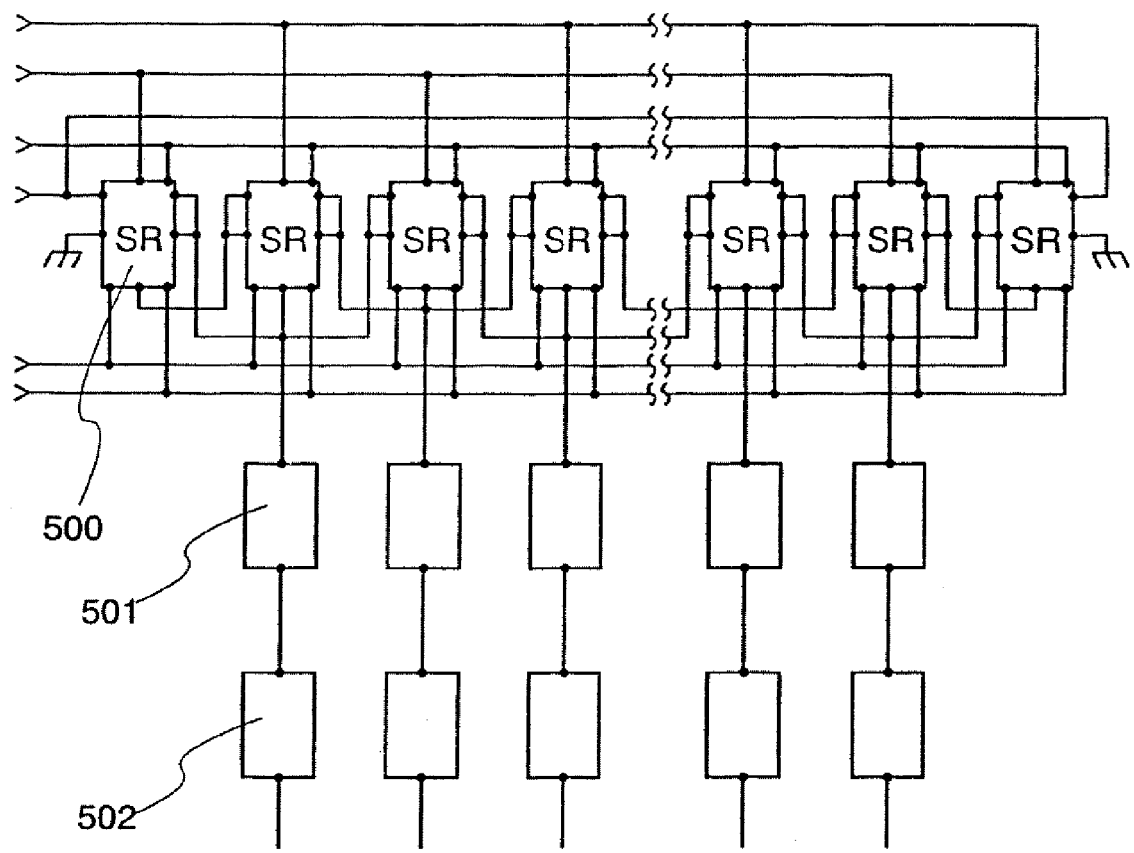
FIG. 19 is a view showing a modularized display panel using the invention.

FIG. 19 is a block diagram showing a scan line driver circuit structured by N-channel TFTs using SAS with a field effect mobility of 1 to 15 $cm^2/V \cdot sec$.

In FIG. 19, a block denoted by 500 corresponds to a pulse output circuit for outputting one stage of sampling pulses, and a shift register is constituted by a pulse output circuits. Reference numeral 501 denotes a buffer circuit to which a pixel 502 is connected.

Figure 20:
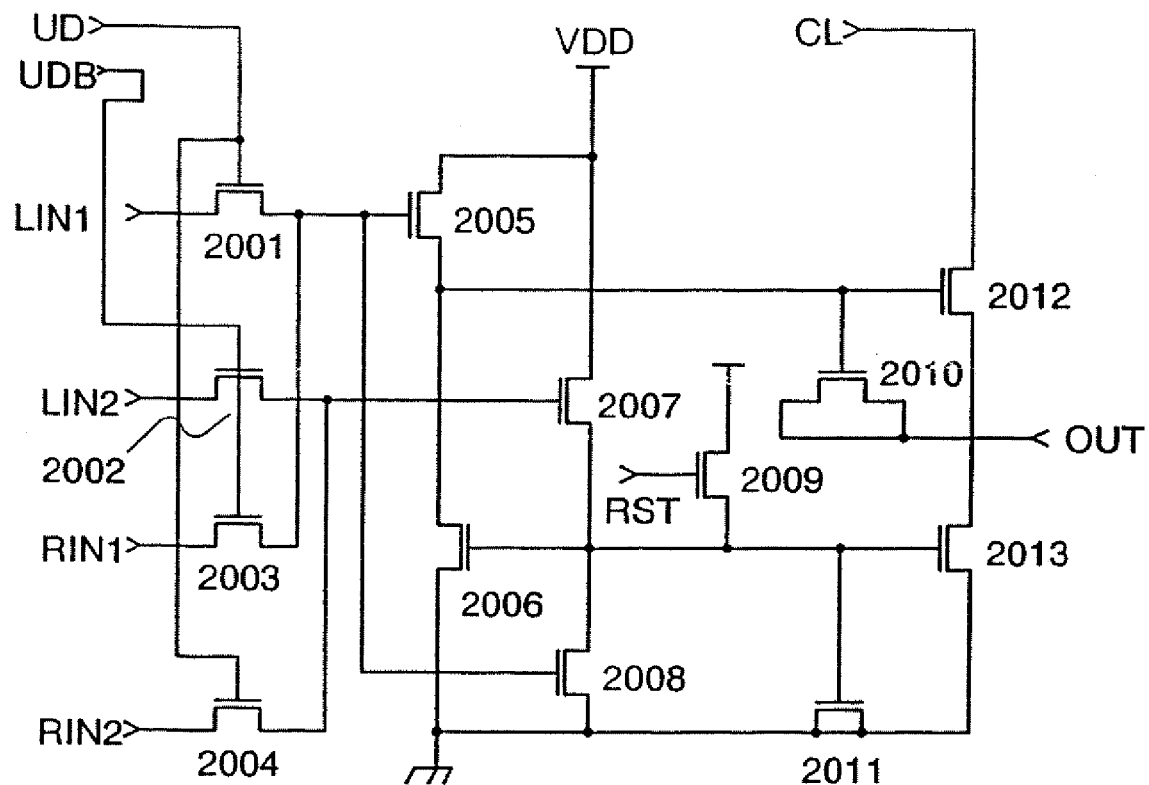
FIG. 20 is a circuit diagram showing the case in which a scan line driver circuit of a display panel using the invention is structured by TFT (a pulse output circuit).

FIG. 20 shows a specific configuration of the pulse output circuit 500, which includes N-channel TFTs 2001 to 2013. The size of each TFT may be set in view of the operating characteristics of an N-channel TFT using SAS. For example, when the channel length is 8 μm, the channel width may be set at 10 to 80 μm.

Figure 21:
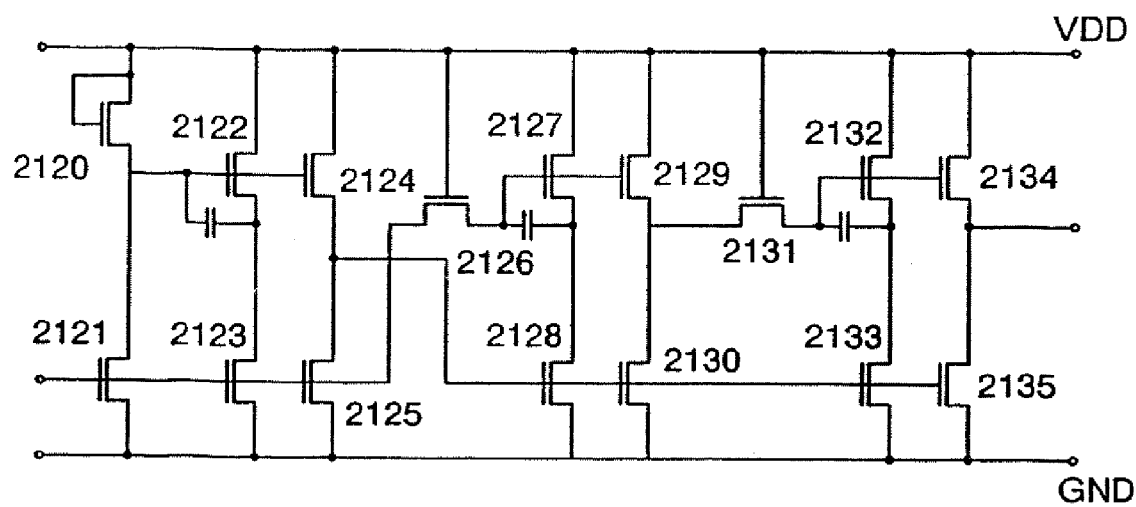
FIG. 21 is a circuit diagram showing the case in which a scan line driver circuit of a display panel using the invention is structured by TFT (a buffer circuit).

FIG. 21 shows a specific configuration of the buffer circuit 501, which also includes N-channel TFTs 2120 to 2135. The size of each TFT may be set in view of the operating characteristics of an N-channel TFT using SAS. For example, when the channel length is 10 μm, the channel width may be set at 10 to 1800 μm.

This embodiment can be implemented in combination with other embodiment modes and embodiments.

EMBODIMENT 7

Figure 24:
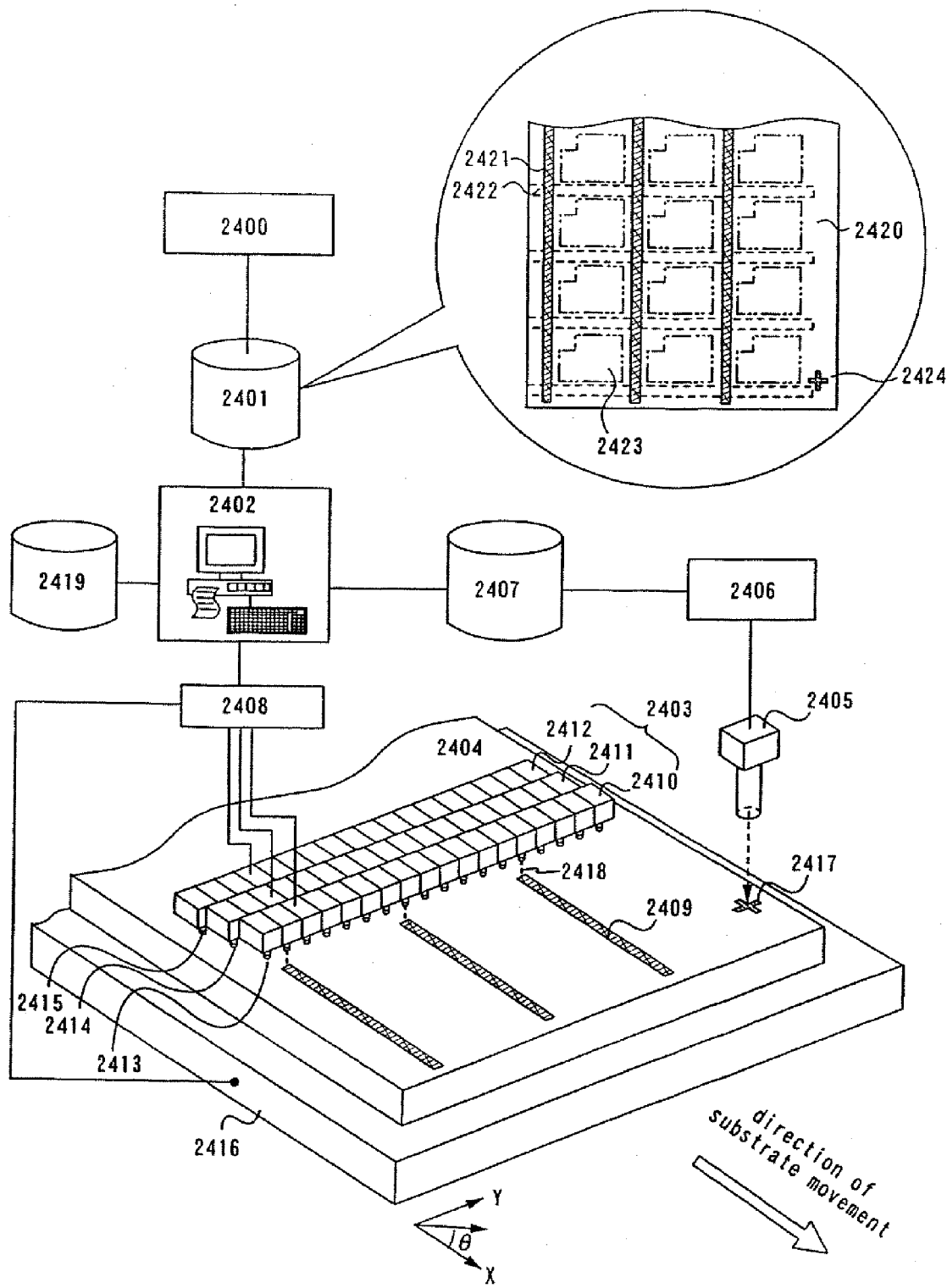
FIG. 24 is a view showing a droplet discharge system.

A liquid crystal display device according to the invention may be formed by a droplet discharge system as shown in FIG. 24. First, circuit design is performed using a circuit design tool 2400 such as CAD, CAM and CAE, thereby desired thin film and position of an alignment marker are determined.

Next, a thin film pattern data 2401 including the designed thin film and the position of an alignment marker is inputted to a computer 2402 for controlling a droplet discharge apparatus through recording medium or information network such as LAN (Local Area Network). In accordance with the thin film pattern data 2401, a nozzle having an optimum orifice that stores a composition containing a material of the thin film or is connected to a tank storing the composition is determined among nozzles (cylindrical device with a small orifice for ejecting liquid or gas) of a droplet discharge means 2403, and then a scanning path (movement path) of the droplet discharge means 2403 is determined. In the case of an optimum nozzle being determined in advance, the movement path of the nozzle only is required to be determined.

By photolithography or laser irradiation, an alignment marker 2417 is formed on a substrate 2404 on which the thin film is to be formed. Then, the substrate provided with the alignment marker 2417 is disposed on a stage 2416 in the droplet discharge apparatus, the position of the alignment marker 2417 is detected by an imaging means 2405 of the apparatus, and the detected data is inputted to the computer 2402 as positional information 2407 through an image processing apparatus 2406. The computer 2402 compares the thin film pattern data 2401 designed by CAD or the like with the positional information 2407 of the alignment marker 2417 detected by the imaging means 2405, and aligns the substrate 2404 and the droplet discharge means 2403.

Subsequently, a composition 2418 is discharged by the droplet discharge means 2403 controlled by a controller 2408 in accordance with the determined scanning path, thereby a desired thin film pattern 2409 is formed. The discharge amount of the composition can be arbitrarily controlled by selecting the diameter of the orifice. However, the discharge amount changes slightly with other conditions such as the movement speed of the orifice, the distance between the orifice and the substrate, the discharge speed of the composition, atmosphere in a discharge space, and temperature and humidity in the space. Therefore, these conditions can also be desirably controlled. It is desirable that these conditions be compiled into a database 2419 for each material of the composition by obtaining optimum conditions through experiments and evaluations in advance.

The thin film pattern data 2401 includes, for example, a circuit diagram or the like of an active matrix TFT substrate used in a liquid crystal display device, an EL display device or the like. A circuit diagram in a circle of FIG. 24 schematically shows a conductive film used for such an active matrix TFT substrate. Reference numeral 2421 denotes a so-called gate wiring, 2422 denotes a source signal line (2nd wiring), and 2423 denotes a pixel electrode, a hole injection electrode or an electron injection electrode. Reference numeral 2420 denotes a substrate and 2424 denotes an alignment marker. Needless to say, the thin film pattern 2409 corresponds to the gate wiring 2421 included in the thin film pattern data 2401.

The droplet discharge means 2403 has nozzles 2410, 2411 and 2412 that are integrally formed, though the invention is not limited to such a structure. Each of the nozzles 2410, 2411 and 2412 includes a plurality of orifices 2413, 2414 and 2415 respectively. The thin film pattern 2409 is formed by selecting the predetermined orifice 2413 of the nozzle 2410.

The droplet discharge means 2403 desirably includes a plurality of nozzles having different diameter of orifice, discharge amount and nozzle pitch, so that a thin film pattern of any line width can be formed and tact time can be reduced. Further, it is desirable that the distance between adjacent orifices is as small as possible. In addition, each nozzle desirably has a length of 1 m or more for discharging with high throughput on a large substrate having a side of 1 m or more. The nozzle may be elasticated so as to control the distance between adjacent orifices. Moreover, it is desirable that a nozzle or a head is set obliquely in order to achieve high resolution, that is to draw a pattern smoothly. According to this, a large-area pattern such as a rectangular pattern can be drawn.

It is also possible to provide another head with a different nozzle pitch in parallel with one head. In that case, the diameter of each orifice may be the same or different.

In the case where the droplet discharge apparatus has a plurality of nozzles as described above, a standby chamber for storing a nozzle that is not in use is required to be provided. When a gas supply means and a shower head are provided in the standby chamber, the nozzle can be placed under the same atmosphere of a gas as the solvent in the composition, therefore, drying can be prevented to a certain degree. Further, it is possible to provide a clean unit or the like to supply purified air and reduce dust in an operating area.

In the case where the distance between adjacent orifices cannot be made small due to the specification of the nozzle, a nozzle pitch may preferably be designed to be integral times as large as the pixels of a display device. Accordingly, the composition can be discharged by moving the nozzle.

As the imaging means 2405, a camera such as CCD (Charge Coupled Device) for converting the light intensity into an electrical signal may be used.

According to the aforementioned method, the thin film pattern 2409 can be formed by fixing the stage 2416 on which is mounted the substrate 2404 and scanning the droplet discharge means 2403 along a determined path. Alternatively, the thin film pattern 2409 may be formed by fixing the droplet discharge means 2403 and transferring the stage 2416 in the direction of x, y and θ along a determined path based on the thin film pattern data 2401. At this time, in the case where the droplet discharge means 2403 has a plurality of nozzles, a nozzle having an optimum orifice that stores a composition containing a material of the thin film or is connected to a tank storing the composition is required to be determined.

According to the aforementioned method, the thin film pattern 2409 is formed by discharging droplet using only one predetermined orifice of the nozzle 2410. However, the composition may be discharged from a plurality of orifices in accordance with the line width or film thickness of a thin film to be formed.

Alternatively, a redundant function may be provided by using a plurality of nozzles. For example, when the discharge conditions are controlled so that a composition is discharged from the nozzle 2412 (or 2411) first and the identical composition is discharged from the nozzle 2410, the composition can be discharged from the nozzle 2410 even when the former nozzle 2412 has a problem such as clogging of the orifice. Therefore, at least broken wirings and the like can be prevented.

Alternatively, when the discharge conditions are controlled so that a composition is discharged from a plurality of nozzles each having an orifice with a different diameter, a planar thin film can be formed in a reduced tact time. This method is particularly suitable for the formation of a thin film such as a pixel electrode of an LCD, which requires planarity and has a large area to be discharged with a composition.

Further, when the discharge conditions are controlled so as to discharge a composition from a plurality of nozzles each having an orifice with a different diameter, a wiring pattern with different line widths can be formed at a time.

Further, when the discharge conditions are controlled so that a composition is discharged from a plurality of nozzles each having an orifice with a different diameter, the composition can be filled in an opening with high aspect ratio, which is provided in a part of an insulating film. According to such a method, voids (worm holes produced between the insulating film and a wiring) can be prevented, which enables the formation of a planarized wiring.

According to the aforementioned droplet discharge means that includes an input means for inputting thin film pattern data, a setting means for setting a movement path of a nozzle for discharging a composition containing a material of the thin film based on the data, an imaging means for detecting an alignment marker formed on a substrate, and a control means for controlling the movement path of the nozzle, the movement path of the nozzle or the substrate in droplet discharging can be controlled accurately. When a computer for controlling the droplet discharge means reads a control program of the composition discharge conditions, various conditions such as the movement speed of an orifice or a substrate, the discharge amount of a composition, the distance between the orifice and the substrate, the discharge speed of the composition, atmosphere, temperature and humidity in a discharge space, and a heating temperature of the substrate can be controlled accurately in accordance with a discharged composition or a pattern thereof.

Accordingly, a thin film or a wiring having a desired width, thickness and shape can be formed accurately in a desired area in a reduced tact time and with high throughput, which results in improved yield of an active element such as a TFT formed by using the thin film or the wiring, and a liquid crystal display (LCD), a light emitting device such as an organic EL display, an LSI and the like formed by using the active element. In particular, according to the invention, a thin film pattern or a wiring pattern can be formed in an arbitrary area while controlling the width, thickness and shape thereof. Thus, a large-area active element substrate and the like can be formed with high yield at low cost.

EMBODIMENT 8

Figure 25B:
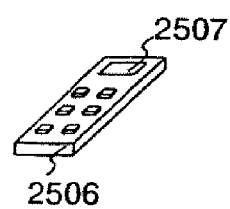
Figure 25B:
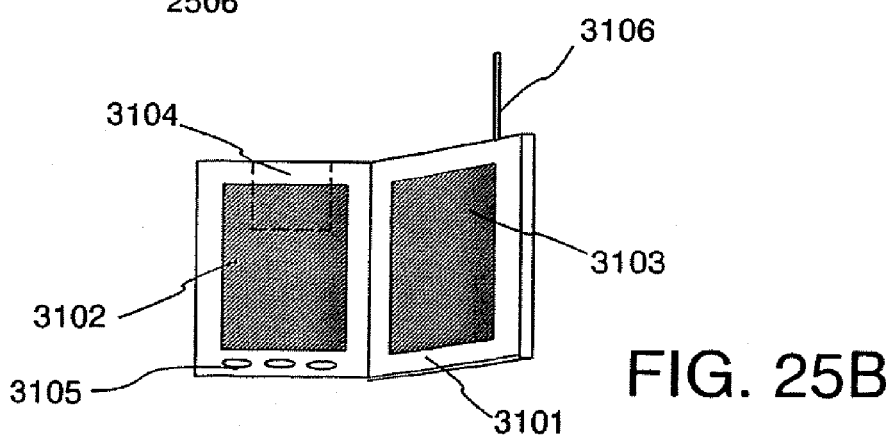
Figure 25C:
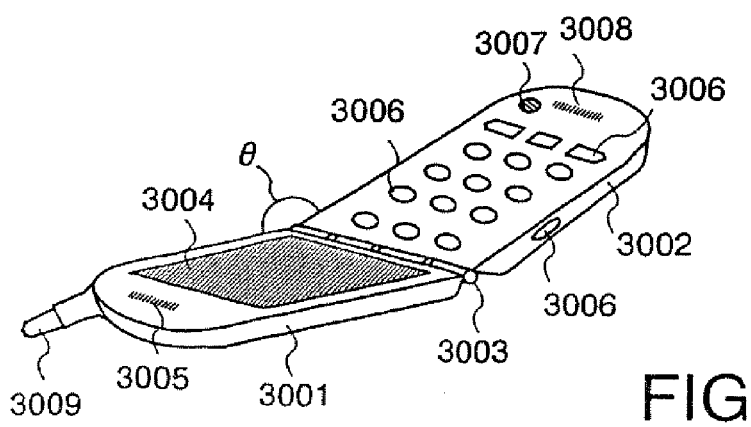

As an example of an electronic apparatus using the module shown in Embodiments 2, 4 and 5, a TV set, a portable book (electronic book) and a mobile phone can be completed as shown in FIGS. 25A to 25C.

A TV set shown in FIG. 25A includes a housing 2501 incorporating a display module 2502 using a liquid crystal or an EL element. Such a TV set enables TV broadcast reception through a receiving portion 2505 as well as one-way (from sender to recipient) or two-way between sender and recipient) communication through a modem 2504 that is linked to a communication network by wired or wireless connections. The TV set can be operated by a switch incorporated in the housing 2501 or a remote control 2506 formed separately. The remote control 2506 may include a display portion 2507 for displaying information to be outputted.

The TV set may also include a main display screen 2503 as well as a sub display screen 2508 that is formed of a second display module and displays channel, volume and the like. In such a TV set, the main display screen 2503 may be structured by an EL display module with wide viewing angle, while the sub display screen 2508 may be structured by a liquid crystal display module with low power consumption. Alternatively, in order to give priority to power consumption, the main display screen 2503 may be structured by a liquid crystal display module, while the sub display screen 2508 may be structured by an EL display module so as to be capable of flashing.

FIG. 25B is a portable book (electronic book) that includes a main body 3101, display portions 3102 and 3103, a recording medium 3104, an operating switch 3105, an antenna 3106 and the like.

FIG. 25C is a mobile phone that includes a display panel 3001 and an operating panel 3002 that are connected to each other with a connecting portion 3003. The angle θ at the connecting portion 3003 between the display panel 3001 including a display portion 3004 and the operating panel 3002 including operating keys 3006 can be changed arbitrarily. The mobile phone further includes an audio output portion 3005, a power source switch 3007, an audio input portion 3008, and an antenna 3009.

In either case, according to the invention that allows the manufacturing steps to be simplified, a TV set, a portable book and a mobile phone each having a large screen can be manufactured with high yield at low cost.

EMBODIMENT 9

Described in this embodiment is the size of a mask pattern in the formation of a contact hole described in FIGS. 1A to 1F, which depends on the concentration of solute.

First, a tray including a glass substrate and fluoroalkyl silane (FAS) is set on a hot plate heated at 170° C. The tray is sealed and heated for 10 minutes, thereby the FAS is absorbed on the surface of the glass substrate. Then, the surface of the glass substrate is washed with ethanol. A composition for forming a mask pattern is selectively discharged by a droplet discharge method in an area on the FAS where a contact hole is to be formed. Subsequently, heat treatment is applied at a temperature high enough to evaporate a solvent. In this embodiment, heat treatment is performed at a temperature of 120° C. for 10 minutes.

Measured here is the size of a mask pattern formed on the FAS when varying the concentration of solute in a composition for forming a mask pattern. In this embodiment, a sample (a), a sample (b) or a sample (c) is used as the composition for forming a mask pattern. The sample (a) to the sample (c) respectively correspond to (a) a solution (product of Toray Industries, Inc., DL1602) containing polyimide as a solute and ν butyrolactone as a solvent; (b) a solution containing polyvinyl acetate (PVAc) as a solute and ν butyrolactone as a solvent; and (c) a solution containing polyvinyl acetate (PVAc) as a solute and ethyl cellosolve butyl cellosolve 1:1 as a solvent. In this embodiment, the concentration of solute is varied by changing the amount of solvent which a composition for forming a mask pattern is diluted and the size is measured five times for each concentration. TABLE 1 shows the result of the sample (a), TABLE 2 shows the result of the sample (b), and TABLE 3 shows the result of the sample (c). TABLE 1 to TABLE 3 are collectively shown in FIG. 26.

TABLE 1

| | | size [μm] | | | | |
|---|---|---|---|---|---|---|
| | | first time | second time | third time | fourth time | fifth time |
| concentration of solute [wt %] | 12 | 40.2 | 40.2 | 40.2 | 39.9 | 40.5 |
| | 6 | 33.2 | 33.5 | 32.5 | 33.7 | 33.3 |
| | 3 | 27.4 | 27.6 | 28 | 27 | 27.6 |
| | 1.2 | 21.6 | 21.6 | 20.8 | 21 | 21.3 |
| | 0.2 | 14 | 14.4 | 14.4 | 14.9 | 14.2 |

TABLE 2

| | | size [μm] | | | | |
|---|---|---|---|---|---|---|
| | | first time | second time | third time | fourth time | fifth time |
| concentration of solute [wt %] | 5 | 26 | 26.2 | 25.9 | 26.6 | 26 |
| | 2.5 | 20.9 | 21.2 | 21.6 | 21.3 | 21.1 |
| | 1 | 17.2 | 16.7 | 16.9 | 16.9 | 16.3 |

TABLE 3

| | | size [μm] | | | | |
|---|---|---|---|---|---|---|
| | | first time | second time | third time | fourth time | fifth time |
| concentration of solute [wt %] | 5 | 31.6 | 31.3 | 31.2 | 31.2 | 31.9 |
| | 2.5 | 23.2 | 26.5 | 26 | 24.3 | 24.6 |
| | 1 | 15.4 | 16.4 | 16.2 | 17.4 | 18.2 |

Figure 26:
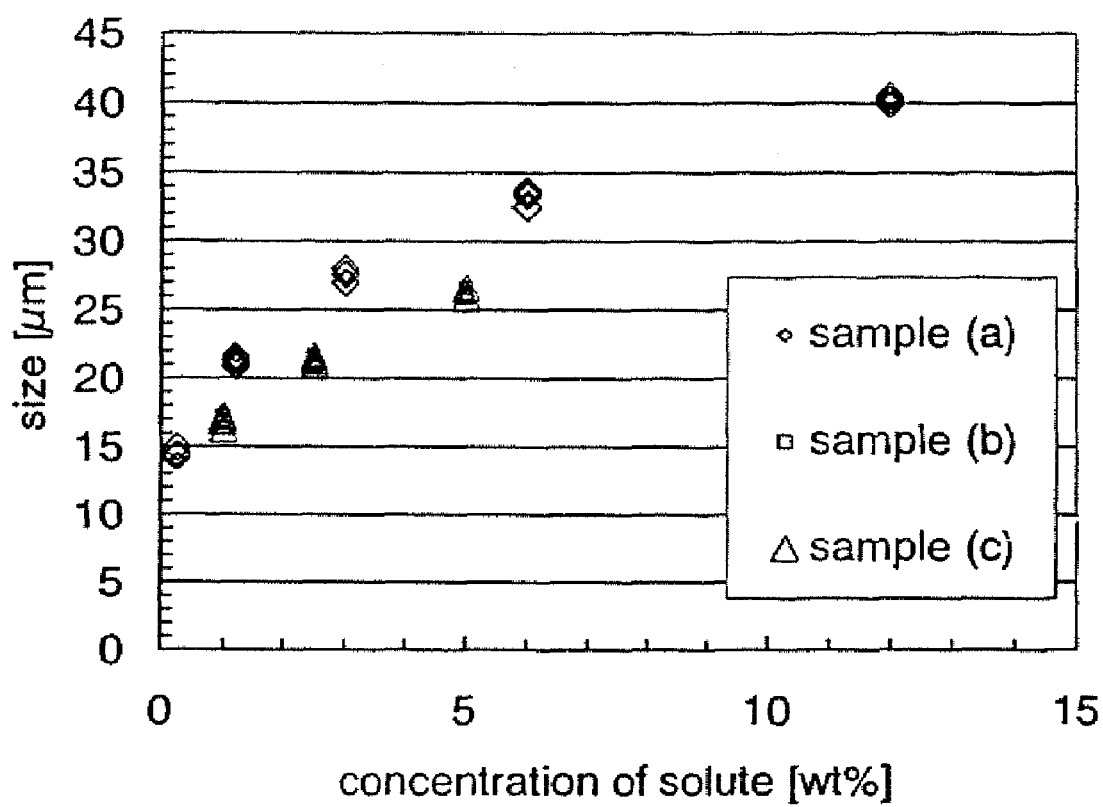
FIG. 26 is a view showing the size of a mask pattern which depends on the concentration of solute.

As shown in FIG. 26, when a composition for forming a mask pattern is discharged on a substrate on which the FAS is formed the size of the mask pattern can be controlled by controlling the concentration of solute. With the decrease in the concentration of solute, the size of the mask pattern decreases. Accordingly, when a composition for forming a mask pattern is discharged on a substrate on which the FAS is formed, the contact hole size can be controlled by controlling the concentration of solute. The decrease in the concentration of solute allows the contact hole size to decrease.

According to the invention, an island shape organic film is selectively formed over a semiconductor layer, a conductive layer or an insulating layer, and an insulating film is formed around the island shape organic film. Therefore, a contact hole and the insulating film can be formed without conventional exposure and developing steps using a resist mask, which results in drastically simplified manufacturing steps. Further, according to the invention, a manufacturing method of a semiconductor device with high throughput and yield can be provided at low cost.

The invention having such advantageous effects can be applied to a manufacturing method of various kinds of semiconductor devices such as an inverted staggered TFT and a top gate TFT as shown in the embodiments. In addition, the invention can be applied in various fields such as an active matrix substrate using the semiconductor device, a liquid crystal display device using such a substrate, a display such as an EL display device, and a contact hole in an LSI.

This application is based on Japanese Patent Application serial No. 2004022039 filed in Japan Patent Office on Jan. 29, 2004, the contents of which are hereby incorporated by reference.

What is claimed is:

1. A method of manufacturing a semiconductor device, comprising:
   forming an organic film formed of a silane coupling agent over a substrate;
   forming a mask pattern over the organic film;
   patterning the organic film to form an island shape organic film using the mask pattern as a mask;
   removing the mask pattern;
   forming an insulating film around the island shape organic film, wherein a contact hole is formed in the insulating film at a position of the island shape organic film;
   removing the island shape organic film in the contact hole; and
   forming a conductor in the contact hole, after removing the island shape organic film.

2. The method of manufacturing a semiconductor device according to claim 1,
   wherein the silane coupling agent is FAS (fluoroalkyl silane).

3. The method of manufacturing a semiconductor device according to claim 1,
   wherein the mask pattern is formed of PVA (polyvinyl alcohol) or polyimide.

4. The method of manufacturing a semiconductor device according to claim 1,
   wherein the insulating film is formed of a polyimide-based resin, an acryl-based resin, a polyamide-based resin, or a material that has a backbone structure obtained by binding silicon to oxygen, and contains at least one hydrogen substituent, or further has at least one substituent selected from fluorine, an alkyl group, or aromatic hydrocarbon in addition to hydrogen.

5. The method of manufacturing a semiconductor device according to claim 1,
   wherein the insulating film is formed by slit coating or spin coating.

6. A method of manufacturing a display device, comprising:
   forming an organic film formed of a silane coupling agent over a substrate;
   forming a mask pattern over the organic film;
   patterning the organic film to form an island shape organic film using the mask pattern as a mask;
   removing the mask pattern;
   forming an insulating film around the island shape organic film, wherein a contact hole is formed in the insulating film at a position of the island shape organic film;
   removing the island shape organic film in the contact hole; and
   forming a conductor in the contact hole, after removing the island shape organic film.

7. The method of manufacturing a display device according to claim 6,
   wherein the silane coupling agent is FAS (fluoroalkyl silane).

8. The method of manufacturing a display device according to claim 6,
   wherein the mask pattern is formed of PVA (polyvinyl alcohol) or polyimide.

9. The method of manufacturing a display device according to claim 6,
   wherein the insulating film is formed of a polyimide-based resin, an acryl-based resin, a polyamide-based resin, or a material that has a backbone structure obtained by binding silicon to oxygen, and contains at least one hydrogen substituent, or further has at least one substituent selected from fluorine, an alkyl group, or aromatic hydrocarbon in addition to hydrogen.

10. The method of manufacturing a display device according to claim 6,
    wherein the insulating film is formed by slit coating or spin coating.

11. A method of manufacturing a display device, comprising:
    forming an organic film formed of a silane coupling agent over a thin film transistor;
    forming a mask pattern over the organic film;
    patterning the organic film to form an island shape organic film using the mask pattern as a mask;
    removing the mask pattern;
    forming an insulating film around the island shape organic film, wherein a contact hole is formed in the insulating film at a position of the island shape organic film;
    removing the island shape organic film in the contact hole; and
    forming a conductor in the contact hole, after removing the island shape organic film.

12. The method of manufacturing a display device according to claim 11,
    wherein the display device is an EL display device comprising a layer containing an organic compound or an inorganic compound over the conductor.

13. The method of manufacturing a display device according to claim 11,
    wherein the display device is a liquid crystal display device comprising a liquid crystal layer over the conductor.

14. The method of manufacturing a display device according to claim 1,
    wherein the silane coupling agent is FAS (fluoroalkyl silane).

15. The method of manufacturing a display device according to claim 11, wherein the mask pattern is formed of PVA (polyvinyl alcohol) or polyimide.

16. The method of manufacturing a display device according to claim 11,
wherein the insulating film is formed of a polyimide-based resin, an acryl-based resin, a polyamide-based resin, or a material that has a backbone structure obtained by binding silicon to oxygen, and contains at least one hydrogen substituent, or further has at least one substituent selected from fluorine, an alkyl group, or aromatic hydrocarbon in addition to hydrogen.

17. The method of manufacturing a display device according to claim 11,
wherein the insulating film is formed by slit coating or spin coating.

18. The method of manufacturing a display device according to claim 11,
wherein the display device is applied to an electronic apparatus selected from the group consisting of a TV set, a portable book and a mobile phone.

* * * * *